(12) United States Patent
Li

(10) Patent No.: US 11,594,691 B2
(45) Date of Patent: Feb. 28, 2023

(54) LIGHT OUTCOUPLING EFFICIENCY OF PHOSPHORESCENT OLEDS BY MIXING HORIZONTALLY ALIGNED FLUORESCENT EMITTERS

(71) Applicant: Arizona Board of Regents on behalf of Arizona State University, Scottsdale, AZ (US)

(72) Inventor: Jian Li, Tempe, AZ (US)

(73) Assignee: Arizona Board of Regents on behalf of Arizona State University, Scottsdale, AZ (US)

( * ) Notice: Subject to any disclaimer, the term of this patent is extended or adjusted under 35 U.S.C. 154(b) by 258 days.

(21) Appl. No.: 16/751,561

(22) Filed: Jan. 24, 2020

(65) Prior Publication Data
US 2020/0243776 A1 Jul. 30, 2020

Related U.S. Application Data

(60) Provisional application No. 62/796,704, filed on Jan. 25, 2019.

(51) Int. Cl.
*H01L 51/50* (2006.01)
*H01L 51/00* (2006.01)

(52) U.S. Cl.
CPC ........ *H01L 51/0087* (2013.01); *H01L 51/008* (2013.01); *H01L 2251/5376* (2013.01)

(58) Field of Classification Search
CPC ......... H01L 51/0087; H01L 2251/5376; H01L 51/5012; H01L 51/008; H01L 51/5028
See application file for complete search history.

(56) References Cited

U.S. PATENT DOCUMENTS

| | | | |
|---|---|---|---|
| 4,769,292 | A | 9/1988 | Tang |
| 5,451,674 | A | 9/1995 | Silver |
| 5,641,878 | A | 6/1997 | Dandliker |
| 5,707,745 | A | 1/1998 | Forrest |
| 5,844,363 | A | 12/1998 | Gu |
| 6,200,695 | B1 | 3/2001 | Arai |

(Continued)

FOREIGN PATENT DOCUMENTS

| | | |
|---|---|---|
| CN | 1680366 A | 10/2005 |
| CN | 1777663 | 5/2006 |

(Continued)

OTHER PUBLICATIONS

Adachi, C. et al., "High-efficiency organic electrophosphorescent devices with tris(2-phenylpyridine)iridium doped into electron-transporting materials", Applied Physics Letters, Aug. 2000, vol. 77, No. 6, pp. 904-906 <DOI:10.1063/1.1306639>.

(Continued)

*Primary Examiner* — Gregory D Clark
(74) *Attorney, Agent, or Firm* — Riverside Law LLP

(57) ABSTRACT

Organic light emitting devices (OLEDs) with emissive layers containing both phosphorescent Pt complexes and fluorescent emitters, are described. The devices presented employ both fluorescent and phosphorescent Pt complexes in order to redistribute the excited states to primarily reside on known stable fluorescent emitters to achieve high device operational stability but maintain the high efficiency characteristic of phosphorescent OLEDs.

20 Claims, 10 Drawing Sheets

(56) References Cited

U.S. PATENT DOCUMENTS

| | | |
|---|---|---|
| 6,303,238 B1 | 10/2001 | Thompson |
| 6,780,528 B2 | 8/2004 | Tsuboyama |
| 7,002,013 B1 | 2/2006 | Chi |
| 7,037,599 B2 | 5/2006 | Culligan |
| 7,064,228 B1 | 6/2006 | Yu |
| 7,268,485 B2 | 9/2007 | Tyan |
| 7,279,704 B2 | 10/2007 | Walters |
| 7,332,232 B2 | 2/2008 | Ma |
| 7,442,797 B2 | 10/2008 | Itoh |
| 7,501,190 B2 | 3/2009 | Ise |
| 7,635,792 B1 | 12/2009 | Cella |
| 7,655,322 B2 | 2/2010 | Forrest |
| 7,854,513 B2 | 12/2010 | Quach |
| 7,947,383 B2 | 5/2011 | Ise |
| 8,106,199 B2 | 1/2012 | Jabbour |
| 8,133,597 B2 | 3/2012 | Yasukawa |
| 8,389,725 B2 | 3/2013 | Li |
| 8,617,723 B2 | 12/2013 | Stoessel |
| 8,669,364 B2 | 3/2014 | Li |
| 8,778,509 B2 | 7/2014 | Yasukawa |
| 8,816,080 B2 | 8/2014 | Li |
| 8,846,940 B2 | 9/2014 | Li |
| 8,871,361 B2 | 10/2014 | Xia |
| 8,927,713 B2 | 1/2015 | Li |
| 8,946,417 B2 | 2/2015 | Jian |
| 8,987,451 B2 | 3/2015 | Tsai |
| 9,059,412 B2 | 6/2015 | Zeng |
| 9,076,974 B2 | 7/2015 | Li |
| 9,082,989 B2 | 7/2015 | Li |
| 9,203,039 B2 | 12/2015 | Li |
| 9,221,857 B2 | 12/2015 | Li |
| 9,224,963 B2 | 12/2015 | Li |
| 9,238,668 B2 | 1/2016 | Li |
| 9,312,502 B2 | 4/2016 | Li |
| 9,312,505 B2 | 4/2016 | Brooks |
| 9,318,725 B2 | 4/2016 | Li |
| 9,324,957 B2 | 4/2016 | Li |
| 9,382,273 B2 | 7/2016 | Li |
| 9,385,329 B2 | 7/2016 | Li |
| 9,425,415 B2 | 8/2016 | Li |
| 9,461,254 B2 | 10/2016 | Tsai |
| 9,493,698 B2 | 11/2016 | Beers |
| 9,502,671 B2 | 11/2016 | Li |
| 9,550,801 B2 | 1/2017 | Li |
| 9,598,449 B2 | 3/2017 | Li |
| 9,617,291 B2 | 4/2017 | Li |
| 9,666,822 B2 | 5/2017 | Forrest |
| 9,673,409 B2 | 6/2017 | Li |
| 9,698,359 B2 | 7/2017 | Li |
| 9,711,739 B2 | 7/2017 | Li |
| 9,711,741 B2 | 7/2017 | Li |
| 9,711,742 B2 | 7/2017 | Li |
| 9,735,397 B2 | 8/2017 | Riegel |
| 9,755,163 B2 | 9/2017 | Li |
| 9,818,959 B2 | 11/2017 | Li |
| 9,865,825 B2 | 1/2018 | Li |
| 9,879,039 B2 | 1/2018 | Li |
| 9,882,150 B2 | 1/2018 | Li |
| 9,899,614 B2 | 2/2018 | Li |
| 9,920,242 B2 | 3/2018 | Li |
| 9,923,155 B2 | 3/2018 | Li |
| 9,941,479 B2 | 4/2018 | Li |
| 9,947,881 B2 | 4/2018 | Li |
| 9,985,224 B2 | 5/2018 | Li |
| 10,020,455 B2 | 7/2018 | Li |
| 10,033,003 B2 | 7/2018 | Li |
| 10,056,564 B2 | 8/2018 | Li |
| 10,056,567 B2 | 8/2018 | Li |
| 10,158,091 B2 | 12/2018 | Li |
| 10,177,323 B2 | 1/2019 | Li |
| 10,211,411 B2 | 2/2019 | Li |
| 10,211,414 B2 | 2/2019 | Li |
| 10,263,197 B2 | 4/2019 | Li |
| 10,294,417 B2 | 5/2019 | Li |
| 10,392,387 B2 | 8/2019 | Li |
| 10,411,202 B2 | 9/2019 | Li |
| 10,414,785 B2 | 9/2019 | Li |
| 10,516,117 B2 | 12/2019 | Li |
| 10,566,553 B2 | 2/2020 | Li |
| 10,566,554 B2 | 2/2020 | Li |
| 2001/0019782 A1 | 9/2001 | Igarashi |
| 2002/0068190 A1 | 6/2002 | Tsuboyama |
| 2003/0062519 A1 | 4/2003 | Yamazaki |
| 2003/0180574 A1* | 9/2003 | Huang ............... C09K 11/06 428/690 |
| 2003/0186077 A1 | 10/2003 | Chen |
| 2004/0230061 A1 | 11/2004 | Seo |
| 2005/0037232 A1 | 2/2005 | Tyan |
| 2005/0139810 A1 | 6/2005 | Kuehl |
| 2005/0170207 A1 | 8/2005 | Ma |
| 2005/0260446 A1 | 11/2005 | Mackenzie |
| 2006/0024522 A1 | 2/2006 | Thompson |
| 2006/0032528 A1 | 2/2006 | Wang |
| 2006/0066228 A1 | 3/2006 | Antoniadis |
| 2006/0073359 A1 | 4/2006 | Ise |
| 2006/0094875 A1 | 5/2006 | Itoh |
| 2006/0127696 A1 | 6/2006 | Stossel |
| 2006/0182992 A1 | 8/2006 | Nii |
| 2006/0202197 A1 | 9/2006 | Nakayama |
| 2006/0210831 A1 | 9/2006 | Sano |
| 2006/0255721 A1 | 11/2006 | Igarashi |
| 2006/0263635 A1 | 11/2006 | Ise |
| 2006/0286406 A1 | 12/2006 | Igarashi |
| 2007/0057630 A1 | 3/2007 | Nishita |
| 2007/0059551 A1 | 3/2007 | Yamazaki |
| 2007/0082284 A1 | 4/2007 | Stoessel |
| 2007/0103060 A1 | 5/2007 | Itoh |
| 2007/0160905 A1 | 7/2007 | Morishita |
| 2007/0252140 A1 | 11/2007 | Limmert |
| 2008/0001530 A1 | 1/2008 | Ise |
| 2008/0036373 A1 | 2/2008 | Itoh |
| 2008/0054799 A1 | 3/2008 | Satou |
| 2008/0079358 A1 | 4/2008 | Satou |
| 2008/0102310 A1 | 5/2008 | Thompson |
| 2008/0111476 A1 | 5/2008 | Choi |
| 2008/0241518 A1 | 10/2008 | Satou |
| 2008/0241589 A1 | 10/2008 | Fukunaga |
| 2008/0269491 A1 | 10/2008 | Jabbour |
| 2008/0315187 A1 | 12/2008 | Bazan |
| 2009/0026936 A1 | 1/2009 | Satou |
| 2009/0026939 A1 | 1/2009 | Kinoshita |
| 2009/0032989 A1 | 2/2009 | Karim |
| 2009/0039768 A1 | 2/2009 | Igarashi |
| 2009/0079340 A1 | 3/2009 | Kinoshita |
| 2009/0126796 A1 | 5/2009 | Yang |
| 2009/0128008 A1 | 5/2009 | Ise |
| 2009/0136779 A1 | 5/2009 | Cheng |
| 2009/0153045 A1 | 6/2009 | Kinoshita |
| 2009/0167167 A1 | 7/2009 | Aoyama |
| 2009/0205713 A1 | 8/2009 | Mitra |
| 2009/0218561 A1 | 9/2009 | Kitamura |
| 2009/0261721 A1 | 10/2009 | Murakami |
| 2009/0267500 A1 | 10/2009 | Kinoshita |
| 2010/0000606 A1 | 1/2010 | Thompson |
| 2010/0013386 A1 | 1/2010 | Thompson |
| 2010/0043876 A1 | 2/2010 | Tuttle |
| 2010/0093119 A1 | 4/2010 | Shimizu |
| 2010/0127246 A1 | 5/2010 | Nakayama |
| 2010/0141127 A1 | 6/2010 | Xia |
| 2010/0147386 A1 | 6/2010 | Benson-Smith |
| 2010/0171111 A1 | 7/2010 | Takada |
| 2010/0171418 A1 | 7/2010 | Kinoshita |
| 2010/0200051 A1 | 8/2010 | Triani |
| 2010/0204467 A1 | 8/2010 | Lamarque |
| 2010/0270540 A1 | 10/2010 | Chung |
| 2010/0288362 A1 | 11/2010 | Hatwar |
| 2010/0297522 A1 | 11/2010 | Creeth |
| 2010/0307594 A1 | 12/2010 | Zhu |
| 2011/0028723 A1 | 2/2011 | Li |
| 2011/0049496 A1 | 3/2011 | Fukuzaki |
| 2011/0062858 A1 | 3/2011 | Yersin |
| 2011/0132440 A1 | 6/2011 | Sivarajan |
| 2011/0217544 A1 | 9/2011 | Young |
| 2011/0227058 A1 | 9/2011 | Masui |

(56) References Cited

U.S. PATENT DOCUMENTS

| | | |
|---|---|---|
| 2011/0301351 A1 | 12/2011 | Li |
| 2012/0024383 A1 | 2/2012 | Kaiho |
| 2012/0025588 A1 | 2/2012 | Humbert |
| 2012/0039323 A1 | 2/2012 | Hirano |
| 2012/0095232 A1 | 4/2012 | Li |
| 2012/0108806 A1 | 5/2012 | Li |
| 2012/0146012 A1 | 6/2012 | Limmert |
| 2012/0181528 A1 | 7/2012 | Takada |
| 2012/0199823 A1 | 8/2012 | Molt |
| 2012/0202997 A1 | 8/2012 | Parham |
| 2012/0204960 A1 | 8/2012 | Kato |
| 2012/0215001 A1 | 8/2012 | Li |
| 2012/0223634 A1 | 9/2012 | Xia |
| 2012/0264938 A1 | 10/2012 | Li |
| 2012/0273736 A1 | 11/2012 | James |
| 2012/0302753 A1 | 11/2012 | Li |
| 2013/0048963 A1 | 2/2013 | Beers |
| 2013/0082245 A1 | 4/2013 | Kottas |
| 2013/0137870 A1 | 5/2013 | Li |
| 2013/0168656 A1 | 7/2013 | Tsai |
| 2013/0172561 A1 | 7/2013 | Tsai |
| 2013/0200340 A1 | 8/2013 | Otsu |
| 2013/0203996 A1 | 8/2013 | Li |
| 2013/0237706 A1 | 9/2013 | Li |
| 2013/0341600 A1 | 12/2013 | Lin |
| 2014/0014922 A1 | 1/2014 | Lin |
| 2014/0014931 A1 | 1/2014 | Riegel |
| 2014/0027733 A1 | 1/2014 | Zeng |
| 2014/0042475 A1 | 2/2014 | Park |
| 2014/0066628 A1 | 3/2014 | Li |
| 2014/0073798 A1 | 3/2014 | Li |
| 2014/0084261 A1 | 3/2014 | Brooks |
| 2014/0114072 A1 | 4/2014 | Li |
| 2014/0147996 A1 | 5/2014 | Vogt |
| 2014/0148594 A1 | 5/2014 | Li |
| 2014/0191206 A1 | 7/2014 | Cho |
| 2014/0203248 A1 | 7/2014 | Zhou |
| 2014/0249310 A1 | 9/2014 | Li |
| 2014/0326960 A1 | 11/2014 | Kim |
| 2014/0330019 A1 | 11/2014 | Li |
| 2014/0364605 A1 | 12/2014 | Li |
| 2015/0008419 A1 | 1/2015 | Li |
| 2015/0018558 A1 | 1/2015 | Li |
| 2015/0028323 A1 | 1/2015 | Xia |
| 2015/0060804 A1 | 3/2015 | Kanitz |
| 2015/0069334 A1 | 3/2015 | Xia |
| 2015/0105556 A1 | 4/2015 | Li |
| 2015/0123047 A1 | 5/2015 | Maltenberger |
| 2015/0162552 A1 | 6/2015 | Li |
| 2015/0194616 A1 | 7/2015 | Li |
| 2015/0207086 A1 | 7/2015 | Li |
| 2015/0228914 A1 | 8/2015 | Li |
| 2015/0274762 A1 | 10/2015 | Li |
| 2015/0287938 A1 | 10/2015 | Li |
| 2015/0311456 A1 | 10/2015 | Li |
| 2015/0318500 A1 | 11/2015 | Li |
| 2015/0349279 A1 | 12/2015 | Li |
| 2015/0380666 A1 | 12/2015 | Szigethy |
| 2016/0028028 A1 | 1/2016 | Li |
| 2016/0028029 A1 | 1/2016 | Li |
| 2016/0043331 A1 | 2/2016 | Li |
| 2016/0072082 A1 | 3/2016 | Brooks |
| 2016/0133861 A1 | 5/2016 | Li |
| 2016/0133862 A1 | 5/2016 | Li |
| 2016/0181529 A1 | 6/2016 | Tsai |
| 2016/0194344 A1 | 7/2016 | Li |
| 2016/0197285 A1 | 7/2016 | Zeng |
| 2016/0197291 A1 | 7/2016 | Li |
| 2016/0285015 A1 | 9/2016 | Li |
| 2016/0359120 A1 | 12/2016 | Li |
| 2016/0359125 A1 | 12/2016 | Li |
| 2017/0005278 A1 | 1/2017 | Li |
| 2017/0012224 A1 | 1/2017 | Li |
| 2017/0040555 A1 | 2/2017 | Li |
| 2017/0047533 A1 | 2/2017 | Li |
| 2017/0066792 A1 | 3/2017 | Li |
| 2017/0069855 A1 | 3/2017 | Li |
| 2017/0077420 A1 | 3/2017 | Li |
| 2017/0125708 A1 | 5/2017 | Li |
| 2017/0267923 A1 | 9/2017 | Li |
| 2017/0271611 A1 | 9/2017 | Li |
| 2017/0301871 A1 | 10/2017 | Li |
| 2017/0305881 A1 | 10/2017 | Li |
| 2017/0309943 A1 | 10/2017 | Angell |
| 2017/0331056 A1 | 11/2017 | Li |
| 2017/0342098 A1 | 11/2017 | Li |
| 2017/0373260 A1 | 12/2017 | Li |
| 2018/0006246 A1 | 1/2018 | Li |
| 2018/0013096 A1 | 1/2018 | Hamada |
| 2018/0052366 A1 | 2/2018 | Hao |
| 2018/0053904 A1 | 2/2018 | Li |
| 2018/0130960 A1 | 5/2018 | Li |
| 2018/0138428 A1 | 5/2018 | Li |
| 2018/0148464 A1 | 5/2018 | Li |
| 2018/0159051 A1 | 6/2018 | Li |
| 2018/0166655 A1 | 6/2018 | Li |
| 2018/0175329 A1 | 6/2018 | Li |
| 2018/0194790 A1 | 7/2018 | Li |
| 2018/0219161 A1 | 8/2018 | Li |
| 2018/0226592 A1 | 8/2018 | Li |
| 2018/0226593 A1 | 8/2018 | Li |
| 2018/0277777 A1 | 9/2018 | Li |
| 2018/0301641 A1 | 10/2018 | Li |
| 2018/0312750 A1 | 11/2018 | Li |
| 2018/0331307 A1 | 11/2018 | Li |
| 2018/0334459 A1 | 11/2018 | Li |
| 2018/0337345 A1 | 11/2018 | Li |
| 2018/0337349 A1 | 11/2018 | Li |
| 2018/0337350 A1 | 11/2018 | Li |
| 2018/0353771 A1 | 12/2018 | Kim |
| 2019/0013485 A1 | 1/2019 | Li |
| 2019/0058137 A1* | 2/2019 | Ko .................. H01L 51/0087 |
| 2019/0067602 A1 | 2/2019 | Li |
| 2019/0109288 A1 | 4/2019 | Li |
| 2019/0119312 A1 | 4/2019 | Chen |
| 2019/0157352 A1 | 5/2019 | Li |
| 2019/0194536 A1 | 6/2019 | Li |
| 2019/0259963 A1 | 8/2019 | Li |
| 2019/0276485 A1 | 9/2019 | Li |
| 2019/0312217 A1 | 10/2019 | Li |
| 2019/0367546 A1 | 12/2019 | Li |
| 2019/0389893 A1 | 12/2019 | Li |
| 2020/0006678 A1 | 1/2020 | Li |
| 2020/0071330 A1 | 3/2020 | Li |
| 2020/0075868 A1 | 3/2020 | Li |
| 2020/0119288 A1 | 4/2020 | Li |
| 2020/0119289 A1 | 4/2020 | Lin |
| 2020/0140471 A1 | 5/2020 | Chen |
| 2020/0152891 A1 | 5/2020 | Li |
| 2020/0239505 A1 | 7/2020 | Li |
| 2020/0243776 A1 | 7/2020 | Li |

FOREIGN PATENT DOCUMENTS

| | | |
|---|---|---|
| CN | 1894267 | 1/2007 |
| CN | 1894269 A | 1/2007 |
| CN | 101142223 A | 3/2008 |
| CN | 101667626 | 3/2010 |
| CN | 102449108 A | 5/2012 |
| CN | 102892860 A | 1/2013 |
| CN | 102971396 A | 3/2013 |
| CN | 103102372 | 5/2013 |
| CN | 104232076 A | 12/2014 |
| CN | 104377231 | 2/2015 |
| CN | 104576934 | 4/2015 |
| CN | 104693243 A | 6/2015 |
| CN | 105367605 A | 3/2016 |
| CN | 105418591 A | 3/2016 |
| CN | 106783922 | 5/2017 |
| EP | 1617493 | 1/2006 |
| EP | 1808052 A1 | 7/2007 |
| EP | 1874893 A1 | 1/2008 |
| EP | 1874894 A1 | 1/2008 |
| EP | 1919928 A1 | 5/2008 |

(56) References Cited

FOREIGN PATENT DOCUMENTS

| | | |
|---|---|---|
| EP | 1968131 | 9/2008 |
| EP | 2020694 | 2/2009 |
| EP | 2036907 A1 | 3/2009 |
| EP | 2096690 | 9/2009 |
| EP | 2112213 A2 | 10/2009 |
| EP | 2417217 A2 | 2/2012 |
| EP | 2684932 | 1/2014 |
| EP | 2711999 A2 | 3/2014 |
| EP | 3032293 | 6/2016 |
| JP | 2002010505 | 1/2002 |
| JP | 2002105055 | 4/2002 |
| JP | 2003342284 | 12/2003 |
| JP | 2005031073 | 2/2005 |
| JP | 2005267557 | 9/2005 |
| JP | 2005310733 A | 11/2005 |
| JP | 2006047240 A | 2/2006 |
| JP | 2006232784 A | 9/2006 |
| JP | 2006242080 | 9/2006 |
| JP | 2006242081 A | 9/2006 |
| JP | 2006256999 A | 9/2006 |
| JP | 2006257238 A | 9/2006 |
| JP | 2006261623 A | 9/2006 |
| JP | 2006290988 A | 10/2006 |
| JP | 2006313796 A | 11/2006 |
| JP | 2006332622 A | 12/2006 |
| JP | 2006351638 A | 12/2006 |
| JP | 2007019462 A | 1/2007 |
| JP | 2007031678 | 2/2007 |
| JP | 2007042875 A | 2/2007 |
| JP | 2007051243 A | 3/2007 |
| JP | 2007053132 A | 3/2007 |
| JP | 2007066581 | 3/2007 |
| JP | 2007073620 A | 3/2007 |
| JP | 2007073845 A | 3/2007 |
| JP | 2007073900 A | 3/2007 |
| JP | 2007080593 | 3/2007 |
| JP | 2007080677 A | 3/2007 |
| JP | 2007088105 | 4/2007 |
| JP | 2007088164 A | 4/2007 |
| JP | 2007096259 A | 4/2007 |
| JP | 2007099765 A | 4/2007 |
| JP | 2007110067 | 4/2007 |
| JP | 2007110102 A | 4/2007 |
| JP | 2007519614 | 7/2007 |
| JP | 2007258550 A | 10/2007 |
| JP | 2007324309 A | 12/2007 |
| JP | 2008010353 A | 1/2008 |
| JP | 2008091860 A | 4/2008 |
| JP | 2008103535 A | 5/2008 |
| JP | 2008108617 A | 5/2008 |
| JP | 2008109085 | 5/2008 |
| JP | 2008109103 A | 5/2008 |
| JP | 2008116343 A | 5/2008 |
| JP | 2008117545 A | 5/2008 |
| JP | 2008160087 A | 7/2008 |
| JP | 2008198801 A | 8/2008 |
| JP | 2008270729 A | 11/2008 |
| JP | 2008270736 | 11/2008 |
| JP | 2008310220 A | 12/2008 |
| JP | 2009016184 A | 1/2009 |
| JP | 2009016579 | 1/2009 |
| JP | 2009032977 A | 2/2009 |
| JP | 2009032988 A | 2/2009 |
| JP | 2009059997 | 3/2009 |
| JP | 2009076509 | 4/2009 |
| JP | 2009161524 A | 7/2009 |
| JP | 2009247171 | 10/2009 |
| JP | 2009266943 A | 11/2009 |
| JP | 2009267171 A | 11/2009 |
| JP | 2009267244 A | 11/2009 |
| JP | 2009272339 A | 11/2009 |
| JP | 2009283891 A | 12/2009 |
| JP | 2010135689 A | 6/2010 |
| JP | 2010171205 A | 8/2010 |
| JP | 2011071452 A | 4/2011 |
| JP | 2012079895 A | 4/2012 |
| JP | 2012079898 A | 4/2012 |
| JP | 5604505 | 9/2012 |
| JP | 2012522843 | 9/2012 |
| JP | 2012207231 A | 10/2012 |
| JP | 2012222255 A | 11/2012 |
| JP | 2012231135 A | 11/2012 |
| JP | 2013023500 A | 2/2013 |
| JP | 2013048256 A | 3/2013 |
| JP | 2013053149 A | 3/2013 |
| JP | 2013525436 | 6/2013 |
| JP | 2014019701 A | 2/2014 |
| JP | 2014058504 A | 4/2014 |
| JP | 2014520096 | 8/2014 |
| JP | 2012709899 | 11/2014 |
| JP | 2014221807 A | 11/2014 |
| JP | 2014239225 A | 12/2014 |
| JP | 2015081257 A | 4/2015 |
| KR | 20060011537 | 2/2006 |
| KR | 20060015371 | 2/2006 |
| KR | 20060115371 | 11/2006 |
| KR | 20070061830 | 6/2007 |
| KR | 20070112465 | 11/2007 |
| KR | 20130043460 | 4/2013 |
| KR | 101338250 | 12/2013 |
| KR | 20140052501 | 5/2014 |
| TW | 200701835 | 1/2007 |
| TW | 201249851 | 12/2012 |
| TW | 201307365 A | 2/2013 |
| TW | 201710277 | 3/2017 |
| WO | 0070655 A2 | 11/2000 |
| WO | 2000070655 | 11/2000 |
| WO | 2004003108 | 1/2004 |
| WO | 2004070655 | 8/2004 |
| WO | 2004085450 | 10/2004 |
| WO | 2004108857 | 12/2004 |
| WO | 2005042444 A2 | 5/2005 |
| WO | 2005042550 A1 | 5/2005 |
| WO | 2005113704 | 12/2005 |
| WO | 2006033440 A1 | 3/2006 |
| WO | 2006067074 | 6/2006 |
| WO | 2006081780 | 8/2006 |
| WO | 2006098505 A1 | 9/2006 |
| WO | 2006113106 | 10/2006 |
| WO | 2006115299 A1 | 11/2006 |
| WO | 2006115301 | 11/2006 |
| WO | 2007034985 A1 | 3/2007 |
| WO | 2007069498 A1 | 6/2007 |
| WO | 2008054578 | 5/2008 |
| WO | 2008066192 A1 | 6/2008 |
| WO | 2008066195 A1 | 6/2008 |
| WO | 2008066196 A1 | 6/2008 |
| WO | 2008101842 A1 | 8/2008 |
| WO | 2008117889 | 10/2008 |
| WO | 2008123540 | 10/2008 |
| WO | 2008131932 A1 | 11/2008 |
| WO | 2009003455 | 1/2009 |
| WO | 2009008277 | 1/2009 |
| WO | 2009011327 | 1/2009 |
| WO | 2009017211 A1 | 2/2009 |
| WO | 2009023667 | 2/2009 |
| WO | 2009086209 | 7/2009 |
| WO | 2009111299 | 9/2009 |
| WO | 2010007098 A1 | 1/2010 |
| WO | 2010056669 | 5/2010 |
| WO | 2010093176 | 8/2010 |
| WO | 2010105141 | 9/2010 |
| WO | 2010118026 A2 | 10/2010 |
| WO | 2011064335 A1 | 6/2011 |
| WO | 2011070989 A1 | 6/2011 |
| WO | 2011089163 | 7/2011 |
| WO | 2011137429 A2 | 11/2011 |
| WO | 2011137431 A2 | 11/2011 |
| WO | 2012074909 | 6/2012 |
| WO | 2012112853 A1 | 8/2012 |
| WO | 2012116231 | 8/2012 |
| WO | 2012142387 | 10/2012 |
| WO | 2012162488 A1 | 11/2012 |
| WO | 2012163471 A1 | 12/2012 |

(56) References Cited

FOREIGN PATENT DOCUMENTS

| WO | 2013130483 | A1 | 9/2013 |
|---|---|---|---|
| WO | 2014009310 | | 1/2014 |
| WO | 2014016611 | | 1/2014 |
| WO | 2014031977 | | 2/2014 |
| WO | 2014047616 | A1 | 3/2014 |
| WO | 2014109814 | | 7/2014 |
| WO | 2014208271 | | 12/2014 |
| WO | 2015027060 | A1 | 2/2015 |
| WO | 2015131158 | | 9/2015 |
| WO | 2016025921 | A1 | 2/2016 |
| WO | 2016029137 | | 2/2016 |
| WO | 2016029186 | | 2/2016 |
| WO | 2016197019 | | 12/2016 |
| WO | 2017117935 | | 7/2017 |
| WO | 2018071697 | | 4/2018 |
| WO | 2018140765 | | 8/2018 |
| WO | 2019079505 | | 4/2019 |
| WO | 2019079508 | | 4/2019 |
| WO | 2019079509 | | 4/2019 |
| WO | 2019236541 | | 12/2019 |
| WO | 2020018476 | | 1/2020 |

OTHER PUBLICATIONS

Ayan Maity et al., "Room-temperature synthesis of cyclometalated iridium(III) complexes; kinetic isomers and reactive functionalities" Chem. Sci., vol. 4, pp. 1175-1181 (2013).

Baldo et al., "Highly Efficient Phosphorescent Emission from Organic Electroluminescent Devices," Nature, vol. 395, Sep. 10, 1998, pp. 151-154.

Baldo et al., "Very high-efficiency green organic light-emitting devices based on electrophosphorescence," Appl. Phys. Lett., vol. 75, No. 3, 4-6 (1999).

Baldo et al., "Very high-efficiency green organic light-emitting devices based on electrophosphorescence," Applied Physics Letters, vol. 75, No. 1, Jul. 5, 1999, pp. 4-6.

Baldo et al., Very High-Efficiency Green Organic Light-Emitting Devices Based on Electrophosphorescence, Appl Phys Lett, 75(3):4-6 (1999).

Baldo, M. et al., "Excitonic singlet-triplet ratio in a semiconducting organic thin film", Physical Review B, Nov. 1999, vol. 60, No. 20, pp. 14422-14428 <DOI:10.1103/PhysRevB.60.14422>.

Baldo, M. et al., "High-efficiency fluorescent organic light-emitting devices using a phosphorescent sensitizer", Nature, Feb. 2000, vol. 403, pp. 750-753.

Barry O'Brien et al.: White organic light emitting diodes using Pt-based red, green and blue phosphorescent dopants. Proc. SPIE, vol. 8829, pp. 1-6, Aug. 25, 2013.

Barry O'Brien et al., "High efficiency white organic light emitting diodes employing blue and red platinum emitters," Journal of Photonics for Energy, vol. 4, 2014, pp. 043597-1-8.

Berson et al. (2007). "Poly(3-hexylthiophene) fibers for photovoltaic applications," Adv. Funct. Mat., 17, 1377-84.

Bouman et al. (1994). "Chiroptical properties of regioregular chiral polythiophenes," Mol. Cryst. Liq. Cryst., 256, 439-48.

Brian W. D'Andrade et al., "Controlling Exciton Diffusion in Multilayer White Phosphorescent Organic Light Emitting Devices", Adv. Mater., vol. 14, No. 2, Jan. 16, 2002, pp. 147-151.

Bronner; Dalton Trans., 2010, 39, 180-184. DOI: 10.1039/b908424j (Year: 2010).

Brooks, J. et al., "Synthesis and Characterization of Phosphorescent Cyclometalated Platinum Complexes", Inorganic Chemistry, May 2002, vol. 41, No. 12, pp. 3055-3066 <DOI:10.1021/ic0255508>.

Brown, A. et al., "Optical spectroscopy of triplet excitons and charged excitations in poly(p-phenylenevinylene) light-emitting diodes", Chemical Physics Letters, Jul. 1993, vol. 210, No. 1-3, pp. 61-66 <DOI:10.1016/0009-2614(93)89100-V>.

Burroughes, J. et al., "Light-emitting diodes based on conjugated polymers", Nature, Oct. 1990, vol. 347, pp. 539-541.

Campbell et al. (2008). "Low-temperature control of nanoscale morphology for high performance polymer photovoltaics," Nano Lett., 8, 3942-47.

Chen, F. et al., "High-performance polymer light-emitting diodes doped with a red phosphorescent iridium complex", Applied Physics Letters, Apr. 2002 [available online Mar. 2002], vol. 80, No. 13, pp. 2308-2310 <10.1063/1.1462862>.

Chen, X., et al., "Fluorescent Chemosensors Based on Spiroring-Opening of Xanthenes and Related Derivatives", Chemical Reviews, 2012 [available online Oct. 2011], vol. 112, No. 3, pp. 1910-1956 <DOI:10.1021/cr200201z>.

Chew, S. et al.: Photoluminescence and electroluminescence of a new blue-emitting homoleptic iridium complex. Applied Phys. Letters; vol. 88, pp. 093510-1-093510-3, 2006.

Chi et al.; Transition-metal phosphors with cyclometalating ligands: fundamentals and applications, Chemical Society Reviews, vol. 39, No. 2, Feb. 2010, pp. 638-655.

Chi-Ming Che et al. "Photophysical Properties and OLEO Applications of Phosphorescent Platinum(II) Schiff Base Complexes," Chem. Eur. J., vol. 16, 2010, pp. 233-247.

Chow; Angew. Chem. Int. Ed. 2013, 52, 11775-11779. DOI: 10.1002/anie.201305590 (Year: 2013).

Christoph Ulbricht et al., "Synthesis and Characterization of Oxetane-Functionalized Phosphorescent Ir(III)-Complexes", Macromol. Chem. Phys. 2009, 210, pp. 531-541.

Coakley et al. (2004). "Conjugated polymer photovoltaic cells," Chem. Mater., 16, 4533-4542.

Colombo, M. et al., "Synthesis and high-resolution optical spectroscopy of bis[2-(2-thienyl)pyridinato-C3,N'](2,2'-bipyridine)iridium(III)", Inorganic Chemistry, Jul. 1993, vol. 32, No. 14, pp. 3081-3087 <DOI:10.1021/ic00066a019>.

D.F. O'Brien et al., "Improved energy transfer in electrophosphorescent devices," Appl. Phys. Lett., vol. 74, No. 3, Jan. 18, 1999, pp. 442-444.

D'Andrade, B. et al., "Operational stability of electrophosphorescent devices containing p and n doped transport layers", Applied Physics Letters, Nov. 2003, vol. 83, No. 19, pp. 3858-3860 <DOI:10.1063/1.1624473>.

Dan Wang et al., "Carbazole and arylamine functionalized iridium complexes for efficient electro-phosphorescent light-emitting diodes", Inorganica Chimica Acta 370 (2011) pp. 340-345.

Dileep A. K. Vezzu et al., "Highly Luminescent Tetradentate Bis-Cyclometalated Platinum Complexes: Design, Synthesis, Structure, Photophysics, and Electroluminescence Application," Inorg. Cherm., vol. 49, 2010, pp. 5107-5119.

Dorwald, Side Reactions in Organic Synthesis 2005, Wiley:VCH Weinheim Preface, pp. 1-15 & Chapter 1, pp. 279-308.

Dorwald; "Side Reactions in Organic Synthesis: A Guide to Successful Synthesis Design," Chapter 1, 2005 Wiley-VCH Verlag GmbH & Co. KGaA, Wienheim, 32 pages.

Dsouza, R., et al., "Fluorescent Dyes and Their Supramolecular Host/Guest Complexes with Macrocycles in Aqueous Solution", Oct. 2011, vol. 111, No. 12, pp. 7941-7980 <DOI:10.1021/cr200213s>.

Eric Turner et al., "Cyclometalated Platinum Complexes with Luminescent Quantum Yields Approaching 100%," Inorg. Chem., 2013, vol. 52, pp. 7344-7351.

Evan L. Williams et al., "Excimer-Based White Phosphorescent Organic Light Emitting Diodes with Nearly 100% Internal Quantum Efficiency," Adv. Mater., vol. 19, 2007, pp. 197-202.

Finikova,M.A. et al., New Selective Synthesis of Substituted Tetrabenzoporphyris, Doklady Chemistry, 2003, vol. 391, No. 4-6, pp. 222-224.

Fuchs, C. et al., "Enhanced light emission from top-emitting organic light-emitting diodes by optimizing surface plasmon polariton losses", arXiv, submitted Mar. 2015, 11 pages, arXiv:1503.01309.

Fuchs, C. et al., "Enhanced light emission from top-emitting organic light-emitting diodes by optimizing surface plasmon polariton losses", Physical Review B, Dec. 2015, vol. 92, No. 24, pp. 245306-1-245306-10 <DOI:10.1103/PhysRevB.92.245306>.

(56) References Cited

OTHER PUBLICATIONS

Galanin et al. Synthesis and Properties of meso-Phenyl-Substituted Tetrabenzoazaporphines Magnesium Complexes. Russian Journal of Organic Chemistry (Translation of Zhurnal Organicheskoi Khimii) (2002), 38(8), 1200-1203.

Galanin et al., meso-Phenyltetrabenzoazaporphyrins and their zinc complexes. Synthesis and spectral properties, Russian Journal of General Chemistry (2005), 75(4), 651-655.

Gather, M. et al., "Recent advances in light outcoupling from white organic light-emitting diodes," Journal of Photonics for Energy, May 2015, vol. 5, No. 1, 057607-1-057607-20 <DOI:10.1117/1.JPE.5.057607>.

Glauco Ponterini et al., "Comparison of Radiationless Decay Processes in Osmium and Platinum Porphyrins," J. Am. Chem. Soc., vol. 105, No. 14, 1983, pp. 4639-4645.

Gong et al., Highly Selective Complexation of Metal Ions by the Self-Tuning Tetraazacalixpyridine macrocycles, Tetrahedron, 65(1): 87-92 (2009).

Gottumukkala, V. et al., Synthesis, cellular uptake and animal toxicity of a tetra carboranylphenyl N-tetrabenzoporphyrin, Bioorganic &Medicinal Chemistry, 2006, vol. 14, pp. 1871-1879.

Graf, A. et al., "Correlating the transition dipole moment orientation of phosphorescent emitter molecules in OLEDs with basic material properties", Journal of Materials Chemistry C, Oct. 2014, vol. 2, No. 48, pp. 10298-10304 <DOI:10.1039/c4tc00997e>.

Guijie Li et al., "Efficient and stable red organic light emitting devices from a tetradentate cyclometalated platinum complex," Organic Electronics, 2014, vol. 15 pp. 1862-1867.

Guijie Li et al., "Modifying Emission Spectral Bandwidth of Phosphorescent Platinum(II) Complexes Through Synthetic Control," Inorg. Chem. 2017, 56, 8244-8256.

Guijie Li et al., Efficient and Stable White Organic Light-Emitting Diodes Employing a Single Emitter, Adv. Mater., 2014, vol. 26, pp. 2931-2936.

Hansen (1969). "The universality of the solubility parameter," I & EC Product Research and Development, 8, 2-11.

Hatakeyama, T. et al., "Ultrapure Blue Thermally Activated Delayed Fluorescence Molecules: Efficient HOMO-LUMO Separation by the Multiple Resonance Effect", Advanced Materials, Apr. 2016, vol. 28, No. 14, pp. 2777-2781, <DOI:10.1002/adma.201505491>.

Hirohiko Fukagawa et al., "Highly Efficient and Stable Red Phosphorescent Organic Light-Emitting Diodes Using Platinum Complexes," Adv. Mater., 2012, vol. 24, pp. 5099-5103.

Hoe-Joo Seo et al., "Blue phosphorescent iridium(III) complexes containing carbazole-functionalized phenyl pyridine for organic light-emitting diodes: energy transfer from carbazolyl moieties to iridium(III) cores", RSC Advances, 2011, 1, pp. 755-757.

Holmes, R. et al., "Efficient, deep-blue organic electrophosphorescence by guest charge trapping", Applied Physics Letters, Nov. 2003 [available online Oct. 2003], vol. 83, No. 18, pp. 3818-3820 <DOI:10.1063/1.1624639>.

Huaijun Tang et al., "Novel yellow phosphorescent iridium complexes containing a carbazoleeoxadiazole unit used in polymeric light-emitting diodes", Dyes and Pigments 91 (2011) pp. 413-421.

Imre et al (1996). "Liquid-liquid demixing ffrom solutions of polystyrene. 1. A review. 2. Improved correlation with solvent properties," J. Phys. Chem. Ref. Data, 25, 637-61.

Ivaylo Ivanov et al., "Comparison of the INDO band structures of polyacetylene, polythiophene, polyfuran, and polypyrrole," Synthetic Metals, vol. 116, Issues 1-3, Jan. 1, 2001, pp. 111-114.

Jack W. Levell et al., "Carbazole/iridium dendrimer side-chain phosphorescent copolymers for efficient light emitting devices", New J. Chem., 2012, vol. 36, pp. 407-413.

Jan Kalinowski et al., "Light-emitting devices based on organometallic platinum complexes as emitters," Coordination Chemistry Reviews, vol. 255, 2011, pp. 2401-2425.

Jeong et al. (2010). "Improved efficiency of bulk heterojunction poly (3-hexylthiophene):[6,6]-phenyl-C61-butyric acid methyl ester photovoltaic devices using discotic liquid crystal additives," Appl. Phys. Lett . . . 96, 183305. (3 pages).

Jeonghun Kwak et al., "Bright and Efficient Full-Color Colloidal Quantum Dot Light-Emitting Diodes Using an Inverted Device Structure," Nano Letters 12, Apr. 2, 2012, pp. 2362-2366.

Ji Hyun Seo et al., "Efficient blue-green organic light-emitting diodes based on heteroleptic tris-cyclometalated iridium (III) complexes". Thin Solid Films, vol. 517, pp. 1807-1810 (2009).

JP2009267244, English Translation from EPO, Nov. 2009, 80 pages.

JP2010135689, English translation from EPO, dated Jun. 2010, 95 pages.

Kai Li et al., "Light-emitting platinum(II) complexes supported by tetradentate dianionic bis(N-heterocyclic carbene) ligands: towards robust blue electrophosphors," Chem. Sci., 2013, vol. 4, pp. 2630-2644.

Ke Feng et al., "Norbornene-Based Copolymers Containing Platinum Complexes and Bis(carbazolyl)benzene Groups in Their Side-Chains," Macromolecules, vol. 42, 2009, pp. 6855-6864.

Kim et al. (2009). "Altering the thermodynamics of phase separation in inverted bulk-heterojunction organic solar cells," Adv. Mater., 21, 3110-15.

Kim et al. (2005). "Device annealing effect in organic solar cells with blends of regioregular poly (3-hexylthiophene) and soluble fullerene," Appl. Phys. Lett. 86, 063502. (3 pages).

Kim, HY. et al., "Crystal Organic Light-Emitting Diodes with Perfectly Oriented Non-Doped Pt-Based Emitting Layer", Advanced Functional Materials, Feb. 2016, vol. 28, No. 13, pp. 2526-2532 <DOI:10.1002/adma.201504451>.

Kim, JJ., "Setting up the new efficiency limit of OLEDs; Abstract" [online], Electrical Engineering-Princeton University, Aug. 2014 [retrieved on Aug. 24, 2016], retrieved from the internet: <URL:http://ee.princeton.edu/events/setting-new-efficiency-limit-oled> 2 pages.

Kim, SY. et al., "Organic Light-Emitting Diodes with 30% External Quantum Efficiency Based on a Horizontally Oriented Emitter", Advanced Functional Materials, Mar. 2013, vol. 23, No. 31, pp. 3896-3900 <DOI:10.1002/adfm.201300104 >.

Kroon et al. (2008). "Small bandgap olymers for organic solar cells," Polymer Reviews, 48, 531-82.

Kwon-Hyeon Kim et al., "Controlling Emitting Dipole Orientation with Methyl Substituents on Main Ligand of Iridium Complexes for Highly Efficient Phosphorescent Organic Light-Emitting Diodes", Adv. Optical Mater. 2015, 3, pp. 1191-1196.

Kwon-Hyeon Kim et al., "Crystal Organic Light-Emitting Diodes with Perfectly Oriented Non-Doped Pt-Based Emitting Layer", Adv. Mater. 2016, 28, pp. 2526-2532.

Kwong, R. et al., "High operational stability of electrophosphorescent devices", Applied Physics Letters, Jul. 2002 [available online Jun. 2002], vol. 81, No. 1, pp. 162-164 <DOI:10.1063/1.1489503>.

Lamansky, S. et al., "Cyclometalated Ir complexes in polymer organic light-emitting devices", Journal of Applied Physics, Aug. 2002 [available online Jul. 2002], vol. 92, No. 3, pp. 1570-1575 <10.1063/1.1491587>.

Lamansky, S. et al., "Synthesis and Characterization of Phosphorescent Cyclometalated Iridium Complexes", Inorganic Chemistry, Mar. 2001, vol. 40, No. 7, pp. 1704-1711 <DOI:10.1021/ic0008969>.

Lampe, T. et al., "Dependence of Phosphorescent Emitter Orientation on Deposition Technique in Doped Organic Films", Chemistry of Materials, Jan. 2016, vol. 28, pp. 712-715 <DOI:10.1021/acs.chemmater.5b04607>.

Lee et al. (2008). "Processing additives for inproved efficiency from bulk heterojunction solar cells," J. Am. Chem. Soc, 130, 3619-23.

Li et al. (2005). "Investigation of annealing effects and film thickness dependence of polymer solar cells based on poly (3-hexylthiophene)," J. Appl. Phys., 98, 043704. (5 pages).

Li et al. (2007). "Solvent annealing effect in polymer solar cells based on poly(3-hexylthiophene) and methanofullerenes," Adv. Funct. Mater, 17, 1636-44.

Li, J. et al., "Synthesis and characterization of cyclometalated Ir(III) complexes with pyrazolyl ancillary ligands", Polyhedron, Jan. 2004, vol. 23, No. 2-3, pp. 419-428 <DOI:10.1016/j.poly.2003.11.028>.

Li, J., "Efficient and Stable OLEDs Employing Square Planar Metal Complexes and Inorganic Nanoparticles", in DOE SSL R&D Workshop (Raleigh, North Carolina, 2016), Feb. 2016, 15 pages.

(56) References Cited

OTHER PUBLICATIONS

Li, J., et al., "Synthetic Control of Excited-State Properties in Cyclometalated Ir(III) Complexes Using Ancillary Ligands", Inorganic Chemistry, Feb. 2005, vol. 44, No. 6, pp. 1713-1727 <DOI:10.1021/ic048599h>.
Liang, et al. (2010). "For the bright future-bulk heterojunction polymer solar cells with power conversion efficiency of 7.4%, "Adv. Mater. 22, E135-38.
Lin, TA et al., "Sky-Blue Organic Light Emitting Diode with 37% External Quantum Efficiency Using Thermally Activated Delayed Fluorescence from Spiroacridine-Triazine Hybrid", Advanced Materials, Aug. 2016, vol. 28, No. 32, pp. 6876-6983 <DOI:10.1002/adma.201601675>.
Maestri et al., "Absorption Spectra and Luminescence Properties of Isomeric Platinum (II) and Palladium (II) Complexes Containing 1,1'-Biphenyldiyl, 2-Phenylpyridine, and 2,2'-Bipyridine as Ligands," Helvetica Chimica Acta, vol. 71, Issue 5, Aug. 10, 1988, pp. 1053-1059.
Marc Lepeltier et al., "Efficient blue green organic light-emitting devices based on a monofluorinated heteroleptic iridium(III) complex," Synthetic Metals, vol. 199, 2015, pp. 139-146.
Markham, J. et al., "High-efficiency green phosphorescence from spin-coated single-layer dendrimer light-emitting diodes", Applied Physics Lettersm Apr. 2002, vol. 80, vol. 15, pp. 2645-2647 <DOI:10.1063/1.1469218>.
Matthew J. Jurow et al., "Understanding and predicting the orientation of heteroleptic phosphors in organic light-emitting materials", Nature Materials, vol. 15, Jan. 2016, pp. 85-93.
Michl, J., "Relationship of bonding to electronic spectra", Accounts of Chemical Research, May 1990, vol. 23, No. 5, pp. 127-128 <DOI:10.1021/ar00173a001>.
Miller, R. et al., "Polysilane high polymers", Chemical Reviews, Sep. 1989, vol. 89, No. 6, pp. 1359-1410 <DOI:10.1021/cr00096a006>.
Morana et al. (2007). "Organic field-effect devices as tool to characterize the bipolar transport in polymer-fullerene blends: the case of P3HT-PCBM," Adv. Funct. Mat., 17, 3274-83.
Moule et al. (2008). "Controlling morphology in Polymer-Fullerene mixtures," Adv. Mater., 20, 240-45.
Murakami; JP 2007324309, English machine translation from EPO, dated Dec. 13, 2007, 89 pages.
Nazeeruddin, M. et al., "Highly Phosphorescence Iridium Complexes and Their Application in Organic Light-Emitting Devices", Journal of the American Chemical Society, Jun. 2003, vol. 125, No. 29, pp. 8790-8797 <DOI:10.1021/ja021413y>.
Nicholas R. Evans et al., "Triplet Energy Back Transfer in Conjugated Polymers with Pendant Phosphorescent Iridium Complexes," J. Am. Chem. Soc., vol. 128, 2006, pp. 6647-6656.
Nillson et al. (2007). "Morphology and phase segregation of spin-casted films of polyfluorene/PCBM Blends," Macromolecules, 40, 8291-8301.
Olynick et al. (2009). "The link between nanoscale feature development in a negative resist and the Hansen solubility sphere," Journal of Polymer Science: Part B: Polymer Physics, 47, 2091-2105.
Peet et al. (2007). "Efficiency enhancement in low-bandgap polymer solar cells by processing with alkane dithiols," Nature Materials, 6, 497-500.
Pivrikas et al. (2008). "Substituting the postproduction treatment for bulk-heterojunction solar cells using chemical additives," Organic Electronics, 9, 775-82.
Pui Keong Chow et al., "Strongly Phosphorescent Palladium(II) Complexes of Tetradentate Ligands with Mixed Oxygen, Carbon, and Nitrogen Donor Atoms: Photophysics, Photochemistry, and Applications," Angew. Chem. Int. Ed. 2013, 52, 11775-11779.
Pui-Keong Chow et al., "Highly luminescent palladium(II) complexes with sub-millisecond blue to green phosphorescent excited states. Photocatalysis and highly efficient PSF-OLEDs," Chem. Sci., 2016, 7, 6083-6098.
Results from SciFinder Compound Search on Dec. 8, 2016. (17 pages).
Rui Zhu et al., "Color tuning based on a six-membered chelated iridium (III) complex with aza-aromatic ligand,", Chemistry Letters, vol. 34, No. 12, 2005, pp. 1668-1669.
Russell J. Holmes et al., "Blue and Near-UV Phosphorescence from Iridium Complexes with Cyclometalated Pyrazolyl or N-Heterocyclic Carbene Ligands," Inorganic Chemistry, 2005, vol. 44, No. 22, pp. 7995-8003.
Sajoto, T. et al., "Temperature Dependence of Blue Phosphorescent Cyclometalated Ir(III) Complexes", Journal of the American Chemical Society, Jun. 2009, vol. 131, No. 28, pp. 9813-9822 <DOI:10.1021/ja903317w>.
Sakai, Y. et al., "Simple model-free estimation of orientation order parameters of vacuum-deposited and spin-coated amorphous films used in organic light-emitting diodes", Applied Physics Express, Aug. 2015, vol. 8, No. 9, p. 096601-1-096601-4 <DOI:10.7567/APEX.8.096601>.
Saricifci et al. (1993). "Semiconducting polymerbuckminsterfullerene heterojunctions: diodes photodiodes, and photovoltaic cells," Appl. Phys. Lett., 62, 585-87.
Satake et al., "Interconvertible Cationic and Neutral Pyridinylimidazole η3-Allylpalladium Complexes. Structural Assignment by 1H, 13C, and 15N NMR and X-ray Diffraction", Organometallics, vol. 18, No. 24, 1999, pp. 5108-5111.
Saunders et al. (2008). "Nanoparticle-polymer photovoltaic cells," Advances in Colloid and Interface Science, 138, 1-23.
Senes, A. et al., "Transition dipole moment orientation in films of solution processed fluorescent oligomers: investigating the influence of molecular anisotropy", Journal of Materials Chemistry C, Jun. 2016, vol. 4, No. 26, pp. 6302-6308 <DOI:10.1039/c5tc03481g>.
Shih-Chun Lo et al. "High-Triplet-Energy Dendrons: Enhancing the Luminescence of Deep Blue Phosphorescent Indium(III) Complexes" J. Am. Chem. Soc., vol. 131, 2009, pp. 16681-16688.
Shin et al. (2010). "Abrupt morphology change upon thermal annealing in Poly(3-hexathiophene)/soluble fullerene blend films for polymer solar cells," Adv. Funct. Mater., 20, 748-54.
Shiro Koseki et al., "Spin-orbit coupling analyses of the geometrical effects on phosphorescence in Ir(ppy)3 and its derivatives", J. Phys. Chem. C, vol. 117, pp. 5314-5327 (2013).
Shizuo Tokito et al. "Confinement of triplet energy on phosphorescent molecules for highly—efficient organic blue-light-emitting devices" Applied Physics Letters, vol. 83, No. 3, Jul. 21, 2003, pp. 569-571.
Stefan Bernhard, "The First Six Years: A Report," Department of Chemistry, Princeton University, May 2008, 11 pages.
Stephen R. Forrest, "The path to ubiquitous and low-cost organic electronic appliances on plastic," Nature, vol. 428, Apr. 29, 2004, pp. 911-918.
Steven C. F. Kui et al., "Robust phosphorescent platinum(II) complexes with tetradentate ONligands: high efficiency OLEDs with excellent efficiency stability," Chem. Commun., 2013, vol. 49, pp. 1497-1499.
Steven C. F. Kui et al., "Robust Phosphorescent Platinum(II) Complexes Containing Tetradentate CNLigands: Excimeric Excited State and Application in Organic White-Light-Emitting Diodes," Chem. Eur. J., 2013, vol. 19, pp. 69-73.
Strouse, G. et al., "Optical Spectroscopy of Single Crystal [Re(bpy)(CO)4](PF6): Mixing between Charge Transfer and Ligand Centered Excited States", Inorganic Chemistry, Oct. 1995, vol. 34, No. 22, pp. 5578-5587 <DOI:10.1021/ic00126a031>.
Supporting Information: Xiao-Chun Hang et al., "Highly Efficient Blue-Emitting Cyclometalated Platinum(II) Complexes by Judicious Molecular Design," Wiley-VCH 2013, 7 pages.
Sylvia Bettington et al. "Tris-Cyclometalated Iridium(III) Complexes of Carbazole(fluorenyl)pyridine Ligands: Synthesis, Redox and Photophysical Properties, and Electrophosphorescent Light-Emitting Diodes" Chemistry: A European Journal, 2007, vol. 13, pp. 1423-1431.
Tang, C. et al., "Organic electroluminescent diodes", Applied Physics Letters, Jul. 1987, vol. 51, No. 12, pp. 913-915 <DOI:10.1063/1.98799>.

(56) References Cited

OTHER PUBLICATIONS

Tsuoboyama, A. et al., "Homoleptic Cyclometalated Iridium Complexes with Highly Efficient Red Phosphorescence and Application to Organic Light-Emitting Diode", Journal of the American Chemical Society, Sep. 2003, vol. 125, No. 42, pp. 12971-12979 <DOI:10.1021/ja034732d>.
Turro, N., "Modern Molecular Photochemistry" (Sausalito, California, University Science Books, 1991), p. 48.
Tyler Fleetham et al., "Efficient "pure" blue OLEDs employing tetradentate Pt complexes with a narrow spectral bandwidth," Advanced Materials (Weinheim, Germany), Vo. 26, No. 41, 2014, pp. 7116-7121.
Tyler Fleetham et al., "Efficient Red-Emitting Platinum Complex with Long Operational Stability," ACS Appl. Mater. Interfaces 2015, 7, 16240-16246.
U.S. Appl. No. 16/751,561; filed Jan. 24, 2020, has not yet published. Inventor: Li.
U.S. Appl. No. 16/751,586; filed Jan. 24, 2020, has not yet published. Inventor: Li et al.
U.S. Appl. No. 16/668,010; filed Oct. 30, 2019.
U.S. Appl. No. 16/739,480; filed Jan. 10, 2020.
U.S. Appl. No. 61/692,937.
V. Adamovich et al., "High efficiency single dopant white electrophosphorescent light emitting diodes", New J. Chem, vol. 26, pp. 1171-1178. 2002.
V. Thamilarasan et al., "Green-emitting phosphorescent iridium(III) complex: Structural, photophysical and electrochemical properties," Inorganica Chimica Acta, vol. 408, 2013, pp. 240-245.
Vanessa Wood et al., "Colloidal quantum dot light-emitting devices," Nano Reviews 1, Jul. 2010, pp. 5202.
Wang et al. (2010). "The development of nanoscale morphology in polymer: fullerene photovoltaic blends during solvent casting," Soft Matter, 6, 4128-4134.
Wang et al., C(aryl)-C(alkyl) bond formation from Cu(ClO4)2-mediated oxidative cross coupling reaction between arenes and alkyllithium reagents through structurally well-defined Ar—Cu(III) intermediates, Chem Commun, 48: 9418-9420 (2012).
Williams, E. et al., "Excimer Based White Phosphorescent Organic Light Emitting Diodes with Nearly 100 % Internal Quantum Efficiency", Advanced Materials, Jan. 2007, vol. 19, No. 2, pp. 197-202 <DOI:10.1002/adma.200602174>.
Williams, E. et al., "Organic light-emitting diodes having exclusive near-infrared electrophosphorescence", Applied Physics Letters, Aug. 2006, vol. 89, No. 8, pp. 083506-1-083506-3 <DOI:10.1063/1.2335275>.
Wong. Challenges in organometallic research—Great opportunity for solar cells and OLEDs. Journal of Organometallic Chemistry 2009, vol. 694, pp. 2644-2647.
Xiao-Chu Hang et al., "Highly Efficient Blue-Emitting Cyclometalated Platinum(II) Complexes by Judicious Molecular Design," Angewandte Chemie, International Edition, vol. 52, Issue 26, Jun. 24, 2013, pp. 6753-6756.
Xiaofan Ren et al., "Ultrahigh Energy Gap Hosts in Deep Blue Organic Electrophosphorescent Devices," Chem. Mater., vol. 16, 2004, pp. 4743-4747.
Xin Li et al., "Density functional theory study of photophysical properties of iridium (III) complexes with phenylisoquinoline and phenylpyridine ligands", The Journal of Physical Chemistry C, 2011, vol. 115, No. 42, pp. 20722-20731.
Yakubov, L.A. et al., Synthesis and Properties of Zinc Complexes of mesoHexadecyloxy-Substituted Tetrabenzoporphyrin and Tetrabenzoazaporphyrins, Russian Journal of Organic Chemistry, 2008, vol. 44, No. 5, pp. 755-760.
Yang et al. (2005). "Nanoscale morphology of high-performance polymer solar cells," Nano Lett., 5, 579-83.
Yang, X. et al., "Efficient Blue and White Emitting Electrophosphorescent Devices Based on Platinum(II) [1,3 Difluoro 4,6 di(2 pyridinyl)benzene] Chloride", Advanced Materials, Jun. 2008, vol. 20, No. 12, pp. 2405-2409 <DOI:10.1002/adma.200702940>.
Yao et al. (2008). "Effect of solvent mixture on nanoscale phase separation in polymer solar cells," Adv. Funct. Mater.,18, 1783-89.
Yao et al., Cu(ClO4)2-Mediated Arene C—H Bond Halogenations of Azacalixaromatics Using Alkali Metal Halides as Halogen Sources, The Journal of Organic Chemistry, 77(7): 3336-3340 (2012).
Ying Yang et al., "Induction of Circularly Polarized Electroluminescence from an Achiral Light-Emitting Polymer via a Chiral Small-Molecule Dopant," Advanced Materials, vol. 25, Issue 18, May 14, 2013, pp. 2624-2628.
Yu et al. (1995). "Polymer Photovoltaic Cells: Enhanced efficiencies via a network of internal donor-acceptor heterojunctions," Science, 270, 1789-91.
Z Liu et al., "Green and blue-green phosphorescent heteroleptic iridium complexes containing carbazole-functionalized beta-diketonate for non-doped organic light-emitting diodes", Organic Electronics 9 (2008) pp. 171-182.
Z Xu et al., "Synthesis and properties of iridium complexes based 1,3,4-oxadiazoles derivatives", Tetrahedron 64 (2008) pp. 1860-1867.
Zhi-Qiang Zhu et al., "Efficient Cyclometalated Platinum(II) Complex with Superior Operational Stability," Adv. Mater. 29 (2017) 1605002, pp. 1-5.
Zhi-Qiang Zhu et.al., "Harvesting All Electrogenerated Excitons through Metal Assisted Delayed Fluorescent Materials," Adv. Mater. 27 (2015) 2533-2537.
Zhu, W. et al., "Highly efficient electrophosphorescent devices based on conjugated polymers doped with iridium complexes", Applied Physics Letters, Mar. 2002, vol. 80, No. 12, pp. 2045-2047 <DOI:10.1063/1.1461418>.

\* cited by examiner

LIGHT OUTCOUPLING EFFICIENCY OF PHOSPHORESCENT OLEDS BY MIXING HORIZONTALLY ALIGNED FLUORESCENT EMITTERS

CROSS-REFERENCE TO RELATED APPLICATIONS

The present application claims priority to U.S. Provisional Application No. 62/796,704, filed Jan. 25, 2019, which is incorporated by reference herein in its entirety.

BACKGROUND OF THE INVENTION

Organic light emitting devices (OLED) are typically multilayer devices which upon an applied voltage are capable emitting light from the radiative relaxation of an excited state located on an organic material. OLEDs have found widespread application as an alternative to LCDs for handheld devices or flat panel displays. Furthermore, OLEDs have shown promise as next generation solid state white lighting, use in medical devices, and as infrared emitters for communication applications. The use of organic materials presents a number of unique benefits including: compatibility with flexible substrates, capabilities for large scale production, and simplified tuning of the emission properties through molecular modification.

A typical OLED device consists of at least one transparent electrode through which the light emits. For example OLEDs which emit through the bottom substrate typically contain a transparent conductive oxide material, such as indium tin oxide, as an anode, while at the cathode a reflective metal is typically used. Alternatively, devices may emit from the top through a thin metal layer as the cathode while having an either opaque or transparent anode layer. In this way it is possible to have dual emission from both top and bottom if such a device is so desired and furthermore it is possible for these OLEDs to be transparent. Sandwiched between the electrodes is typically a multilayer organic stack typically a single layer of hole-transporting materials (HTL), a single layer of emissive materials (EML) including emitters and hosts, a single layer of electron-transporting materials (ETL) and a layer of metal cathode, shown in FIG. 1. For each of the transport layers care must be taken to optimize the separate process of facilitating charge injection, have efficient charge transport, and confining the charges and excitons in a specified emissive region (typically the emissive layer). Such a process can be achieved through either a single material or through a multilayer stack which may separate the injection, transport, charge confining, and exciton confining tasks. The emissive layer may be composed of a single emissive materials, a single emissive material dispersed in a host matrix material, multiple emissive materials dispersed in a host matrix, or any number of emissive materials dispersed in multiple host materials. The host materials much be chosen carefully to not quench the excited state of the emitter as well as provide appropriate distribution of charges and excitons within the emissive layer. The emission color of the OLED is determined by the emission energy (optical energy gap) of emitters.

Light is generated in OLEDs through the formation of excited states from separately injected electrons and holes to form an exciton, located on the organic material. Due to the uncorrelated nature of the injected charges excitons with total spin of 0 and 1 are possible. Spin 0 excitons are denoted singlets while spin 1 excitons are denoted triplets, reflecting their respective degeneracies. Due to the selection rules for radiative transitions, the symmetry of the excited state and the ground state must be the same. Since the ground state of most molecules are antisymmetric, radiative relaxation of the symmetric triplet excited state is typically disallowed. As such, emission from the triplet state, called phosphorescence, is very slow and the transition probability is very low. However, emission from the singlet state, called fluorescence can be very rapid and consequently very efficient. Nevertheless, statistically there is only 1 singlet exciton for every 3 triplet excitons formed. There are very few fluorescent emitters which exhibit emission from the triplet state at room temperature, so 75% of the generated excitons are wasted in most fluorescent emitters. However, emission from the triplet state can be facilitated through spin orbit coupling which incorporates a heavy metal atom in order to perturb the triplet state and add in some singlet character to and achieve a higher probability of radiative relaxation.

SUMMARY OF THE INVENTION

According to one embodiment, an organic light emitting device (OLED) is provided. The OLED comprises an anode; a cathode; and at least one organic layer disposed between the anode and the cathode; wherein the at least one organic layer includes a phosphorescent/MADF emitter and a fluorescent emitter. In one embodiment, the phosphorescent/MADF emitter is a compound having Formula I or Formula II;

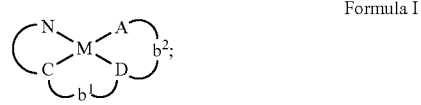

Formula I

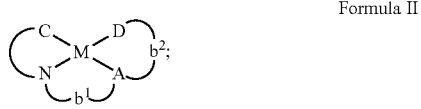

Formula II wherein A is an accepting group comprising one or more of the following structures, which can optionally be substituted:

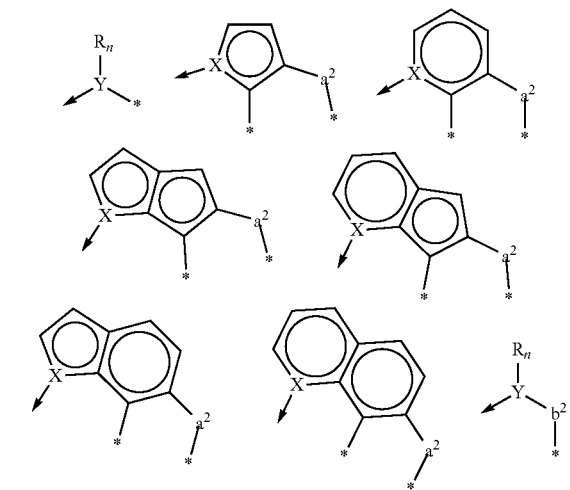

-continued
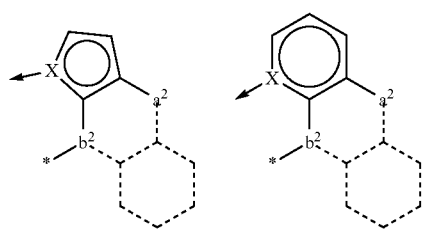
wherein D is a donor group comprising of one or more of the following structures, which can optionally be substituted:
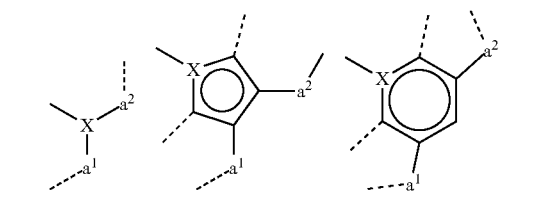
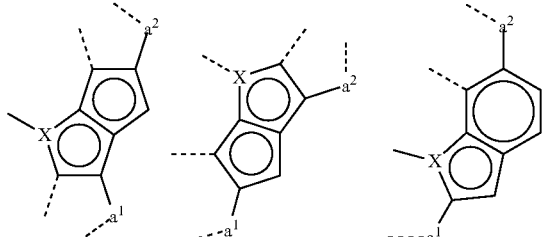
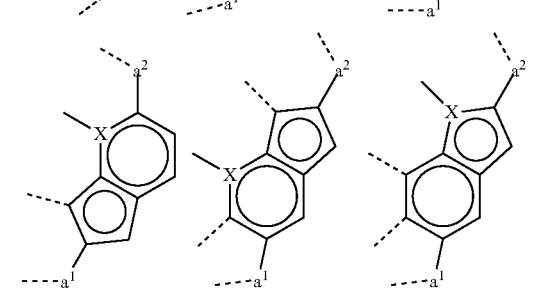
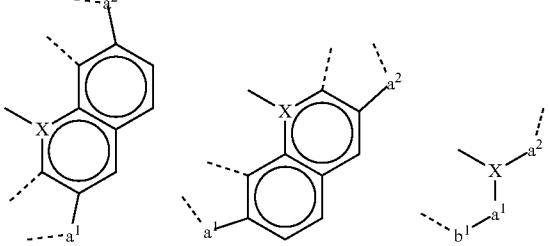
-continued
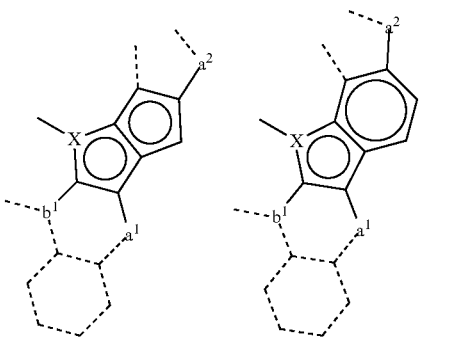
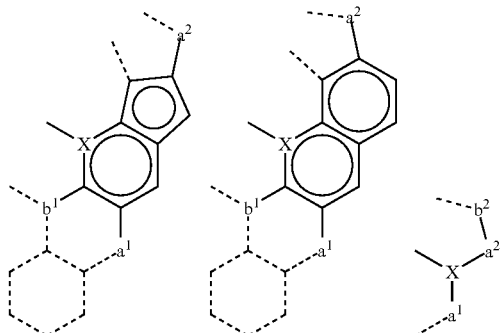
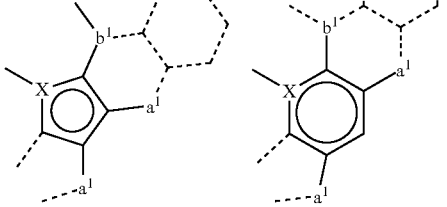
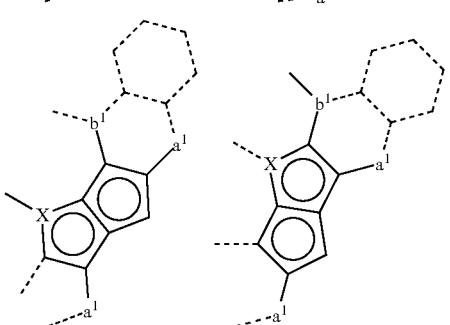
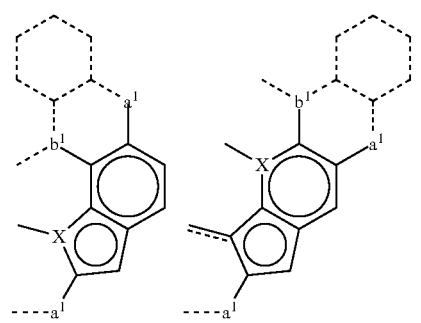

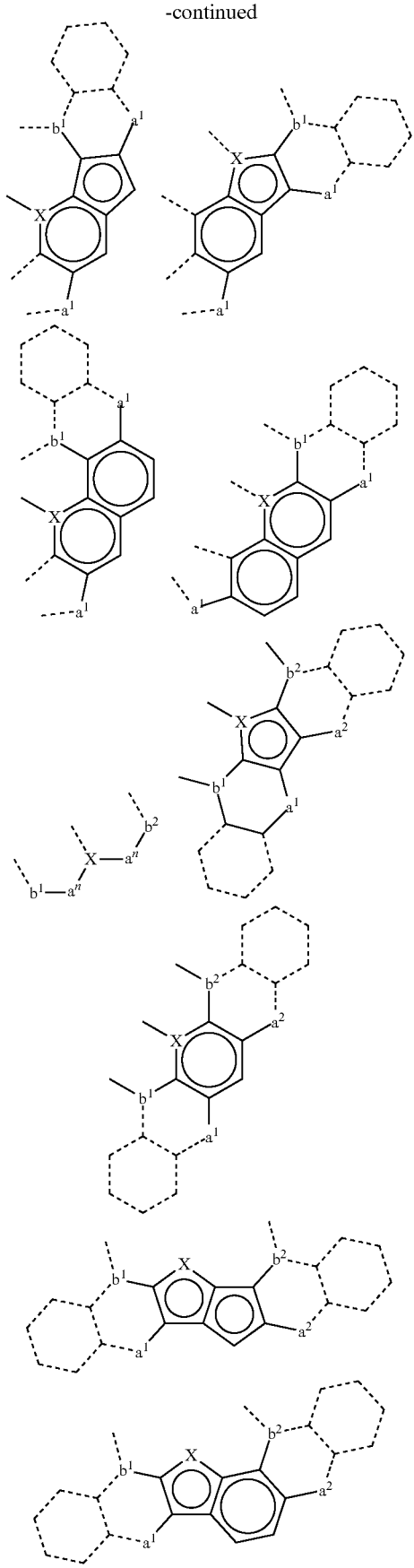
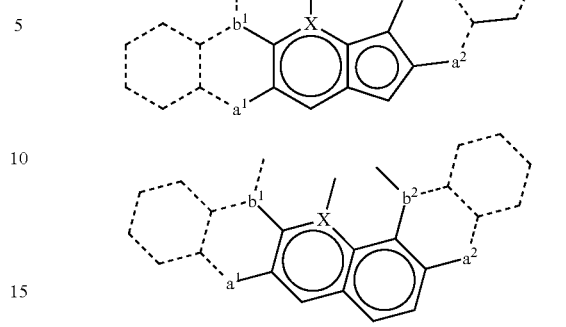
wherein C in Formula I or Formula II comprises one or more of the following structures, which can optionally be substituted:
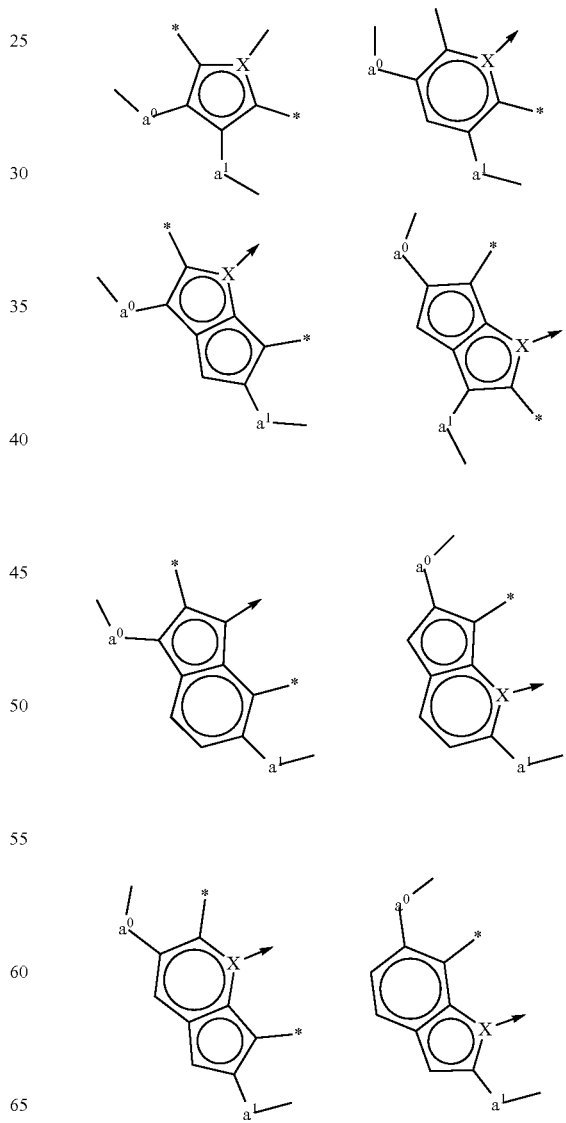

-continued

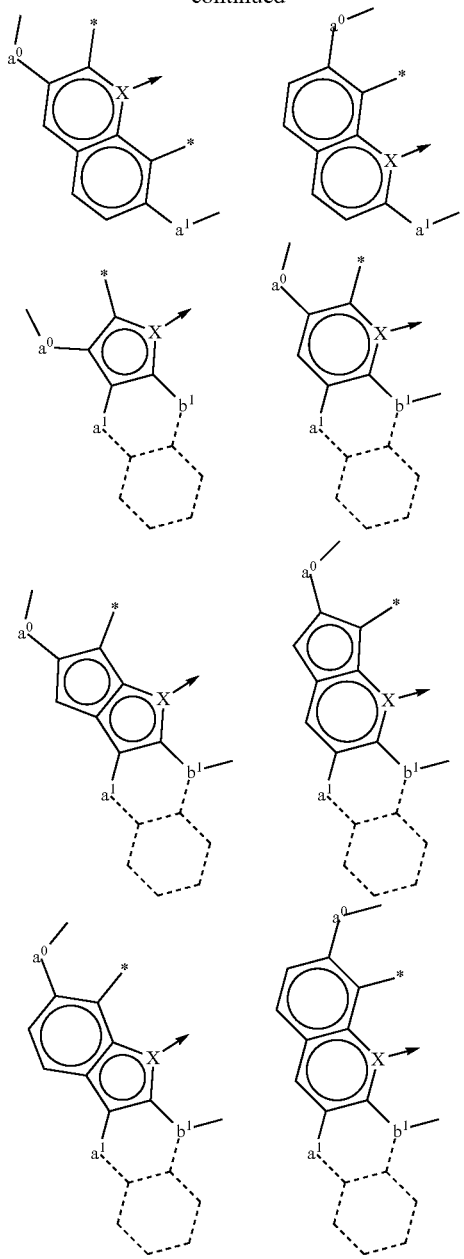

wherein N in Formula I or II comprises one or more of the following structures, which can optionally be substituted:

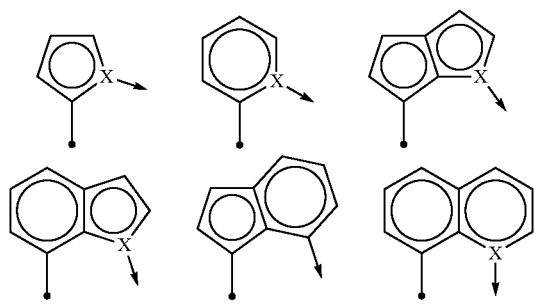

wherein each of $a^0$, $a^1$, and $a^2$ independently is present or absent, and if present, comprises a direct bond and/or linking group comprising one or more of the following:

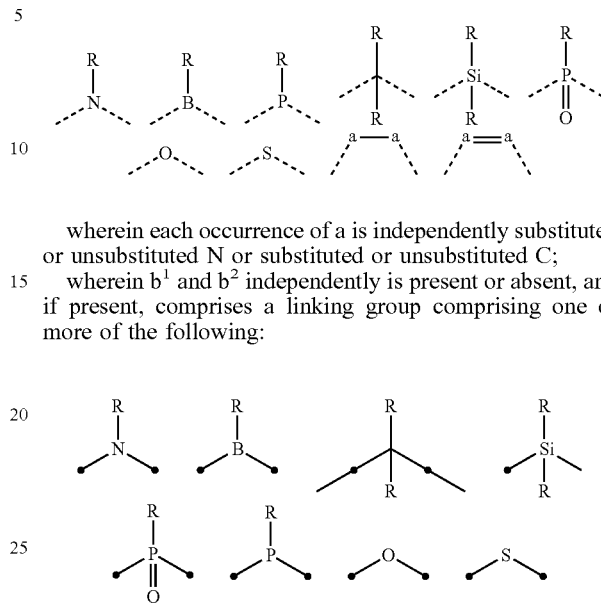

wherein each occurrence of a is independently substituted or unsubstituted N or substituted or unsubstituted C;
wherein $b^1$ and $b^2$ independently is present or absent, and if present, comprises a linking group comprising one or more of the following:

wherein each occurrence of X is independently B, C, N, O, Si, P, S, Ge, As, Se, Sn, Sb, or Te;
wherein Y is O, S, S=O, $SO_2$, Se, N, $NR^3$, $PR^3$, RP=O, $CR^1R^2$, C=O, $SiR^1R^2$, $GeR^1R^2$, BH, P(O)H, PH, NH, $CR^1H$, $CH_2$, $SiH_2$, $SiHR^1$, BH, or $BR^3$,
wherein each of R, $R^1$, $R^2$, and $R^3$ independently is hydrogen, aryl, cycloalkyl, cycloalkenyl, heterocyclyl, heteroaryl, alkyl, alkenyl, alkynyl, deuterium, halogen, hydroxyl, thiol, nitro, cyano, amino, a mono- or di-alkylamino, a mono- or diaryl amino, alkoxy, aryloxy, haloalkyl, aralkyl, ester, nitrile, isonitrile, alkoxycarbonyl, acylamino, alkoxycarbonylamino, aryloxycarbonylamino, sulfonylamino, sulfamoyl, carbamoyl, alkylthio, sulfinyl, ureido, phosphoramide, mercapto, sulfo, carboxyl, hydrazino, substituted silyl, or polymerizable, or any conjugate or combination thereof,
wherein n is a number that satisfies the valency of Y; and
wherein M is platinum, palladium, nickel, manganese, zinc, gold, silver, copper, iridium, rhodium, and/or cobalt.

In one embodiment, the emitting dipole of the fluorescent emitter is horizontally oriented. In one embodiment, the ratio of organic dipoles in at least one organic layer is greater than 0.7

BRIEF DESCRIPTION OF THE DRAWINGS

The following detailed description of preferred embodiments will be better understood when read in conjunction with the appended drawings. For the purpose of illustration, there are shown in the drawings embodiments which are presently preferred. It should be understood, however, that the disclosure is not limited to the precise arrangements and instrumentalities of the embodiments shown in the drawings.

FIG. 6A is a schematic illustration of random emitting dipole orientation. FIG. 6B is a schematic illustration of controlled horizontally emitting dipole orientation. FIG. 6C is a contour plot of the maximum achievable EQE possessing a certain PLQY and ratio of the horizontal dipoles.

FIG. 7A is a plot depicting current-voltage characteristics. FIG. 7B is a plot of the electroluminescent spectra of devices (1) and (2). FIG. 7C is a plot of external quantum efficiency (EQE) vs. brightness for the two exemplary devices.

FIG. 9A is a plot of external quantum efficiency (EQE) vs. brightness. FIG. 9B is a plot of current-voltage characteristics. FIG. 9C is a plot of the electroluminescent spectra of the devices. FIG. 9D is a schematic showing the structure of the devices.

FIG. 10A is a plot of external quantum efficiency (EQE) vs. brightness. FIG. 10B is a plot of current-voltage characteristics. FIG. 10C is a plot of the electroluminescent spectra of the devices relative to a single layer standard.

DETAILED DESCRIPTION

Definitions

Figure 1:
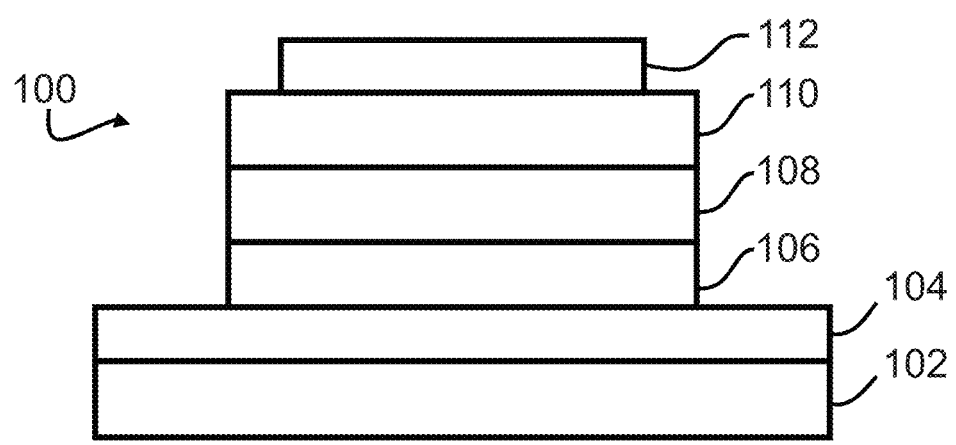
FIG. 1 is a schematic diagram of an exemplary organic light emitting device.

It is to be understood that the figures and descriptions herein have been simplified to illustrate elements that are relevant for a clear understanding of the present disclosure, while eliminating, for the purpose of clarity, many other elements found in the art related to phosphorescent organic light emitting devices and the like. Those of ordinary skill in the art may recognize that other elements and/or steps are desirable and/or required in implementing the devices disclosed herein. However, because such elements and steps are well known in the art, a discussion of such elements and steps is not provided herein. The disclosure herein is directed to all such variations and modifications to such elements and methods known to those skilled in the art.

Unless defined otherwise, all technical and scientific terms used herein have the same meaning as commonly understood by one of ordinary skill in the art to which this disclosure pertains. Although any methods, materials and components similar or equivalent to those described herein can be used in the practice or testing of the disclosed devices and compositions, the preferred methods, and materials are described.

As used herein, each of the following terms has the meaning associated with it in this section.

The articles "a" and "an" are used herein to refer to one or to more than one (i.e., to at least one) of the grammatical object of the article. By way of example, "an element" means one element or more than one element.

"About" as used herein when referring to a measurable value such as an amount, a temporal duration, and the like, is meant to encompass variations of ±20%, ±10%, ±5%, ±1%, or ±0.1% from the specified value, as such variations are appropriate.

Throughout this disclosure, various aspects can be presented in a range format. It should be understood that the description in range format is merely for convenience and brevity and should not be construed as an inflexible limitation. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 2.7, 3, 4, 5, 5.3, 6 and any whole and partial increments therebetween. This applies regardless of the breadth of the range.

Disclosed are the components to be used to prepare the compositions of the disclosure as well as the compositions themselves to be used within the methods disclosed herein. These and other materials are disclosed herein, and it is understood that when combinations, subsets, interactions, groups, etc. of these materials are disclosed that while specific reference of each various individual and collective combinations and permutation of these compounds cannot be explicitly disclosed, each is specifically contemplated and described herein. For example, if a particular compound is disclosed and discussed and a number of modifications that can be made to a number of molecules including the compounds are discussed, specifically contemplated is each and every combination and permutation of the compound and the modifications that are possible unless specifically indicated to the contrary. Thus, if a class of molecules A, B, and C are disclosed as well as a class of molecules D, E, and F and an example of a combination molecule, A-D is disclosed, then even if each is not individually recited each is individually and collectively contemplated meaning combinations, A-E, A-F, B-D, B-E, B-F, C-D, C-E, and C-F are considered disclosed. Likewise, any subset or combination of these is also disclosed. Thus, for example, the sub-group of A-E, B-F, and C-E would be considered disclosed. This concept applies to all aspects of this application including, but not limited to, steps in methods of making and using the compositions disclosed herein. Thus, if there are a variety of additional steps that can be performed it is understood that each of these additional steps can be performed with any specific embodiment or combination of embodiments of the methods disclosed herein.

As referred to herein, a linking atom or a linking group can connect two groups such as, for example, an N and C group. The linking atom can optionally, if valency permits, have other chemical moieties attached. For example, in one aspect, an oxygen would not have any other chemical groups attached as the valency is satisfied once it is bonded to two groups (e.g., N and/or C groups). In another aspect, when carbon is the linking atom, two additional chemical moieties can be attached to the carbon. Suitable chemical moieties includes, but are not limited to, hydrogen, hydroxyl, alkyl, alkoxy, =O, halogen, nitro, amine, amide, thiol, aryl, heteroaryl, cycloalkyl, and heterocyclyl.

The term "cyclic structure" or the like terms used herein refer to any cyclic chemical structure which includes, but is not limited to, aryl, heteroaryl, cycloalkyl, cycloalkenyl, and heterocyclyl.

As used herein, the term "substituted" is contemplated to include all permissible substituents of organic compounds. In a broad aspect, the permissible substituents include acyclic and cyclic, branched and unbranched, carbocyclic and heterocyclic, and aromatic and nonaromatic substituents of organic compounds. Illustrative substituents include, for example, those described below. The permissible substituents can be one or more and the same or different for appropriate organic compounds. For purposes of this disclosure, the heteroatoms, such as nitrogen, can have hydrogen substituents and/or any permissible substituents of organic compounds described herein which satisfy the valences of the heteroatoms. This disclosure is not intended to be limited in any manner by the permissible substituents of organic compounds. Also, the terms "substitution" or "substituted with" include the implicit proviso that such substitution is in accordance with permitted valence of the substituted atom and the substituent, and that the substitution results in a stable compound, e.g., a compound that does not spontaneously undergo transformation such as by rearrangement, cyclization, elimination, etc. It is also contemplated that, in certain aspects, unless expressly indicated to the contrary, individual substituents can be further optionally substituted (i.e., further substituted or unsubstituted).

The term "alkyl" as used herein is a branched or unbranched saturated hydrocarbon group of 1 to 24 carbon atoms, such as methyl, ethyl, n-propyl, isopropyl, n-butyl, isobutyl, s-butyl, t-butyl, n-pentyl, isopentyl, s-pentyl, neopentyl, hexyl, heptyl, octyl, nonyl, decyl, dodecyl, tetradecyl, hexadecyl, eicosyl, tetracosyl, and the like. The alkyl group can be cyclic or acyclic. The alkyl group can be branched or unbranched. The alkyl group can also be substituted or unsubstituted. For example, the alkyl group can be substituted with one or more groups including, but not limited to, alkyl, cycloalkyl, alkoxy, amino, ether, halide, hydroxy, nitro, silyl, sulfo-oxo, or thiol, as described herein. A "lower alkyl" group is an alkyl group containing from one to six (e.g., from one to four) carbon atoms.

Throughout the specification "alkyl" is generally used to refer to both unsubstituted alkyl groups and substituted alkyl groups; however, substituted alkyl groups are also specifically referred to herein by identifying the specific substituent(s) on the alkyl group. For example, the term "halogenated alkyl" or "haloalkyl" specifically refers to an alkyl group that is substituted with one or more halide, e.g., fluorine, chlorine, bromine, or iodine. The term "alkoxyalkyl" specifically refers to an alkyl group that is substituted with one or more alkoxy groups, as described below. The term "alkylamino" specifically refers to an alkyl group that is substituted with one or more amino groups, as described below, and the like. When "alkyl" is used in one instance and a specific term such as "alkylalcohol" is used in another, it is not meant to imply that the term "alkyl" does not also refer to specific terms such as "alkylalcohol" and the like.

This practice is also used for other groups described herein. That is, while a term such as "cycloalkyl" refers to both unsubstituted and substituted cycloalkyl moieties, the substituted moieties can, in addition, be specifically identified herein; for example, a particular substituted cycloalkyl can be referred to as, e.g., an "alkylcycloalkyl." Similarly, a substituted alkoxy can be specifically referred to as, e.g., a "halogenated alkoxy," a particular substituted alkenyl can be, e.g., an "alkenylalcohol," and the like. Again, the practice of using a general term, such as "cycloalkyl," and a specific term, such as "alkylcycloalkyl," is not meant to imply that the general term does not also include the specific term.

The term "cycloalkyl" as used herein is a non-aromatic carbon-based ring composed of at least three carbon atoms. Examples of cycloalkyl groups include, but are not limited to, cyclopropyl, cyclobutyl, cyclopentyl, cyclohexyl, norbornyl, and the like. The term "heterocycloalkyl" is a type of cycloalkyl group as defined above, and is included within the meaning of the term "cycloalkyl," where at least one of the carbon atoms of the ring is replaced with a heteroatom such as, but not limited to, nitrogen, oxygen, sulfur, or phosphorus. The cycloalkyl group and heterocycloalkyl group can be substituted or unsubstituted. The cycloalkyl group and heterocycloalkyl group can be substituted with one or more groups including, but not limited to, alkyl, cycloalkyl, alkoxy, amino, ether, halide, hydroxy, nitro, silyl, sulfo-oxo, or thiol as described herein.

The term "polyalkylene group" as used herein is a group having two or more $CH_2$ groups linked to one another. The polyalkylene group can be represented by the formula $-(CH_2)_a-$, where "a" is an integer of from 2 to 500.

The terms "alkoxy" and "alkoxyl" as used herein to refer to an alkyl or cycloalkyl group bonded through an ether linkage; that is, an "alkoxy" group can be defined as $-OA^1$ where $A^1$ is alkyl or cycloalkyl as defined above. "Alkoxy" also includes polymers of alkoxy groups as just described; that is, an alkoxy can be a polyether such as $-OA^1-OA^2$ or $-OA^1-(OA^2)_a-OA^3$, where "a" is an integer of from 1 to 200 and $A^1$, $A^2$, and $A^3$ are alkyl and/or cycloalkyl groups.

The term "alkenyl" as used herein is a hydrocarbon group of from 2 to 24 carbon atoms with a structural formula containing at least one carbon-carbon double bond. Asymmetric structures such as $(A^1A^2)C=C(A^3A^4)$ are intended to include both the E and Z isomers. This can be presumed in structural formulae herein wherein an asymmetric alkene is present, or it can be explicitly indicated by the bond symbol C=C. The alkenyl group can be substituted with one or more groups including, but not limited to, alkyl, cycloalkyl, alkoxy, alkenyl, cycloalkenyl, alkynyl, cycloalkynyl, aryl, heteroaryl, aldehyde, amino, carboxylic acid, ester, ether, halide, hydroxy, ketone, azide, nitro, silyl, sulfo-oxo, or thiol, as described herein.

The term "cycloalkenyl" as used herein is a non-aromatic carbon-based ring composed of at least three carbon atoms and containing at least one carbon-carbon double bond, i.e., C=C. Examples of cycloalkenyl groups include, but are not limited to, cyclopropenyl, cyclobutenyl, cyclopentenyl, cyclopentadienyl, cyclohexenyl, cyclohexadienyl, norbornenyl, and the like. The term "heterocycloalkenyl" is a type of cycloalkenyl group as defined above, and is included within the meaning of the term "cycloalkenyl," where at least one of the carbon atoms of the ring is replaced with a heteroatom such as, but not limited to, nitrogen, oxygen, sulfur, or phosphorus. The cycloalkenyl group and heterocycloalkenyl group can be substituted or unsubstituted. The cycloalkenyl group and heterocycloalkenyl group can be substituted with one or more groups including, but not limited to, alkyl, cycloalkyl, alkoxy, alkenyl, cycloalkenyl, alkynyl, cycloalkynyl, aryl, heteroaryl, aldehyde, amino, carboxylic acid, ester, ether, halide, hydroxy, ketone, azide, nitro, silyl, sulfo-oxo, or thiol as described herein.

The term "alkynyl" as used herein is a hydrocarbon group of 2 to 24 carbon atoms with a structural formula containing at least one carbon-carbon triple bond. The alkynyl group can be unsubstituted or substituted with one or more groups including, but not limited to, alkyl, cycloalkyl, alkoxy, alkenyl, cycloalkenyl, alkynyl, cycloalkynyl, aryl, heteroaryl, aldehyde, amino, carboxylic acid, ester, ether, halide, hydroxy, ketone, azide, nitro, silyl, sulfo-oxo, or thiol, as described herein.

The term "cycloalkynyl" as used herein is a non-aromatic carbon-based ring composed of at least seven carbon atoms and containing at least one carbon-carbon triple bound. Examples of cycloalkynyl groups include, but are not limited to, cycloheptynyl, cyclooctynyl, cyclononynyl, and the like. The term "heterocycloalkynyl" is a type of cycloalkenyl group as defined above, and is included within the meaning of the term "cycloalkynyl," where at least one of the carbon atoms of the ring is replaced with a heteroatom such as, but not limited to, nitrogen, oxygen, sulfur, or phosphorus. The cycloalkynyl group and heterocycloalkynyl group can be substituted or unsubstituted. The cycloalkynyl group and heterocycloalkynyl group can be substituted with one or more groups including, but not limited to, alkyl, cycloalkyl, alkoxy, alkenyl, cycloalkenyl, alkynyl, cycloalkynyl, aryl, heteroaryl, aldehyde, amino, carboxylic acid, ester, ether, halide, hydroxy, ketone, azide, nitro, silyl, sulfo-oxo, or thiol as described herein.

The term "aryl" as used herein is a group that contains any carbon-based aromatic group including, but not limited to, benzene, naphthalene, phenyl, biphenyl, phenoxybenzene, and the like. The term "aryl" also includes "heteroaryl," which is defined as a group that contains an aromatic group that has at least one heteroatom incorporated within the ring of the aromatic group. Examples of heteroatoms include, but are not limited to, nitrogen, oxygen, sulfur, and phosphorus. Likewise, the term "non-heteroaryl," which is also included in the term "aryl," defines a group that contains an aromatic group that does not contain a heteroatom. The aryl group can be substituted or unsubstituted. The aryl group can be substituted with one or more groups including, but not limited to, alkyl, cycloalkyl, alkoxy, alkenyl, cycloalkenyl, alkynyl, cycloalkynyl, aryl, heteroaryl, aldehyde, amino, carboxylic acid, ester, ether, halide, hydroxy, ketone, azide, nitro, silyl, sulfo-oxo, or thiol as described herein. The term "biaryl" is a specific type of aryl group and is included in the definition of "aryl." Biaryl refers to two aryl groups that are bound together via a fused ring structure, as in naphthalene, or are attached via one or more carbon-carbon bonds, as in biphenyl.

The term "aldehyde" as used herein is represented by the formula —C(O)H. Throughout this specification "C(O)" is a short hand notation for a carbonyl group, i.e., C=O.

The terms "amine" or "amino" as used herein are represented by the formula —$NA^1A^2$, where $A^1$ and $A^2$ can be, independently, hydrogen or alkyl, cycloalkyl, alkenyl, cycloalkenyl, alkynyl, cycloalkynyl, aryl, or heteroaryl group as described herein.

The term "alkylamino" as used herein is represented by the formula —NH(-alkyl) where alkyl is a described herein. Representative examples include, but are not limited to, methylamino group, ethylamino group, propylamino group, isopropylamino group, butylamino group, isobutylamino group, (sec-butyl)amino group, (tert-butyl)amino group, pentylamino group, isopentylamino group, (tert-pentyl) amino group, hexylamino group, and the like.

The term "dialkylamino" as used herein is represented by the formula —$N(-alkyl)_2$ where alkyl is a described herein. Representative examples include, but are not limited to, dimethylamino group, diethylamino group, dipropylamino group, diisopropylamino group, dibutylamino group, diisobutylamino group, di(sec-butyl)amino group, di(tert-butyl)amino group, dipentylamino group, diisopentylamino group, di(tert-pentyl)amino group, dihexylamino group, N-ethyl-N-methylamino group, N-methyl-N-propylamino group, N-ethyl-N-propylamino group and the like.

The term "carboxylic acid" as used herein is represented by the formula —C(O)OH.

The term "ester" as used herein is represented by the formula —$OC(O)A^1$ or —$C(O)OA^1$, where $A^1$ can be alkyl, cycloalkyl, alkenyl, cycloalkenyl, alkynyl, cycloalkynyl, aryl, or heteroaryl group as described herein. The term "polyester" as used herein is represented by the formula -$(A^1O(O)C-A^2-C(O)O)$, or -$(A^1O(O)C-A^2-OC(O))_a$—, where $A^1$ and $A^2$ can be, independently, an alkyl, cycloalkyl, alkenyl, cycloalkenyl, alkynyl, cycloalkynyl, aryl, or heteroaryl group described herein and "a" is an integer from 1 to 500. "Polyester" is as the term used to describe a group that is produced by the reaction between a compound having at least two carboxylic acid groups with a compound having at least two hydroxyl groups.

The term "ether" as used herein is represented by the formula $A^1OA^2$, where $A^1$ and $A^2$ can be, independently, an alkyl, cycloalkyl, alkenyl, cycloalkenyl, alkynyl, cycloalkynyl, aryl, or heteroaryl group described herein. The term "polyether" as used herein is represented by the formula -$(A^1O-A^2O)_a$—, where $A^1$ and $A^2$ can be, independently, an alkyl, cycloalkyl, alkenyl, cycloalkenyl, alkynyl, cycloalkynyl, aryl, or heteroaryl group described herein and "a" is an integer of from 1 to 500. Examples of polyether groups include polyethylene oxide, polypropylene oxide, and polybutylene oxide.

The term "halide" as used herein refers to the halogens fluorine, chlorine, bromine, and iodine.

The term "heterocyclyl," as used herein refers to single and multi-cyclic non-aromatic ring systems and "heteroaryl" as used herein refers to single and multi-cyclic aromatic ring systems: in which at least one of the ring members is other than carbon. The term "heterocyclyl" includes azetidine, dioxane, furan, imidazole, isothiazole, isoxazole, morpholine, oxazole, oxazole, including, 1,2,3-oxadiazole, 1,2,5-oxadiazole and 1,3,4-oxadiazole, piperazine, piperidine, pyrazine, pyrazole, pyridazine, pyridine, pyrimidine, pyrrole, pyrrolidine, tetrahydrofuran, tetrahydropyran, tetrazine, including 1,2,4,5-tetrazine, tetrazole, including 1,2,3,4-tetrazole and 1,2,4,5-tetrazole, thiadiazole, including, 1,2,3-thiadiazole, 1,2,5-thiadiazole, and 1,3,4-thiadiazole, thiazole, thiophene, triazine, including 1,3,5-triazine and 1,2,4-triazine, triazole, including, 1,2,3-triazole, 1,3,4-triazole, and the like.

The term "hydroxyl" as used herein is represented by the formula —OH.

The term "ketone" as used herein is represented by the formula $A^1C(O)A^2$, where $A^1$ and $A^2$ can be, independently, an alkyl, cycloalkyl, alkenyl, cycloalkenyl, alkynyl, cycloalkynyl, aryl, or heteroaryl group as described herein.

The term "azide" as used herein is represented by the formula —$N_3$.

The term "nitro" as used herein is represented by the formula —$NO_2$.

The term "nitrile" as used herein is represented by the formula —CN.

The term "ureido" as used herein refers to a urea group of the formula —$NHC(O)NH_2$ or —NHC(O)NH—.

The term "phosphoramide" as used herein refers to a group of the formula —$P(O)(NA^1A^2)_2$, where $A^1$ and $A^2$ can be, independently, hydrogen or an alkyl, cycloalkyl, alkoxy, alkenyl, cycloalkenyl, alkynyl, cycloalkynyl, aryl, or heteroaryl group as described herein.

The term "carbamoyl" as used herein refers to an amide group of the formula —$CONA^1A^2$, where $A^1$ and $A^2$ can be, independently, hydrogen or an alkyl, cycloalkyl, alkoxy, alkenyl, cycloalkenyl, alkynyl, cycloalkynyl, aryl, or heteroaryl group as described herein.

The term "sulfamoyl" as used herein refers to a group of the formula —$S(O)_2NA^1A^2$, where $A^1$ and $A^2$ can be, independently, hydrogen or an alkyl, cycloalkyl, alkoxy, alkenyl, cycloalkenyl, alkynyl, cycloalkynyl, aryl, or heteroaryl group as described herein.

The term "silyl" as used herein is represented by the formula —$SiA^1A^2A^3$, where $A^1$, $A^2$, and $A^3$ can be, independently, hydrogen or an alkyl, cycloalkyl, alkoxy, alkenyl, cycloalkenyl, alkynyl, cycloalkynyl, aryl, or heteroaryl group as described herein.

The term "sulfo-oxo" as used herein is represented by the formulas —$S(O)A^1$, —$S(O)_2A^1$, —$OS(O)_2A'$, or —$OS(O)_2OA^1$, where $A^1$ is hydrogen or an alkyl, cycloalkyl, alkenyl, cycloalkenyl, alkynyl, cycloalkynyl, aryl, or heteroaryl group as described herein. Throughout this specification "S(O)" is a short hand notation for S=O. The term "sulfonyl" is used herein to refer to the sulfo-oxo group represented by the formula —$S(O)_2A'$, where $A^1$ is hydrogen or an alkyl, cycloalkyl, alkenyl, cycloalkenyl, alkynyl, cycloalkynyl, aryl, or heteroaryl group as described herein.

The term "sulfone" as used herein is represented by the formula $A^1S(O)_2A^2$, where $A^1$ and $A^2$ can be, independently, an alkyl, cycloalkyl, alkenyl, cycloalkenyl, alkynyl, cycloalkynyl, aryl, or heteroaryl group as described herein.

The term "sulfoxide" as used herein is represented by the formula $A'S(O)A^2$, where $A^1$ and $A^2$ can be, independently, an alkyl, cycloalkyl, alkenyl, cycloalkenyl, alkynyl, cycloalkynyl, aryl, or heteroaryl group as described herein.

The term "thiol" as used herein is represented by the formula —SH.

"R," "$R^1$," "$R^2$," "$R^3$," "$R^n$," where n is an integer, as used herein can, independently, include hydrogen or one or more of the groups listed above. For example, if $R^1$ is a straight chain alkyl group, one of the hydrogen atoms of the alkyl group can optionally be substituted with a hydroxyl group, an alkoxy group, an alkyl group, a halide, and the like. Depending upon the groups that are selected, a first group can be incorporated within a second group or, alternatively, the first group can be pendant (i.e., attached) to the second group. For example, with the phrase "an alkyl group comprising an amino group," the amino group can be incorporated within the backbone of the alkyl group. Alternatively, the amino group can be attached to the backbone of the alkyl group. The nature of the group(s) that is (are) selected will determine if the first group is embedded or attached to the second group.

As described herein, compounds of the disclosure may contain "optionally substituted" moieties. In general, the term "substituted," whether preceded by the term "optionally" or not, means that one or more hydrogens of the designated moiety are replaced with a suitable substituent. Unless otherwise indicated, an "optionally substituted" group may have a suitable substituent at each substitutable position of the group, and when more than one position in any given structure may be substituted with more than one substituent selected from a specified group, the substituent may be either the same or different at every position. Combinations of substituents envisioned by this disclosure are preferably those that result in the formation of stable or chemically feasible compounds. It is also contemplated that, in certain aspects, unless expressly indicated to the contrary, individual substituents can be further optionally substituted (i.e., further substituted or unsubstituted).

In some aspects, a structure of a compound can be represented by a formula:

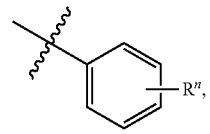

which is understood to be equivalent to a formula:

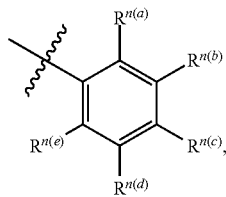

wherein n is typically an integer. That is, R is understood to represent five independent substituents, $R^{n(a)}$, $R^{n(b)}$, $R^{n(c)}$, $R^{n(d)}$, $R^{n(e)}$. By "independent substituents," it is meant that each R substituent can be independently defined. For example, if in one instance $R^{n(a)}$ is halogen, then $R^{n(b)}$ is not necessarily halogen in that instance.

Several references to R, $R^1$, $R^2$, $R^3$, $R^4$, $R^5$, $R^6$, etc. are made in chemical structures and moieties disclosed and described herein. Any description of R, $R^1$, $R^2$, $R^3$, $R^4$, $R^5$, $R^6$, etc. in the specification is applicable to any structure or moiety reciting R, $R^1$, $R^2$, $R^3$, $R^4$, $R^5$, $R^6$, etc. respectively.

Phosphorescent/MADF emitters may b used for efficient exciton harvesting while emitting primarily from horizontally aligned and stable fluorescent emitters in order to enhance the device efficiency and device operational lifetime. To achieve this, both phosphorescent/MADF emitters and fluorescent emitters must be present in the EML and energy transfer between the MADF and fluorescent materials is necessary. Two major mechanisms to exciton transport exist, namely the Dexter energy transfer and Forster resonant energy transfer (FRET) mechanisms. The former is a short range transport which consists of consecutive hopping of excitons between neighboring molecules which depends on the orbital overlap between the molecules. The latter is a long range transport process in which dipole coupling between an excited donor molecule (D) and a ground state acceptor molecule (A) leads to a long range non-radiative transfer. This process depends on the overlap between the emission profile of D and the absorption of A. This transfer mechanism necessitates and allowed relaxation transition of the donor molecule and an allowed excitation mechanism of the acceptor molecules, thus, FRET typically occurs between singlet excitons. However, if the phosphorescent emission process of the donor molecule is efficient, transfer between the triplet of the donor molecule and the singlet of the acceptor molecule is also possible.

Figure 2:
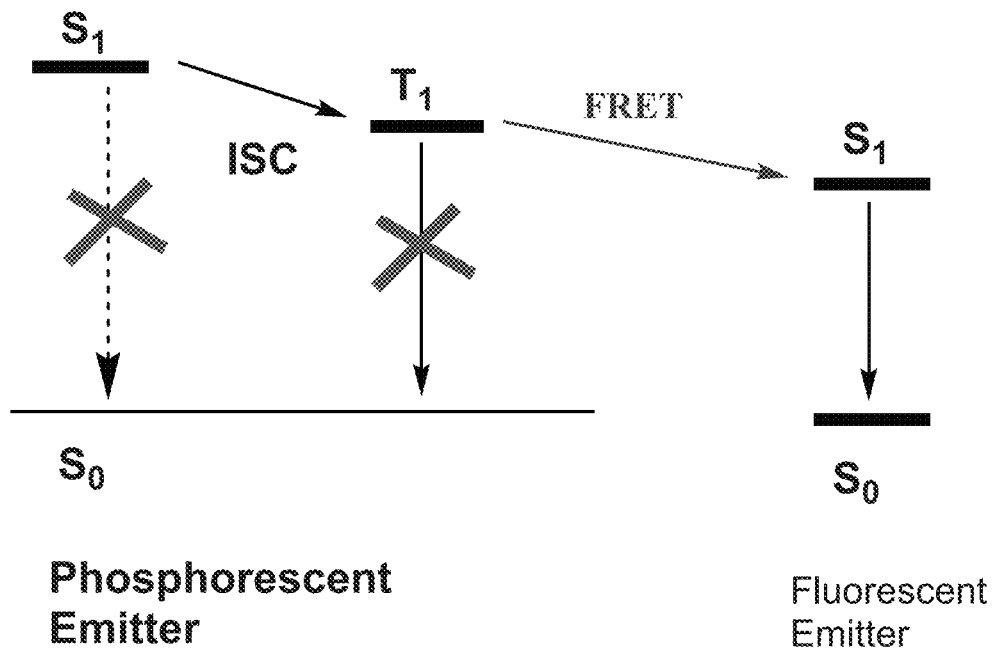
FIG. 2 is a diagram of the energy transfer process inside of emissive layer for the proposed OLEDs with phosphorescent emitter as donor and fluorescent emitter as acceptor.
Figure 3:
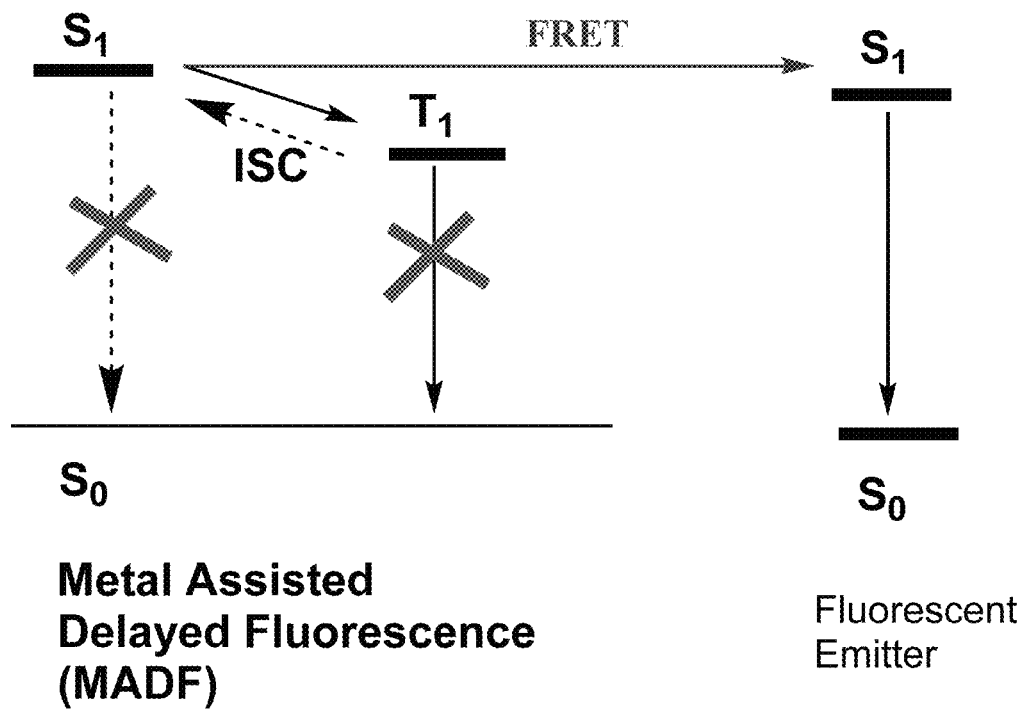
FIG. 3 is a diagram of the energy transfer process inside of emissive layer for the proposed phosphorescent OLEDs with MADF emitter as donor and fluorescent emitter as acceptor.

The stability and efficiency of blue phosphorescent OLEDs has remained as a great technical challenge for OLED displays and lighting applications. Thus, alternate solution will be to improve the device efficiency of blue fluorescent OLED with better device stability. As illustrated in FIG. 2 and FIG. 3, a process can be envisioned in which all the excitons are formed on a phosphorescent/MADF donor material which can then transfer via FRET to a fluorescent acceptor material and emit with high efficiency. Such a process would maintain the 100% utilization of electrogenerated excitons while emitting primarily from the fluorescent emitter to achieve high stability and avoid triplet-triplet annihilation. Moreover, horizontally oriented fluorescent emitters will enable a potentially high outcoupling efficiency and improve the device efficiency. As an added benefit, the color quality of EL spectra of devices will also improve if the emission originated solely from the narrow band fluorescent emitters.

This can be achieved by harvesting the electrogenerated excitons with a phosphorescent material then transferring the energy to a fluorescent emitter through a FRET mechanism. There are at least two methods of creating such a system: 1) a single emissive layer containing both the phosphorescent/MADF emitter and the fluorescent emitter doped into a host matrix and 2) an emissive layer containing alternating fluorescent and phosphorescent/MADF doped layers, which are presented in FIG. 4 and FIG. 5, respectively. In either case some constraints in the materials selection exist. Firstly, the emission spectrum of the phosphorescent/MADF donor should be selected to have significant spectral overlap with the absorption spectrum of the fluorescent emitter in order for the FRET process to occur. Additionally, the photoluminescent quantum yield of the phosphorescent/MADF material should be high enough to ensure that the dipole relaxation in the FRET process can occur with high efficiency. Similarly, the photoluminescent quantum yield of the fluorescent emitter should be high enough to ensure efficient emission. Thirdly, the fluorescent emitters will have preferred horizontally oriented emitting dipoles inside of the emissive layer.

Figure 4:
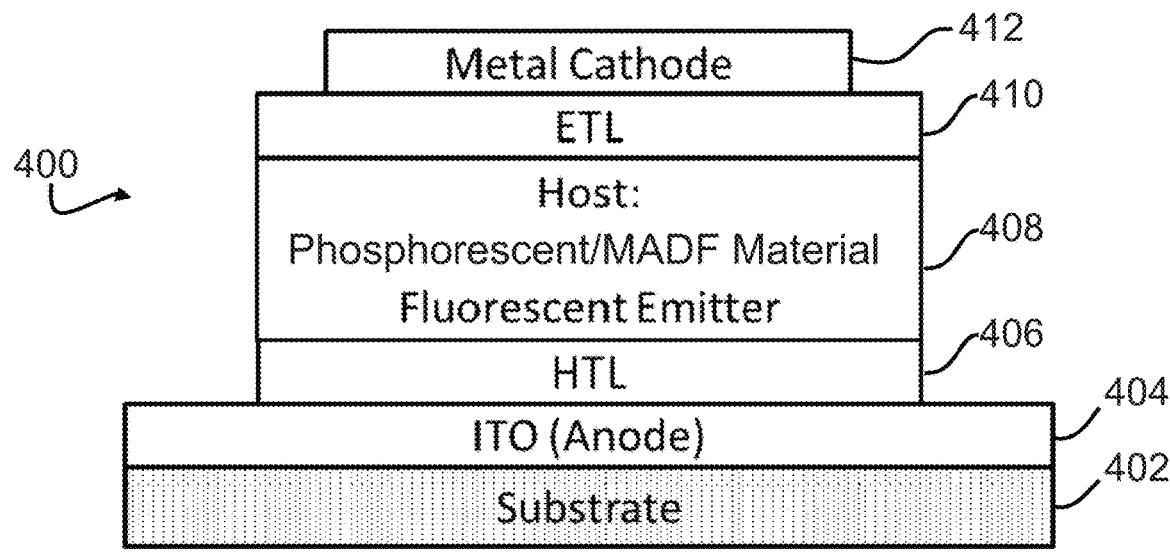
FIG. 4 is a schematic diagram of an exemplary light emitting device structure comprising a mixed layer of a phosphorescent/MADF donor material and a fluorescent emitter within a host matrix.

The first case, FIG. 4, is composed of an OLED device which contains an emissive layer which is composed of a mixed layer of a phosphorescent/MADF donor material and a fluorescent emitter dispersed within a host matrix. In such a case where both the phosphorescent/MADF and fluorescent materials exist within the same layer, care must be taken to avoid direct formation of excitons on the fluorescent emitter (which can only harvest singlet excitons) to ensure that 100% of the electrogenerated excitons are utilized. On the other hand, the concentration of the fluorescent emitter must be high enough for there to close proximity between the phosphorescent/MADF material and the fluorescent emitter so that rapid transfer from the MADF donor to the fluorescent emitter can be achieved and direct triplet emission or triplet-triplet annihilation can be avoided.

Figure 5:
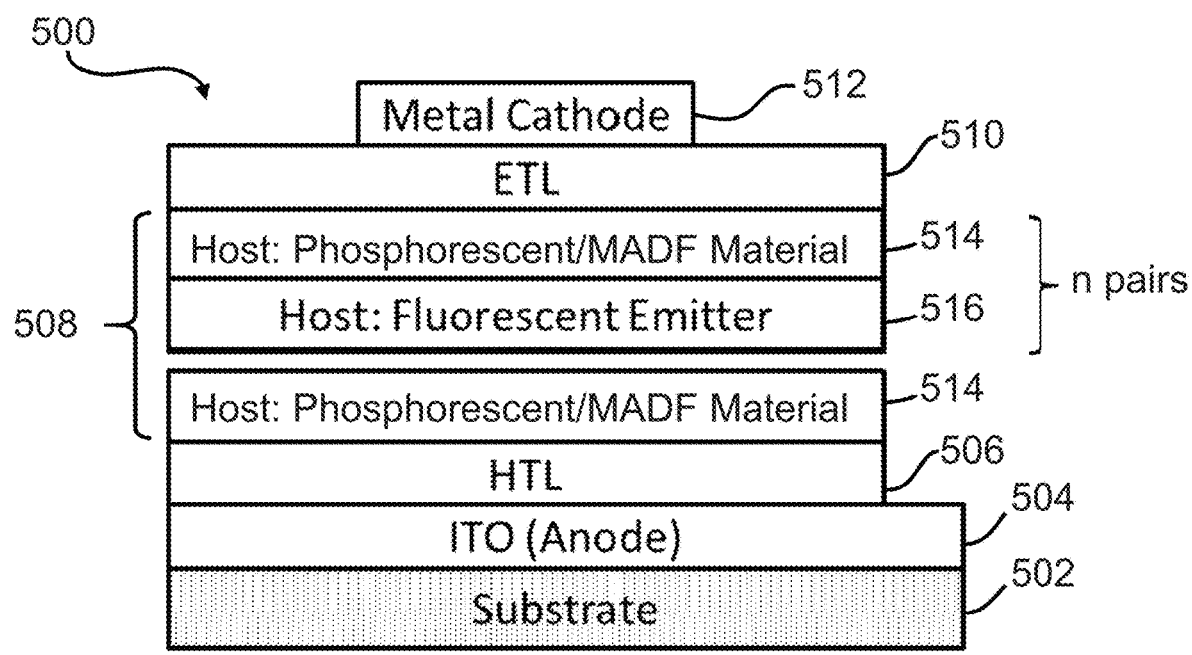
FIG. 5 is a schematic diagram of an exemplary light emitting device structure comprising alternating fluorescent and phosphorescent/MADF doped layers.

The second case, FIG. 5, is composed of an OLED device which contains an emissive layer with alternating fluorescent and phosphorescent/MADF doped layers. In such a case the thickness and location of the layers must be tuned to ensure that exciton formation primarily occurs in the region which is doped with the phosphorescent/MADF material. Furthermore, the region which contains the fluorescent doped layer should be close enough to the exciton formation zone so that the fluorescent emitters are within the distance for FRET to occur.

Figure 6A:
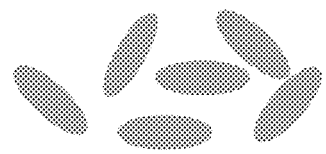
FIGS. 6A to 6C depict the benefit of horizontal dipole orientation.
Figure 6B:
Figure 6C:
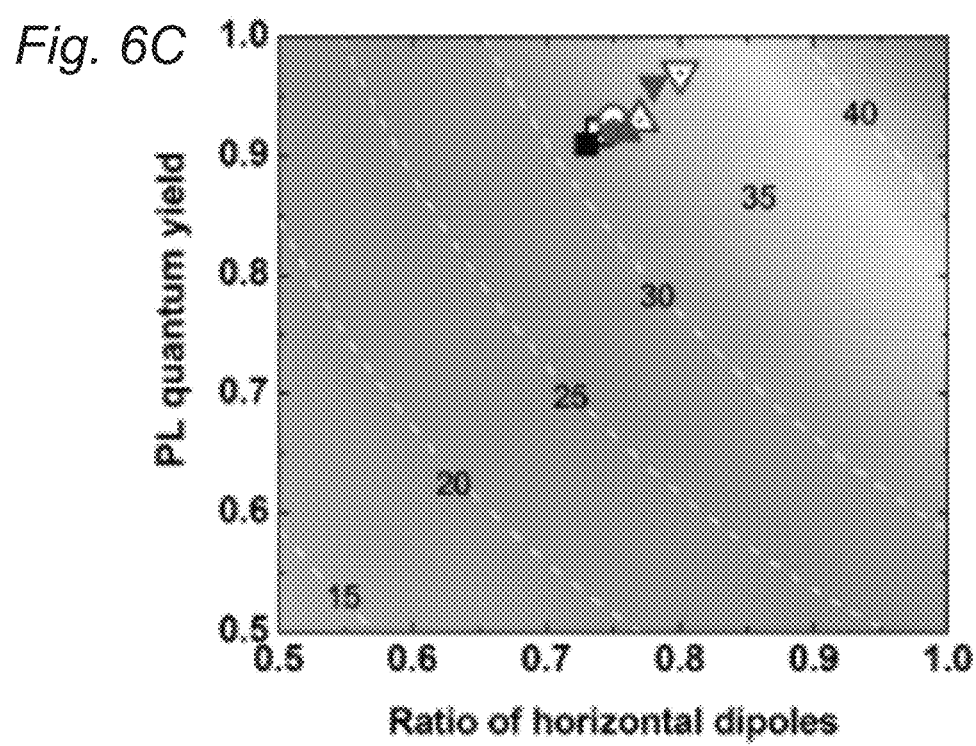
Figure 7A:
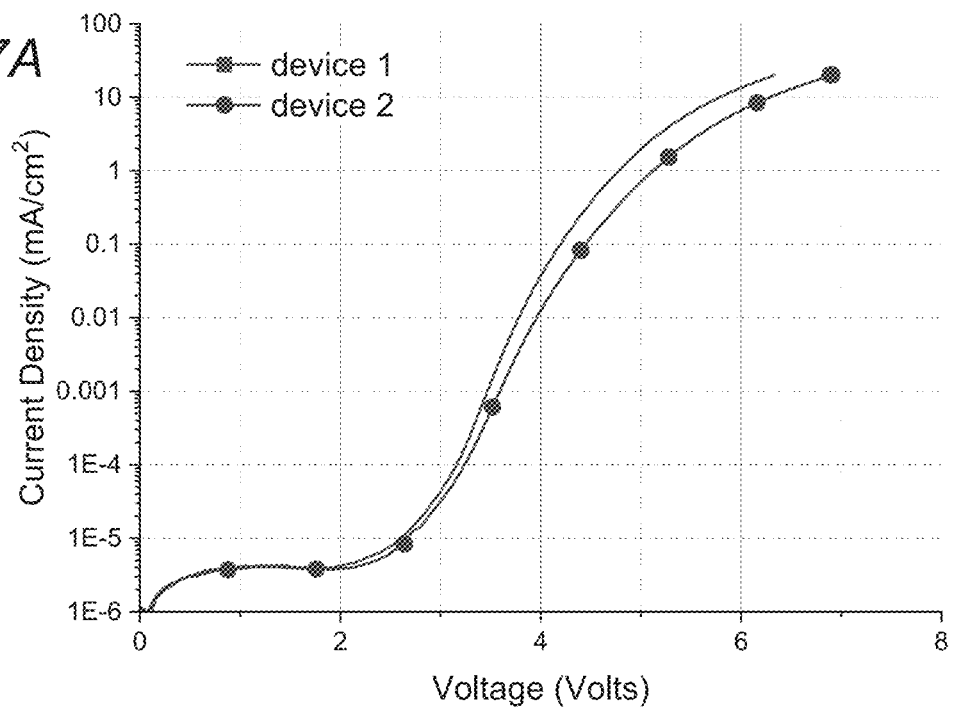
FIGS. 7A to 7C present data for an exemplary organic light emitting device with a general device structure of ITO/HATCN/NPD/Tris-PCz/EML/mCBT/BPyTP/LiF/Al, where EMLs are (1) 20% PtNON:mCBP (5 nm)/10% PtNON:mCBP (5 nm)/5% PtNON:mCBP (5 nm); (2) 20% PtNON:mCBP (5 nm)/2% DABNA-2:mCBP (2 nm)/10%/ PtNON:mCBP (5 nm)/2% DABNA-2:mCBP (2 nm)/5% PtNON:mCBP (5 nm).
Figure 7B:
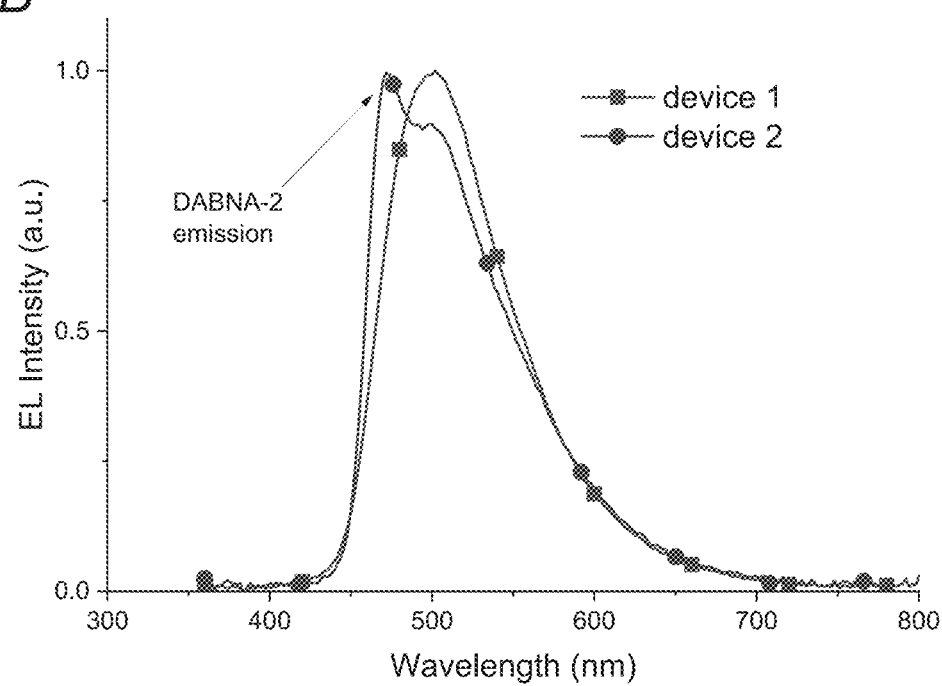
Figure 7C:
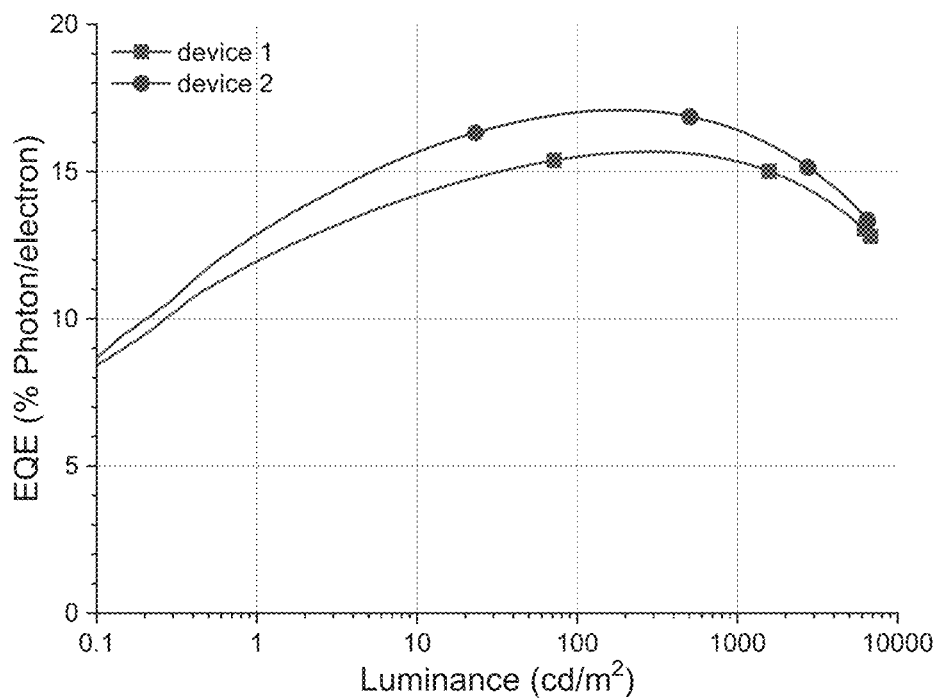

A typical EQE of OLEDs on a standard glass substrate is limited to 20-30% if the emitting dipoles or emitters are randomly oriented (FIG. 6A). However, the device EQE could be improved to 45% (FIG. 6C) if there are 100% horizontally oriented emitting dipoles in the emissive layer (FIG. 6B), which simultaneously suppress the plasmonic quenching process and enhance ratio of photons trapped in the substrate, capable of being extracted by microlens or macroextractors for illumination purpose.

Compounds

Owing to the potential of phosphorescent tetradentate platinum complexes for harvesting both electro-generated singlet and triplet excitons to achieve 100% internal quantum efficiency, these complexes are good candidates for the emitting materials of OLEDs. In some embodiments, there is an "emitting portion" and an "ancillary portion" in a ligand of platinum complex (e.g., a tetradentate platinum complex). If stabilizing substitution(s), such as conjugated group(s), aryl or heteroaromatic substitution(s) and so on, were introduced into the emitting portion, the "Highest Occupied Molecular Orbital" (HOMO) energy level, the "Lowest Unoccupied Molecular Orbital" (LUMO) energy level, or both may be changed. Accordingly, in some embodiments the energy gap between the HOMO and LUMO can be tuned. Thus, the emission spectra of phosphorescent tetradentate platinum complexes can be modified to lesser or greater extents, such that the emission spectra can become narrower or broader, such that the emission spectra can exhibit a blue shift or a red shift, or a combination thereof.

The emission of the disclosed complexes can be tuned, for example, from the ultraviolet to near-infrared, by, for example, modifying the ligand structure. In another aspect, the disclosed complexes can provide emission over a majority of the visible spectrum. In one embodiment, the disclosed complexes can emit light over a range of from about 400 nm to about 700 nm. In another aspect, the disclosed complexes have improved stability and efficiency over traditional emission complexes. In yet another aspect, the disclosed complexes can be useful as luminescent labels in, for example, bio-applications, anti-cancer agents, emitters in organic light emitting devices (OLED), or a combination thereof. In another aspect, the disclosed complexes can be useful in light emitting devices, such as, for example, compact fluorescent lamps (CFL), light emitting diodes (LED), incandescent lamps, and combinations thereof.

The compounds can also have other known emission mechanisms which are useful in devices.

Disclosed herein are compounds or compound complexes comprising platinum and/or palladium. The terms compound, complex, or combinations thereof, are used interchangeably herein. In one aspect, the compounds disclosed herein have a neutral charge.

The compounds disclosed herein can exhibit desirable properties and have emission spectra, absorption spectra, or both that can be tuned via the selection of appropriate ligands. In another aspect, the present disclosure can exclude any one or more of the compounds, structures, or portions thereof, specifically recited herein.

The compounds disclosed herein are suited for use in a wide variety of optical and electro-optical devices, including, but not limited to, photo-absorbing devices such as solar- and photo-sensitive devices, organic light emitting devices (OLEDs), photo-emitting devices, or devices capable of both photo-absorption and emission and as markers for bio-applications.

As briefly described above, the disclosed compounds are platinum and/or palladium complexes. In one aspect, the compounds disclosed herein can be used as host materials for OLED applications, such as full color displays.

The compounds disclosed herein are useful in a variety of applications. As light emitting materials, the compounds can be useful in organic light emitting devices (OLEDs), luminescent devices and displays, and other light emitting devices.

In another aspect, the compounds can provide improved efficiency, improved operational lifetimes, or both in lighting devices, such as, for example, organic light emitting devices, as compared to conventional materials.

The compounds of the disclosure can be made using a variety of methods, including, but not limited to those recited in the examples provided herein.

Compounds

In one aspect, the present disclosure relates to compounds having the formula

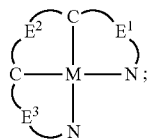

wherein M is a metal cation with two positive charges selected from Pt (II) or Pd (II);

wherein $E^1$, $E^2$, and $E^3$ independently is a linking group comprising O, $NR^2$, $CR^2R^3$, S, $AsR^2$, $BR^2$, $PR^2$, $P(O)R^2$, or $SiR^2R^3$, or a combination thereof, wherein each of $R^2$ and $R^3$ independently is hydrogen, alkyl, alkenyl, alkynyl, aryl, heteroaryl, cycloalkane, cycloalkane, heterocyclyl, amino, hydroxyl, halogen, thio, alkoxy, haloalkyl, arylalkane, or arylalkene, or $R^2$ and $R^3$ together form C=O, wherein each of $R^2$ and $R^3$ independently is optionally linked to a C or N, thereby forming a cyclic structure;

wherein each C independently is selected from a substituted or unsubstituted aromatic ring or heterocyclic group wherein a carbon atom is coordinated to the metal; and wherein each N independently is selected from a substituted or unsubstituted heterocyclic group wherein a nitrogen atom coordinated to the metal.

In another aspect, the present disclosure relates to compounds having the formula

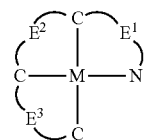

wherein M is a metal cation with three positive charges selected from Au (III) or Ag (III);

wherein $E^1$, $E^2$, and $E^3$ independently is a linking group comprising O, $NR^2$, $CR^2R^3$, S, $AsR^2$, $BR^2$, $PR^2$, $P(O)R^2$, or $SiR^2R^3$, or a combination thereof, wherein each of $R^2$ and $R^3$ independently is hydrogen, alkyl, alkenyl, alkynyl, aryl, heteroaryl, cycloalkane, cycloalkane, heterocyclyl, amino, hydroxyl, halogen, thio, alkoxy, haloalkyl, arylalkane, or arylalkene, or $R^2$ and $R^3$ together form C=O, wherein each of $R^2$ and $R^3$ independently is optionally linked to a C or N, thereby forming a cyclic structure;

wherein each C independently is selected from a substituted or unsubstituted aromatic ring or heterocyclic group, wherein a carbon atom is coordinated to the metal; and wherein N is selected from a substituted or unsubstituted heterocyclic group wherein a nitrogen atom coordinated to the metal.

In another aspect, the present disclosure relates to compounds having the formula

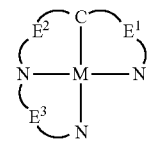

wherein M is a metal cation with one positive charges selected from Ir (I) or Rh (I), wherein $E^1$, $E^2$, and $E^3$ independently represent a linking group comprising O, $NR^2$, $CR^2R^3$, S, $AsR^2$, $BR^2$, $PR^2$, $P(O)R^2$, or $SiR^2R^3$, or a combination thereof, wherein each of $R^2$ and $R^3$ independently is hydrogen, alkyl, alkenyl, alkynyl, aryl, heteroaryl, cycloalkane, cycloalkane, heterocyclyl, amino, hydroxyl, halogen, thio, alkoxy, haloalkyl, arylalkane, arylalkene, or $R^2$ and $R^3$ together form C=O, wherein each of $R^2$ and $R^3$ independently is optionally linked to a C or N, thereby forming a cyclic structure;

wherein C is selected from a substituted or unsubstituted aromatic ring or heterocyclic group, wherein a carbon atom is coordinated to the metal; and wherein each N independently is selected from a substituted or unsubstituted heterocyclic group wherein a nitrogen atom is coordinated to the metal.

In another aspect, the present disclosure relates to compounds having the formula

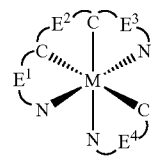

wherein M is a metal cation with three positive charges selected from Ir (III), Rh (III), Co (III), Al (III), or Ga (III), wherein $E^1$, $E^2$, $E^3$, and $E^4$ independently is a linking group comprising O, $NR^2$, $CR^2R^3$, S, $AsR^2$, $BR^2$, $PR^2$, $P(O)R^2$, or $SiR^2R^3$, or a combination thereof, wherein each of $R^2$ and $R^3$ independently is hydrogen, alkyl, alkenyl, alkynyl, aryl, heteroaryl, cycloalkane, cycloalkane, heterocyclyl, amino, hydroxyl, halogen, thio, alkoxy, haloalkyl, arylalkane, arylalkene, or $R^2$ and $R^3$ together form C=O, wherein each of $R^2$ and $R^3$ independently is optionally linked to a C or N, thereby forming a cyclic structure;

wherein each C independently is selected from a substituted or unsubstituted aromatic ring or heterocyclic group, wherein a carbon atom is coordinated to the metal; and wherein each N independently is selected from a substituted or unsubstituted heterocyclic group, wherein a nitrogen atom coordinated to the metal.

In another aspect, the present disclosure relates to compounds having the formula

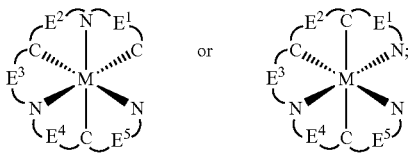

wherein M is a metal cation with three positive charges selected from Ir (III), Rh (III), Co (III), Al (III), or Ga (III);

wherein $E^1$, $E^2$, $E^3$, $E^4$, and $E^5$ independently is a linking group comprising O, $NR^2$, $CR^2R^3$, S, $AsR^2$, $BR^2$, $PR^2$, $P(O)R^2$, or $SiR^2R^3$, or a combination thereof, wherein each of $R^2$ and $R^3$ independently is hydrogen, alkyl, alkenyl, alkynyl, aryl, heteroaryl, cycloalkane, cycloalkane, heterocyclyl, amino, hydroxyl, halogen, thio, alkoxy, haloalkyl, arylalkane, arylalkene, or $R^2$ and $R^3$ together form C=O, wherein each of $R^2$ and $R^3$ independently is optionally linked to a C or N, thereby forming a cyclic structure;

wherein each C independently is selected from a substituted or unsubstituted aromatic ring or heterocyclic group, wherein a carbon atom is coordinated to the metal; and wherein each N independently is selected from a substituted or unsubstituted heterocyclic group, wherein a nitrogen atom coordinated to the metal.

In another aspect, the present disclosure relates to compounds having the formula

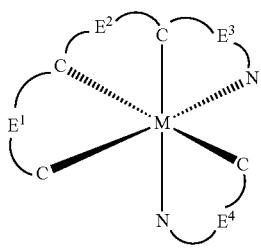

wherein M is a metal cation with four positive charges selected from Pd (IV) and Pt (IV);

wherein $E^1$, $E^2$, $E^3$, and $E^4$ independently is a linking group comprising O, $NR^2$, $CR^2R^3$, S, $AsR^2$, $BR^2$, $PR^2$, $P(O)R^2$, or $SiR^2R^3$, or a combination thereof, wherein each of $R^2$ and $R^3$ independently is hydrogen, alkyl, alkenyl, alkynyl, aryl, heteroaryl, cycloalkane, cycloalkane, heterocyclyl, amino, hydroxyl, halogen, thio, alkoxy, haloalkyl, arylalkane, arylalkene, or $R^2$ and $R^3$ together form C=O, wherein each of $R^2$ and $R^3$ independently is optionally linked to a C or N, thereby forming a cyclic structure;

wherein each C independently is selected from a substituted or unsubstituted aromatic ring or heterocyclic group, wherein a carbon atom is coordinated to the metal; and wherein each N independently is selected from a substituted or unsubstituted heterocyclic group, wherein a nitrogen atom coordinated to the metal.

In another aspect, the present disclosure relates to compounds having the formula

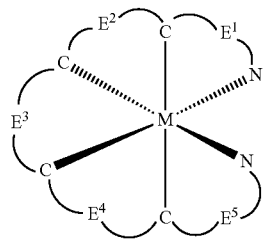

where M is a metal cation with four positive charges selected from Pd (IV) and Pt(IV), wherein $E^1$, $E^2$, $E^3$, $E^4$, and $E^5$ independently is a linking group comprising O, $NR^2$, $CR^2R^3$, S, $AsR^2$, $BR^2$, $PR^2$, $P(O)R^2$, or $SiR^2R^3$, or a combination thereof, wherein each of $R^2$ and $R^3$ independently is hydrogen, alkyl, alkenyl, alkynyl, aryl, heteroaryl, cycloalkane, cycloalkane, heterocyclyl, amino, hydroxyl, halogen, thio, alkoxy, haloalkyl, arylalkane, arylalkene, or $R^2$ and $R^3$ together form C=O, wherein each of $R^2$ and $R^3$ independently is optionally linked to a C or N, thereby forming a cyclic structure;

wherein each C independently is selected from a substituted or unsubstituted aromatic ring or heterocyclic group, wherein a carbon atom is coordinated to the metal; and wherein each N independently is selected from a substituted or unsubstituted heterocyclic group, wherein a nitrogen atom coordinated to the metal.

In another aspect, the present disclosure relates to compounds having the formula

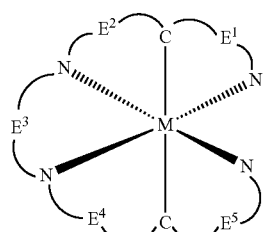

wherein M is a metal cation with two positive charges selected from Ru (II), or Os (II);

wherein $E^1$, $E^2$, $E^3$, $E^4$, and $E^5$ independently is a linking group comprising O, $NR^2$, $CR^2R^3$, S, $AsR^2$, $BR^2$, $PR^2$, $P(O)R^2$, or $SiR^2R^3$, or a combination thereof, wherein each of $R^2$ and $R^3$ independently is hydrogen, alkyl, alkenyl, alkynyl, aryl, heteroaryl, cycloalkane, cycloalkane, heterocyclyl, amino, hydroxyl, halogen, thio, alkoxy, haloalkyl, arylalkane, arylalkene, or $R^2$ and $R^3$ together form C=O, wherein each of $R^2$ and $R^3$ independently is optionally linked to a C or N, thereby forming a cyclic structure;

wherein each C independently is selected from a substituted or unsubstituted aromatic ring or heterocyclic group, wherein a carbon atom is coordinated to the metal; and wherein each N independently is selected from a substituted or unsubstituted heterocyclic group, wherein a nitrogen atom coordinated to the metal.

In another aspect, the present disclosure relates to compounds having the formula

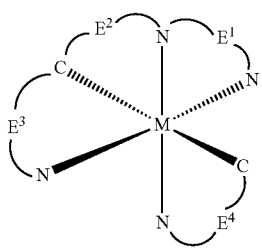

wherein M is a metal cation with two positive charges selected from Ru (II), or Os (II);

wherein $E^1$, $E^2$, $E^3$, and $E^4$ independently is a linking group comprising O, $NR^2$, $CR^2R^3$, S, $AsR^2$, $BR^2$, $PR^2$, $P(O)R^2$, or $SiR^2R^3$, or a combination thereof, wherein each of $R^2$ and $R^3$ independently is hydrogen, alkyl, alkenyl, alkynyl, aryl, heteroaryl, cycloalkane, cycloalkane, heterocyclyl, amino, hydroxyl, halogen, thio, alkoxy, haloalkyl, arylalkane, arylalkene, or $R^2$ and $R^3$ together form C=O, wherein each of $R^2$ and $R^3$ independently is optionally linked to a C or N, thereby forming a cyclic structure;

wherein each C independently is selected from a substituted or unsubstituted aromatic ring or heterocyclic group, wherein a carbon atom is coordinated to the metal; and wherein each N independently is selected from a substituted or unsubstituted heterocyclic group, wherein a nitrogen atom is coordinated to the metal.

In one aspect, the present disclosure relates to compounds having the structure of Formula I or Formula II:

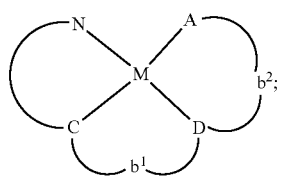

Formula I

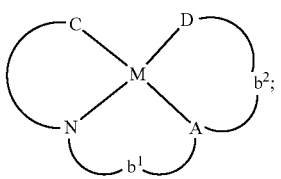

Formula II wherein A is an accepting group comprising one or more of the following structures, which can optionally be substituted:

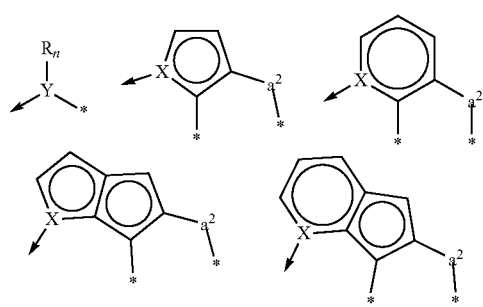
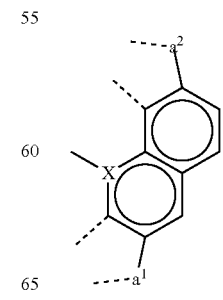
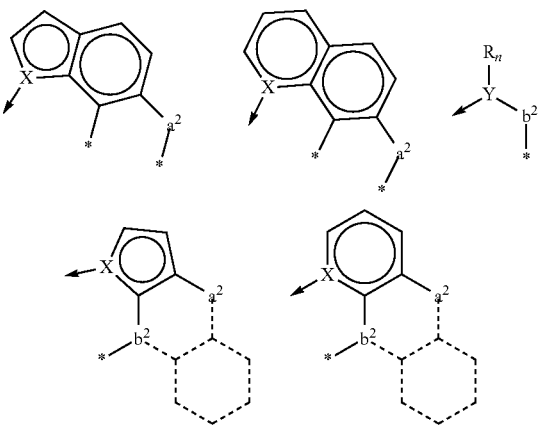

wherein D is a donor group comprising of one or more of the following structures, which can optionally be substituted:

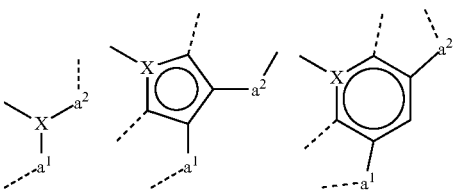
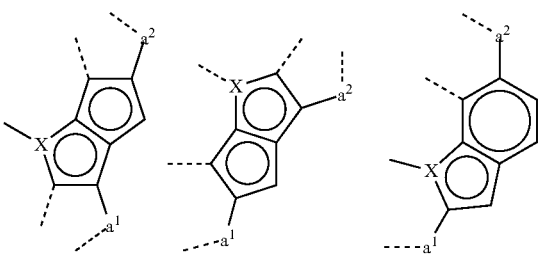
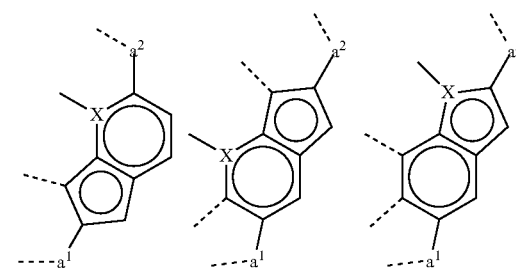
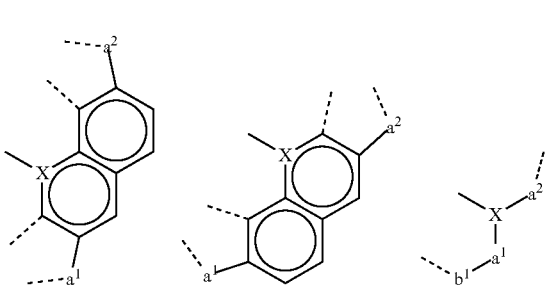

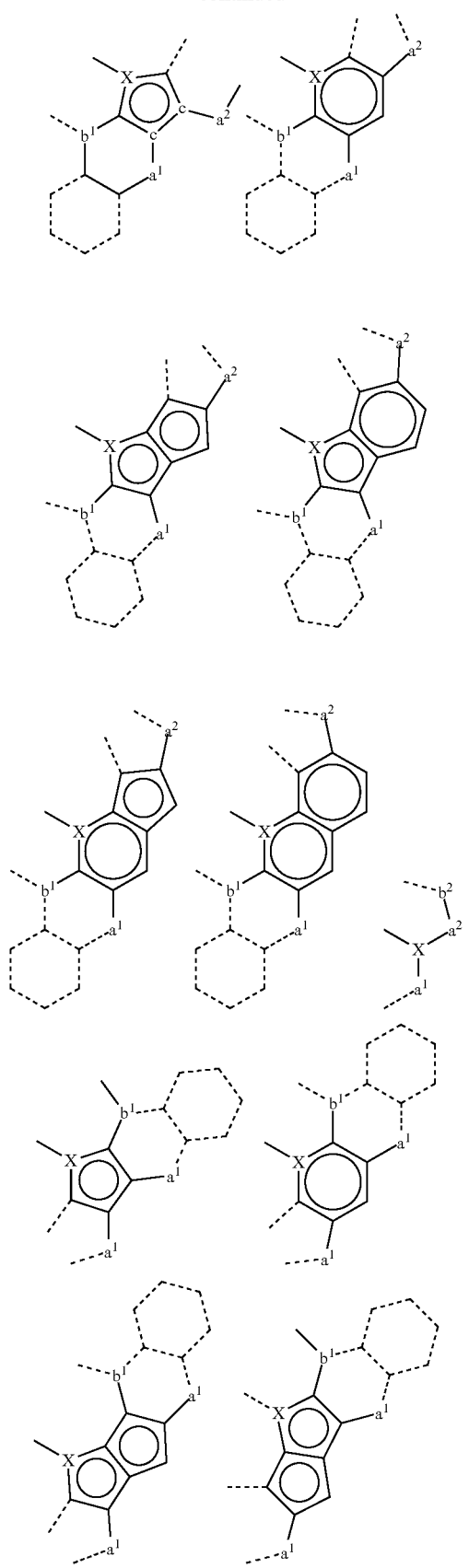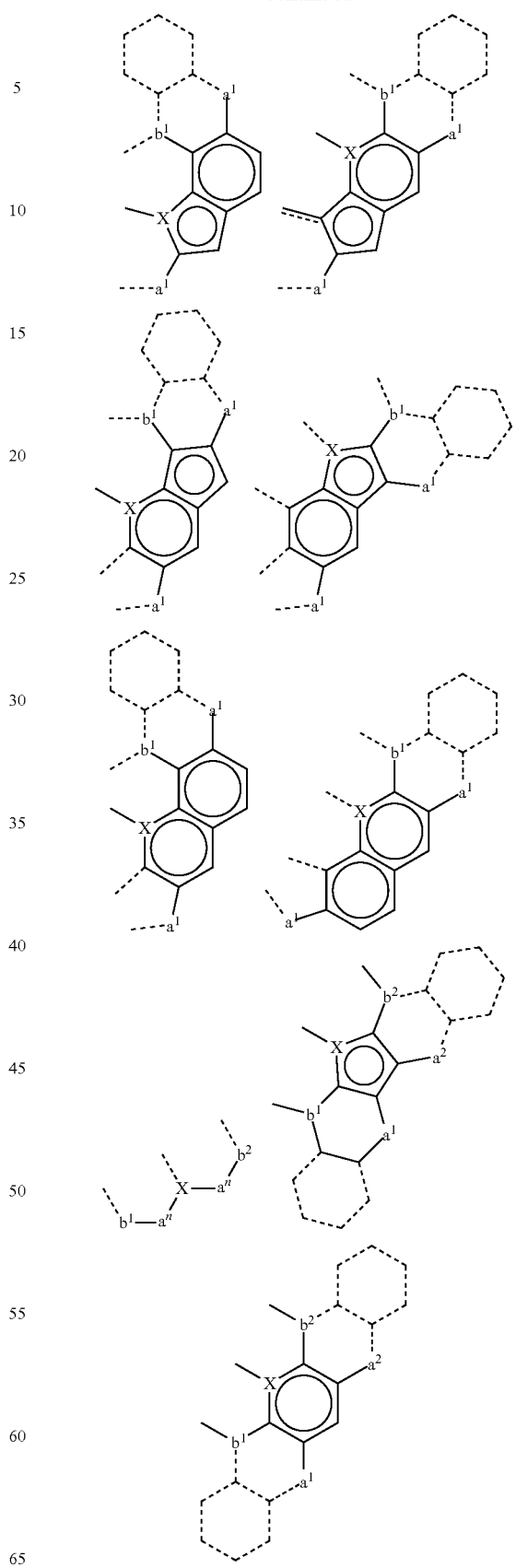

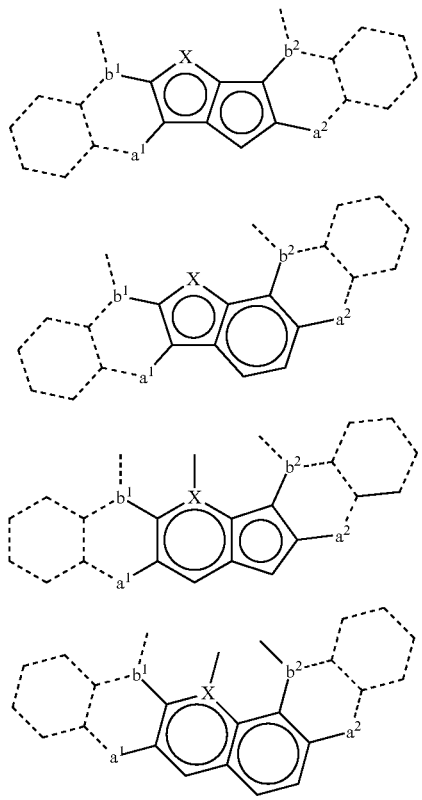
wherein C in Formula I or Formula II comprises one or more of the following structures, which can optionally be substituted:
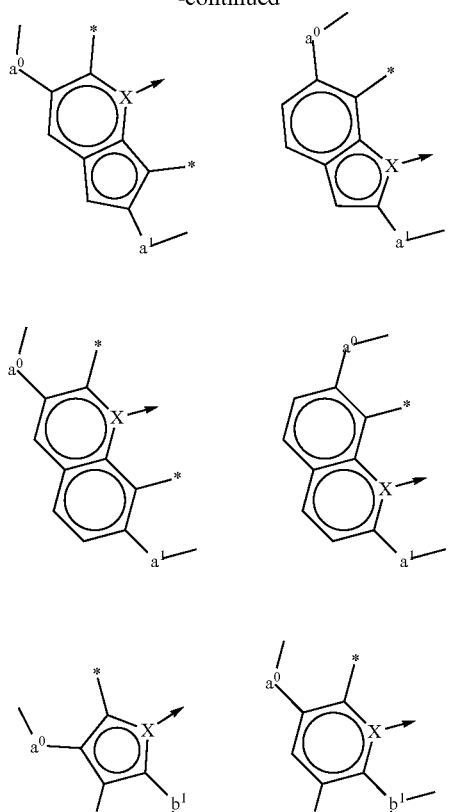
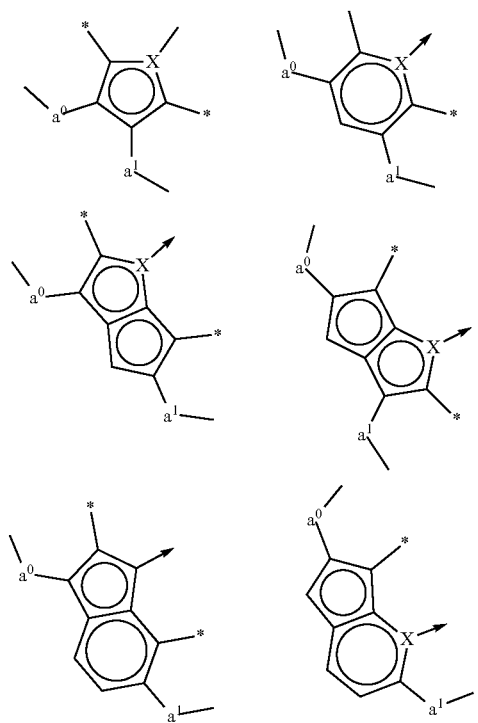
wherein N in Formula I or II comprises one or more of the following structures, which can optionally be substituted:

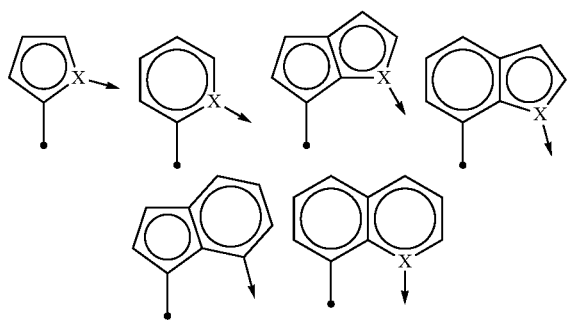

wherein each of $a^0$, $a^1$, and $a^2$ independently is present or absent, and if present, comprises a direct bond and/or linking group comprising one or more of the following:

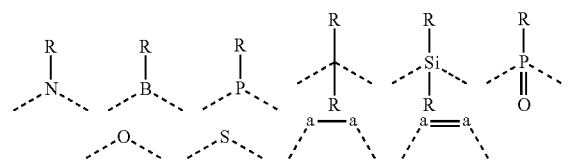

wherein each occurrence of a is independently substituted or unsubstituted N or substituted or unsubstituted C;

wherein $b^1$ and $b^2$ independently is present or absent, and if present, comprises a linking group comprising one or more of the following:

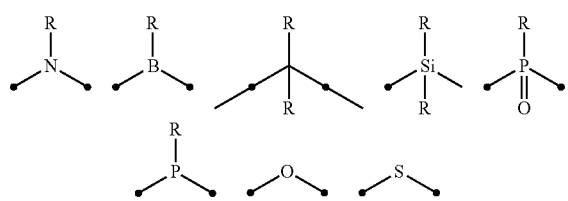

wherein each occurrence of X is independently B, C, N, O, Si, P, S, Ge, As, Se, Sn, Sb, or Te;

wherein Y is O, S, S=O, $SO_2$, Se, N, $NR^3$, $PR^3$, RP=O, $CR^1R^2$, C=O, $SiR^1R^2$, $GeR^1R^2$, BH, P(O)H, PH, NH, $CR^1H$, $CH_2$, $SiH_2$, $SiHR^1$, BH, or $BR_3$, wherein each of R, $R^1$, $R^2$, and $R^3$ independently is hydrogen, aryl, cycloalkyl, cycloalkenyl, heterocyclyl, heteroaryl, alkyl, alkenyl, alkynyl, deuterium, halogen, hydroxyl, thiol, nitro, cyano, amino, a mono- or di-alkylamino, a mono- or diaryl amino, alkoxy, aryloxy, haloalkyl, aralkyl, ester, nitrile, isonitrile, alkoxycarbonyl, acylamino, alkoxycarbonylamino, aryloxycarbonylamino, sulfonylamino, sulfamoyl, carbamoyl, alkylthio, sulfinyl, ureido, phosphoramide, mercapto, sulfo, carboxyl, hydrazino, substituted silyl, or polymerizable, or any conjugate or combination thereof, wherein n is a number that satisfies the valency of Y; and wherein M is platinum (II), palladium (II), nickel (II), manganese (II), zinc (II), gold (III), silver (III), copper (III), iridium (I), rhodium (I), and/or cobalt (I).

In one embodiment, $a^2$ is absent in Formula I. In one embodiment, $a^2$ and $b^2$ are absent in Formula I or Formula II.

In one embodiment, X is N.

In one embodiment, A is

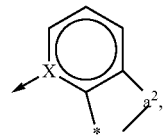

$a^2$ is absent, $b^2$ are absent, and D is

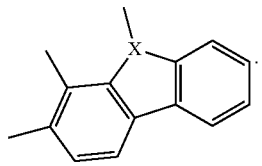

In one embodiment, C in Formula I or Formula II is

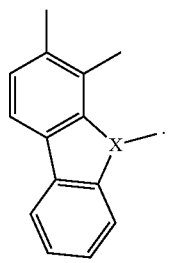

In one embodiment, N in Formula I or Formula II is substituted or unsubstituted

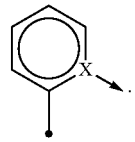

In one embodiment, the compound having Formula I or Formula II is a compound having Formula III;

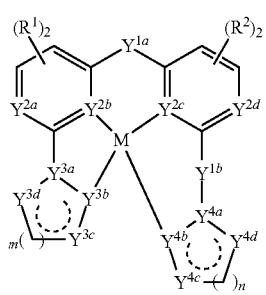

Formula III wherein M is Ir, Rh, Mn, Ni, Cu, or Ag;

wherein each of $R^1$ and $R^2$ independently are hydrogen, substituted or unsubstituted alkyl, alkenyl, alkynyl, aryl, heteroaryl, cycloalkane, cycloalkane, heterocyclyl, amino, nitro hydroxyl, halogen, thio, alkoxy, haloalkyl, arylalkane, or arylalkene;

wherein each of $Y^{1a}$ and $Y^{1b}$ independently is O, $NR^2$, $CR^2R^3$, S, $AsR^2$, $BR^2$, $PR^2$, $P(O)R^2$, or $SiR^2R^3$, or a combination thereof, wherein each of $R^2$ and $R^3$ independently is hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, arylalkene, or $R^2$ and $R^3$ together form C=O, wherein each of $R^2$ and $R^3$ independently is optionally linked to an adjacent ring structure, thereby forming a cyclic structure;

wherein each of $Y^{2a}$, $Y^{2b}$, $Y^{2c}$, and $Y^{2d}$ independently is N or $CR^{6a}$, wherein $R^{6a}$ is hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, or arylalkene;

each of $Y^{3a}$, $Y^{3b}$, $Y^{3c}$, $Y^{3d}$, $Y^{4a}$, $Y^{4b}$, $Y^{4c}$, and $Y^{4d}$ independently is N, O, S, $NR^{6a}$, $CR^{6b}$, or $Z(R^{6c})_2$, wherein each of $R^{6a}$ and $R^{6b}$ is independently hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, or arylalkene; wherein Z is C or Si, and wherein each $R^{6c}$ independently is hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, or arylalkene;

wherein each of m and n independently is an integer of 1 or 2; and wherein each of

independently is partial or full unsaturation of the ring with which it is associated.

In one embodiment, $Y^{2b}$ is C; $Y^{2c}$, $Y^{3b}$ and $Y^{4b}$ are N. In one embodiment, M is Ir or Rh.

In one embodiment, the compound having Formula I or Formula II is a compound having Formula IV;

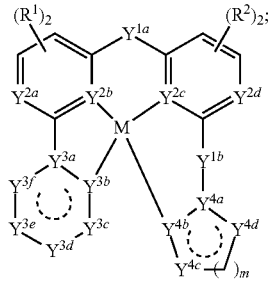

Formula IV wherein M is Pt, Pd and Au;

wherein each of $R^1$ and $R^2$ independently is hydrogen, substituted or unsubstituted alkyl, alkenyl, alkynyl, aryl, heteroaryl, cycloalkane, cycloalkane, heterocyclyl, amino, nitro hydroxyl, halogen, thio, alkoxy, haloalkyl, arylalkane, or arylalkene;

wherein each of $Y^{1a}$ and $Y^{1b}$ independently is O, $NR^2$, $CR^2R^3$, S, $AsR^2$, $BR^2$, $PR^2$, $P(O)R^2$, or $SiR^2R^3$, or a combination thereof, wherein each of $R^2$ and $R^3$ independently is hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, arylalkene, or $R^2$ and $R^3$ together form C=O, wherein each of $R^2$ and $R^3$ independently is optionally linked to an adjacent ring structure, thereby forming a cyclic structure;

wherein each of $Y^{2a}$, $Y^{2b}$, $Y^{2c}$, and $Y^{2d}$ independently is N or $CR^{6b}$, wherein $R^{6a}$ is hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, or arylalkene;

wherein each of $Y^{3a}$, $Y^{3b}$, $Y^{3c}$, $Y^{3d}$, $Y^{3e}$, $Y^{3f}$, $Y^{4a}$, $Y^{4b}$, $Y^{4c}$, and $Y^{4d}$ independently is N, O, S, $NR^{6a}$, $CR^{6b}$, or $Z(R^{6c})_2$, wherein each of $R^{6a}$ and $R^{6b}$ is independently hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, or arylalkene; wherein Z is C or Si, and wherein each $R^{6c}$ independently is hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, or arylalkene;

wherein each of m is an integer of 1 or 2; and wherein each of

independently is partial or full unsaturation of the ring with which it is associated.

In one embodiment, $Y^{2b}$ and $Y^{2c}$ is C. In one embodiment, $Y^{3b}$ and $Y^{4b}$ is N. In one embodiment, each of $Y^{1a}$ and $Y^{1b}$ independently is O, $NR^2$, $CR^2R^3$, S, $AsR^2$, $BR^2$, $PR^2$, $P(O)R^2$, or $SiR^2R^3$, or a combination thereof. In one embodiment, each of $R^2$ and $R^3$ independently is hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, arylalkene, or $R^2$ and $R^3$ together form C=O. In one embodiment, each of $R^2$ and $R^3$ independently is optionally linked to an adjacent ring structure, thereby forming a cyclic structure. In one embodiment, M is Pt or Pd.

In one embodiment, $Y^{2b}$, $Y^{2c}$ and $Y^{4b}$ is C. In one embodiment, $Y^{3b}$ is N. In one embodiment, each of $Y^{1a}$ and $Y^{1b}$ independently is O, $NR^2$, $CR^2R^3$, S, $AsR^2$, $BR^2$, $PR^2$, $P(O)R^2$, or $SiR^2R^3$, or a combination thereof. In one embodiment, each of $R^2$ and $R^3$ independently is hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, arylalkene, or $R^2$ and $R^1$ together form C=O. In one embodiment, each of $R^2$ and $R^3$ independently is optionally linked to an adjacent ring structure, thereby forming a cyclic structure. In one embodiment, M is Au.

In one embodiment, the compound having Formula I or Formula II is a compound having Formula V;

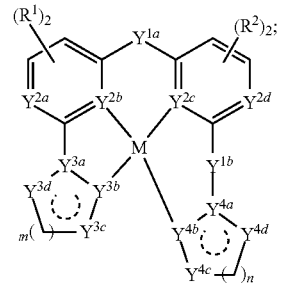

Formula V wherein M is Pt, Pd, Au, Ag;

wherein each of $R^1$ and $R^2$ independently are hydrogen, substituted or unsubstituted alkyl, alkenyl, alkynyl, aryl, heteroaryl, cycloalkane, cycloalkane, heterocyclyl, amino, nitro hydroxyl, halogen, thio, alkoxy, haloalkyl, arylalkane, or arylalkene;

wherein one of $Y^{1a}$ and $Y^{1b}$ is $B(R^2)_2$ and the other of $Y^{1a}$ and $Y^{1b}$ is O, $NR^2$, $CR^2R^3$, S, $AsR^2$, $BR^2$, $PR^2$, $P(O)R^2$, or $SiR^2R^3$, or a combination thereof, wherein each of $R^2$ and $R^3$ independently is hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, arylalkene, or $R^2$ and $R^3$ together form C=O, wherein each of $R^2$ and $R^3$ independently is optionally linked to an adjacent ring structure, thereby forming a cyclic structure;

wherein each of $Y^{2a}$, $Y^{2b}$, $Y^{2c}$, and $Y^{2d}$ independently is N or $CR^{6a}$, wherein $R^{6a}$ is hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, or arylalkene;

wherein each of $Y^{3a}$, $Y^{3b}$, $Y^{3c}$, $Y^{3d}$, $Y^{4a}$, $Y^{4b}$, $Y^{4c}$, and $Y^{4d}$ independently is N, O, S, $NR^{6a}$, $CR^{6b}$, or $Z(R^{6c})_2$, wherein each of $R^{6a}$ and $R^{6b}$ is independently hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, or arylalkene; wherein Z is C or Si, and wherein each $R^{6c}$ independently is hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, or arylalkene;

wherein each of m and n independently are an integer 1 or 2;

wherein each of

independently is partial or full unsaturation of the ring with which it is associated.

In one embodiment, the compound having Formula I or Formula II is a compound having Formula VI or Formula VIb

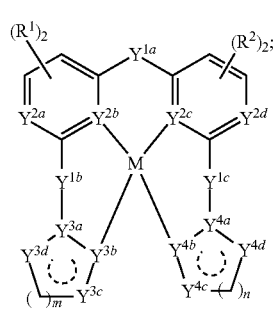

Formula VI

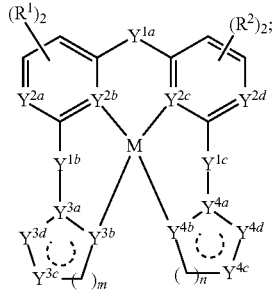

Formula VIb wherein M is Pt, Pd, Ir, Rh, or Au;

wherein each of $R^1$ and $R^2$ independently are hydrogen, substituted or unsubstituted alkyl, alkenyl, alkynyl, aryl, heteroaryl, cycloalkane, cycloalkane, heterocyclyl, amino, nitro hydroxyl, halogen, thio, alkoxy, haloalkyl, arylalkane, or arylalkene; wherein each of $Y^{1a}$, $Y^{1b}$, and $Y^{1c}$ independently is O, $NR^2$, $CR^2R^3$, S, $AsR^2$, $BR^2$, $PR^2$, $P(O)R^2$, or $SiR^2R^3$, or a combination thereof, wherein each of $R^2$ and $R^3$ independently is hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, arylalkene, or $R^2$ and $R^3$ together form C=O, wherein each of $R^2$ and $R^3$ independently is optionally linked to an adjacent ring structure, thereby forming a cyclic structure;

wherein each of $Y^{2a}$, $Y^{2b}$, $Y^{2c}$, and $Y^{2d}$ independently is N, $NR^{6a}$, or $CR^{6b}$, wherein each of $R^{6a}$ and $R^{6b}$ independently is hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, or arylalkene;

each of $Y^{3a}$, $Y^{3b}$, $Y^{3c}$, $Y^{3d}$, $Y^{3e}$, $Y^{4a}$, $Y^{4b}$, $Y^{4c}$, and $Y^{4d}$ independently is N, O, S, $NR^{6a}$, $CR^{6b}$, or $Z(R)_2$, wherein each of $R^{6a}$ and $R^{6b}$ is independently hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, or arylalkene; wherein Z is C or Si, and wherein each $R^{6c}$ independently is hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, or arylalkene;

wherein each of m and n independently are an integer 1 or 2;

wherein each of

independently is partial or full unsaturation of the ring with which it is associated.

In one embodiment, each of $R^2$ and $R^3$ independently is linked to an adjacent ring structure.

In one embodiment, m is 2. In one embodiment, n is 2. In one embodiment, $Y^{2b}$ and $Y^{2c}$ are CH. In one embodiment, $Y^{3b}$ and $Y^{4b}$ are N. In one embodiment, at least one of $Y^{1b}$ and $Y^{1c}$ is $NR^2$, $CR^2R^3$, $AsR^2$, $BR^2$, $PR^2$, $P(O)R^2$, or $SiR^2R^3$, or a combination thereof. In one embodiment, each of $R^2$ and $R^3$ independently is hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, arylalkene, or $R^2$ and $R^3$ together form C═O. In one embodiment, each of $R^2$ and $R^3$ independently is optionally linked to an adjacent ring structure, thereby forming a cyclic structure. In one embodiment, M is Pt or Pd.

In one embodiment, at least of one of $Y^{2a}$, $Y^{2d}$, $Y^{3d}$ and $Y^{4d}$ is C. In one embodiment, at least one of $Y^{1b}$ and $Y^{1c}$ is $NR^2$, $CR^2R^3$, $AsR^2$, $BR^2$, $PR^2$, $P(O)R^2$, or $SiR^2R^3$, or a combination thereof. In one embodiment, each of $R^2$ and $R^3$ independently is hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, arylalkene. In one embodiment, $R^2$ is covalently linked to at least one of $Y^{2a}$, $Y^{2d}$, $Y^{3d}$ and $Y^{4d}$, thereby forming a cyclic structure. In one embodiment, M is Pt or Pd.

In one embodiment, m is 2. In one embodiment, n is 2. In one embodiment, $Y^{2b}$ is CH. In one embodiment, $Y^{3b}$, $Y^{2c}$ and $Y^{4b}$ are N. In one embodiment, $Y^{1b}$ is $NR^2$, $CR^2R^3$, $AsR^2$, $BR^2$, $PR^2$, $P(O)R^2$, or $SiR^2R^3$, or a combination thereof. In one embodiment, each of $R^2$ and $R^3$ independently is hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, arylalkene, or $R^2$ and $R^3$ together form C═O. In one embodiment, each of $R^2$ and $R^3$ independently is optionally linked to an adjacent ring structure, thereby forming a cyclic structure. In one embodiment, M is Ir or Rh.

In one embodiment, at least of one of $Y^{2a}$ and $Y^{3d}$ is C. In one embodiment, $Y^{1b}$ is $NR^2$, $CR^2R^3$, $AsR^2$, $BR^2$, $PR^2$, $P(O)R^2$, or $SiR^2R^3$, or a combination thereof. In one embodiment, each of $R^2$ and $R^3$ independently is hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, arylalkene. In one embodiment, $R^2$ is covalently linked to at least one of $Y^{2a}$ and $Y^{3d}$, thereby forming a cyclic structure. In one embodiment, M is Ir or Rh.

In one embodiment, m is 2. In one embodiment, n is 2. In one embodiment, $Y^{2b}$, $Y^{2c}$ and $Y^{4b}$ are CH. In one embodiment, $Y^{3b}$ is N. In one embodiment, $Y^{1b}$ is $NR^2$, $CR^2R^3$, $AsR^2$, $BR^2$, $PR^2$, $P(O)R^2$, or $SiR^2R^3$, or a combination thereof. In one embodiment, each of $R^2$ and $R^3$ independently is hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, arylalkene, or $R^2$ and $R^3$ together form C═O. In one embodiment, each of $R^2$ and $R^3$ independently is optionally linked to an adjacent ring structure, thereby forming a cyclic structure. In one embodiment, M is Au.

In one embodiment, at least of one of $Y^{2a}$ and $Y^{3d}$ is C. In one embodiment, $Y^{1b}$ is $NR^2$, $CR^2R^3$, $AsR^2$, $BR^2$, $PR^2$, $P(O)R^2$, or $SiR^2R^3$, or a combination thereof. In one embodiment, each of $R^2$ and $R^3$ independently is hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, arylalkene. In one embodiment, $R^2$ is covalently linked to at least one of $Y^{2a}$ and $Y^{3d}$, thereby forming a cyclic structure. In one embodiment, M is Au.

In one embodiment, the compound having Formula I or Formula II is a compound having Formula VII;

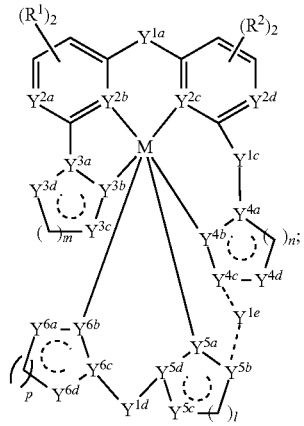

Formula VII wherein M comprises Ir, Rh, Pt, Os, Zr, Co or Ru;

wherein each of $R^1$ and $R^2$ independently are hydrogen, substituted or unsubstituted alkyl, alkenyl, alkynyl, aryl, heteroaryl, cycloalkane, cycloalkane, heterocyclyl, amino, nitro hydroxyl, halogen, thio, alkoxy, haloalkyl, arylalkane, or arylalkene;

wherein each of $Y^{1a}$, $Y^{1c}$ and $Y^{1d}$ independently is O, $NR^2$, $CR^2R^3$, S, $AsR^2$, $BR^2$, $PR^2$, $P(O)R^2$, or $SiR^2R^3$, or a combination thereof, wherein each of $R^2$ and $R^3$ independently is hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, arylalkene, or $R^2$ and $R^3$ together form C═O, wherein each of $R^2$ and $R^3$ independently is optionally linked to an adjacent ring structure, thereby forming a cyclic structure;

wherein $Y^{1c}$ is present or not present; wherein when $Y^{1e}$ is present, $Y^{1e}$ represents O, $NR^2$, $CR^2R^3$, S, $AsR^2$, $BR^2$, $PR^2$, $P(O)R^2$, or $SiR^2R^3$, or a combination thereof; wherein each of $R^2$ and $R^3$ independently is hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, arylalkene, or $R^2$ and $R^3$ together form C═O, wherein each of $R^2$ and $R^3$ independently is optionally linked to an adjacent ring structure, thereby forming a cyclic structure; wherein when $Y^{1e}$ is not present, $Y^{1e}$ represents no bond;

wherein each of $Y^{2a}$, $Y^{2b}$ $Y^{2c}$, and $Y^{2d}$ independently is N or $CR^{6a}$, wherein $R^{6a}$ is hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, or arylalkene;

wherein each of $Y^{3a}$, $Y^{3b}$, $Y^{3c}$, $Y^{3d}$, $Y^{3e}$, $Y^{4a}$, $Y^{4b}$, $Y^{4c}$, and $Y^{4d}$ independently is N, O, S, $NR^{6a}$, $CR^{6b}$, or $Z(R^{6c})_2$, wherein each of $R^{6a}$ and $R^{6b}$ is independently hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, or arylalkene; wherein Z is C or Si, and wherein each $R^{6c}$ independently is hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, or arylalkene;

wherein in each of each of $Y^{5a}$, $Y^{5b}$, $Y^{5c}$, $Y^{5d}$, $Y^{6a}$, $Y^{6b}$, $Y^{6c}$, and $Y^{6d}$ independently is N, O, S, $NR^{6a}$, or CR;

wherein each of m, n, l and p independently is an integer of 1 or 2;

wherein each of

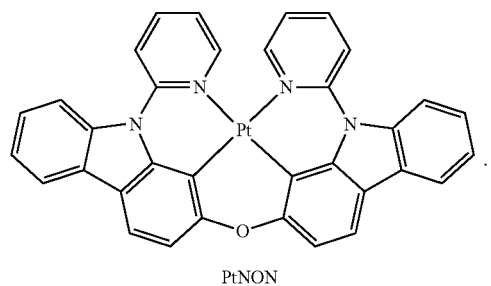

independently is partial or full unsaturation of the ring with which it is associated.

In one embodiment, in the compound of Formula VII, at least one of m, n, l, and p is 2; $Y^{2b}$ and $Y^{2c}$ are CH. In one embodiment, $Y^{3b}$ and $Y^{4b}$ are N. In one embodiment, at least one of $Y^{1b}$ and $Y^{1c}$ is $NR^2$, $CR^2R^3$, $AsR^2$, $BR^2$, $PR^2$, $P(O)R^2$, or $SiR^2R^3$, or a combination thereof. In one embodiment, each of $R^2$ and $R^3$ independently is hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, arylalkene, or $R^2$ and $R^3$ together form C=O. In one embodiment, each of $R^2$ and $R^3$ independently is optionally linked to an adjacent ring structure, thereby forming a cyclic structure. In one embodiment, M is Ir or Rh.

In one embodiment, in the compound of Formula VII, at least of one of $Y^{2a}$, $Y^{2d}$, $Y^{3d}$ and $Y^{4d}$ is C. In one embodiment, at least one of $Y^{1c}$ and $Y^{1d}$ is $NR^2$, $CR^2R^3$, $AsR^2$, $BR^2$, $PR^2$, $P(O)R^2$, or $SiR^2R^3$, or a combination thereof. In one embodiment, each of $R^2$ and $R^3$ independently is hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, arylalkene. In one embodiment, $R^2$ is covalently linked to at least one of $Y^{2a}$, $Y^{2d}$, $Y^{3d}$ and $Y^{4d}$, thereby forming a cyclic structure. In one embodiment, M is Ir or Rh.

In one embodiment, in the compound of Formula VII, each of $R^2$ and $R^3$ independently is linked to an adjacent ring structure.

In one embodiment, the phosphorescent/MADF emitter is PtNON;

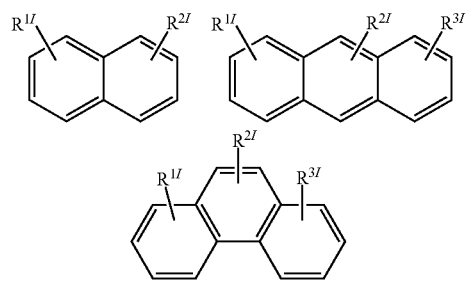

PtNON

Exemplary fluorescent emitters include, but are not limited to:
1. Aromatic Hydrocarbons and their Derivatives

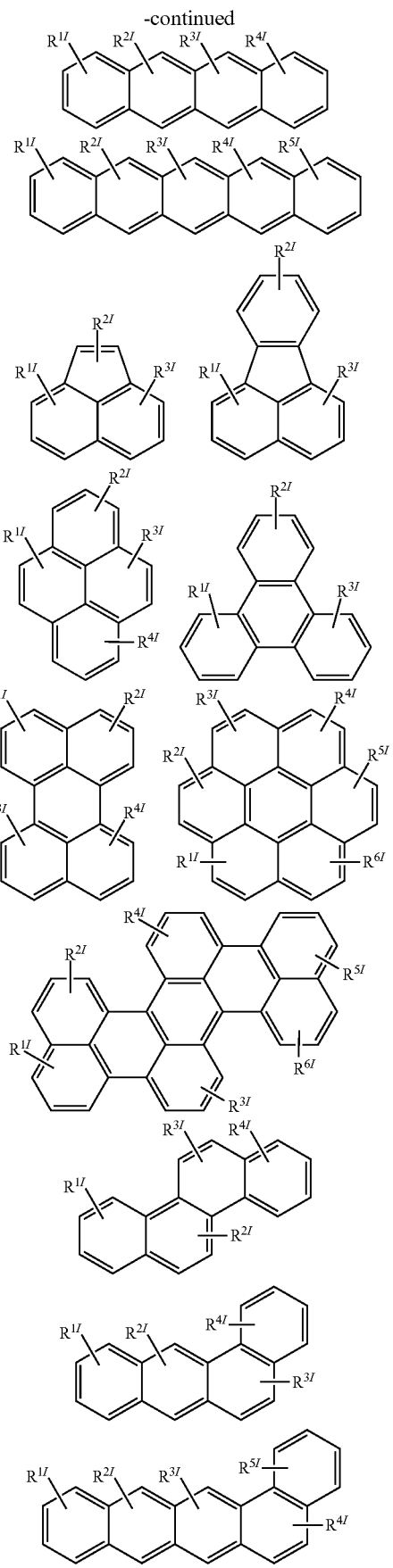

-continued
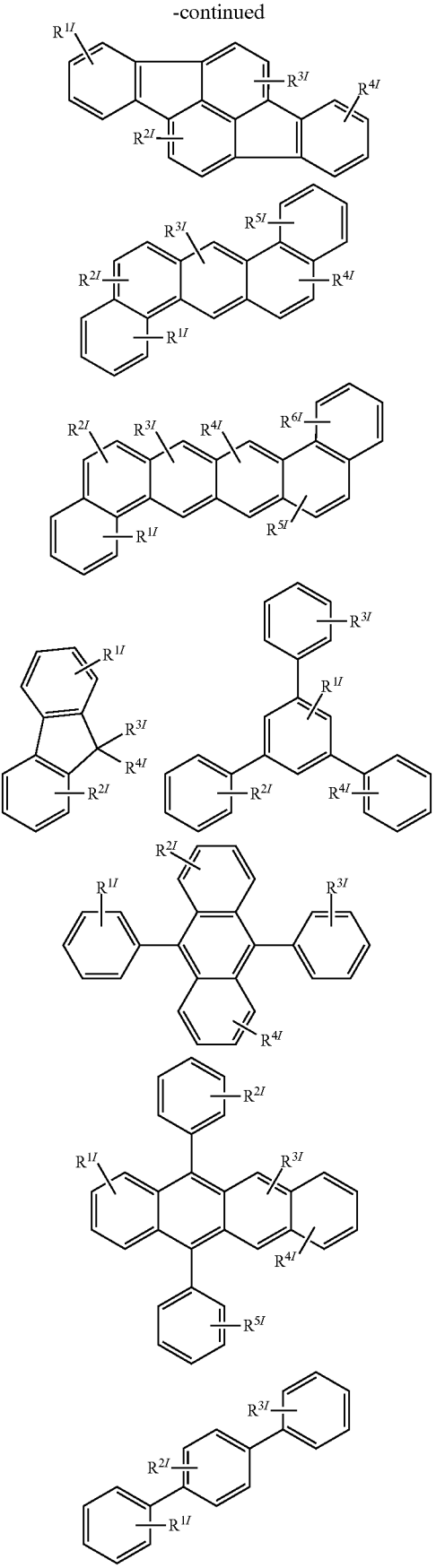
-continued
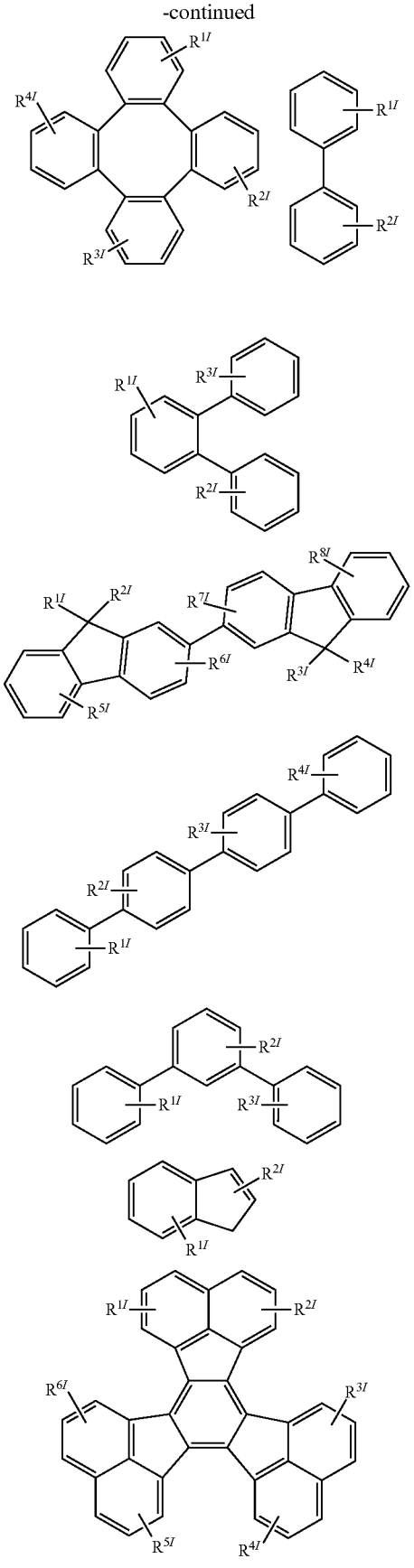

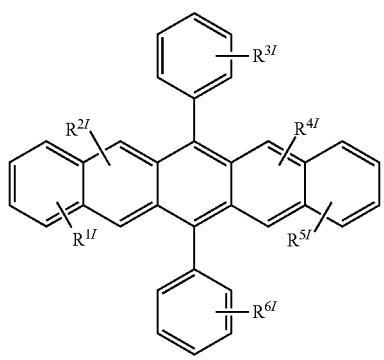
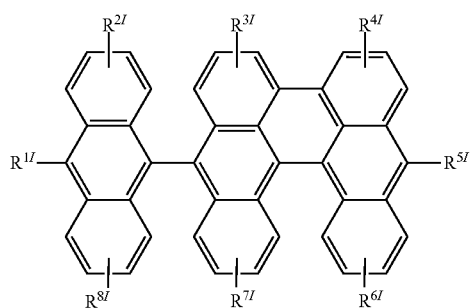
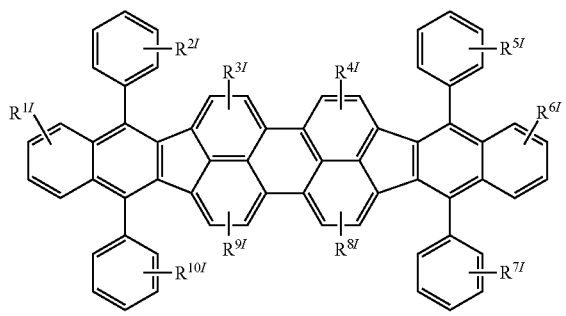
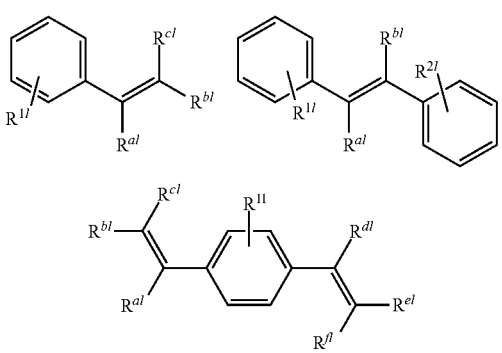
2. Arylethylene, Arylacetylene and their Derivatives
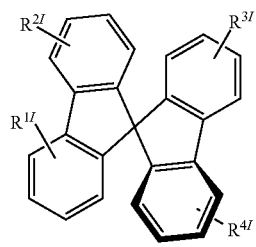
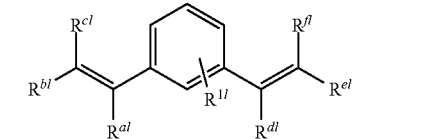
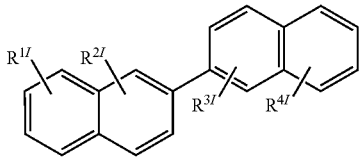
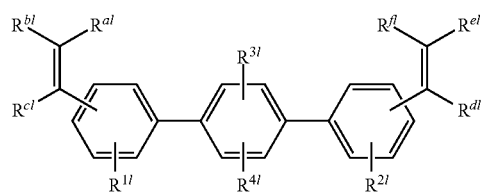
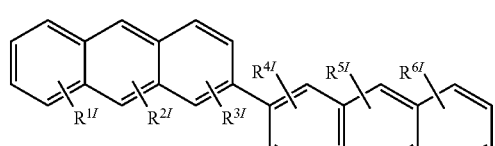
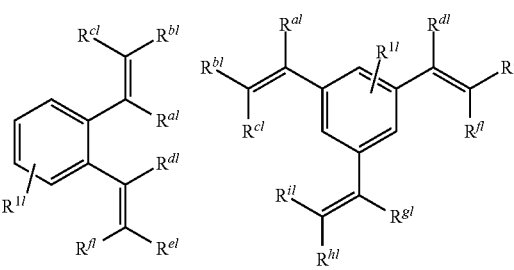
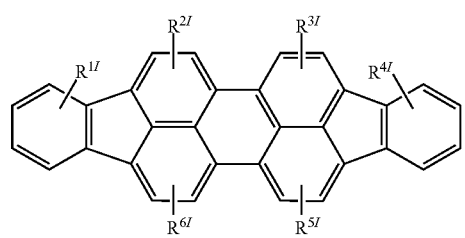
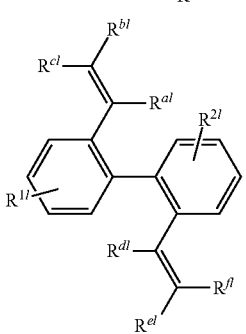
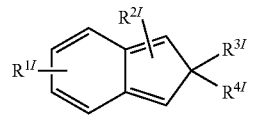

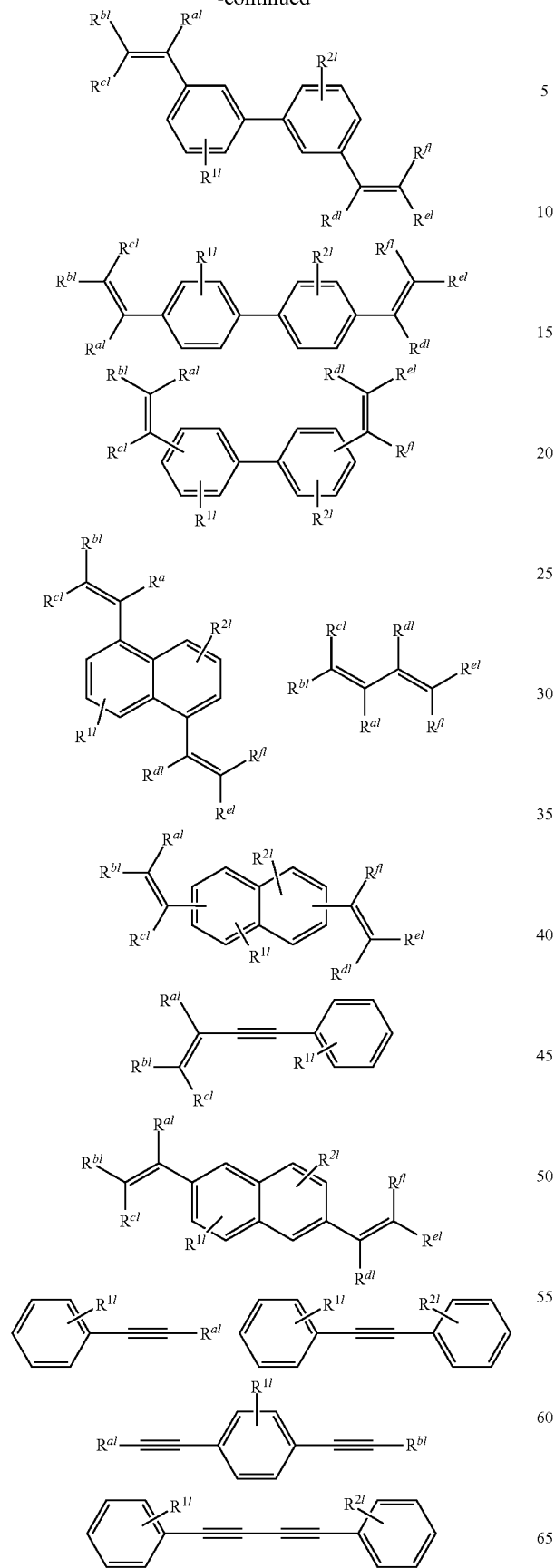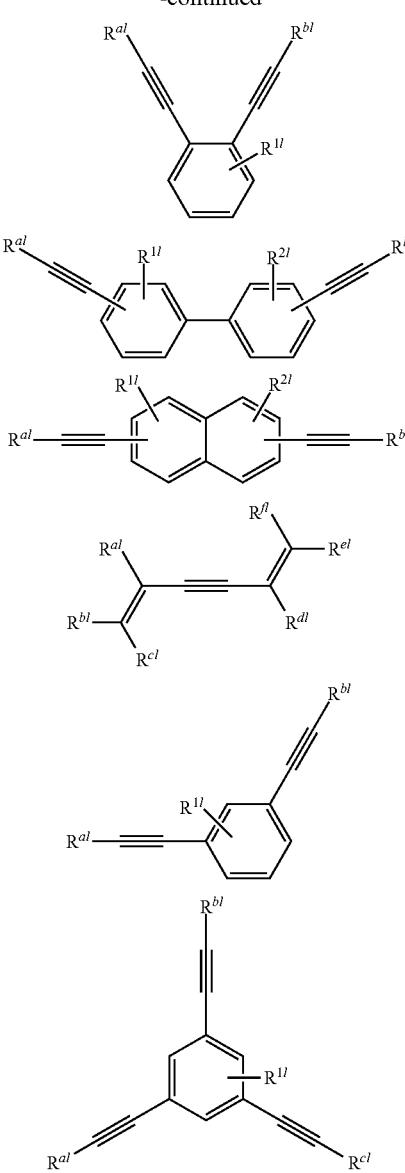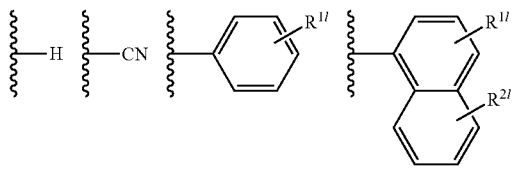
wherein $R^{al}$, $R^{bl}$, $R^{cl}$, $R^{dl}$, $R^{el}$, $R^{fl}$, $R^{gl}$, $R^{hl}$, and $R^{il}$ can be one of the following structure:
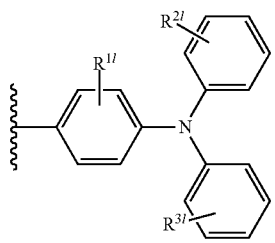

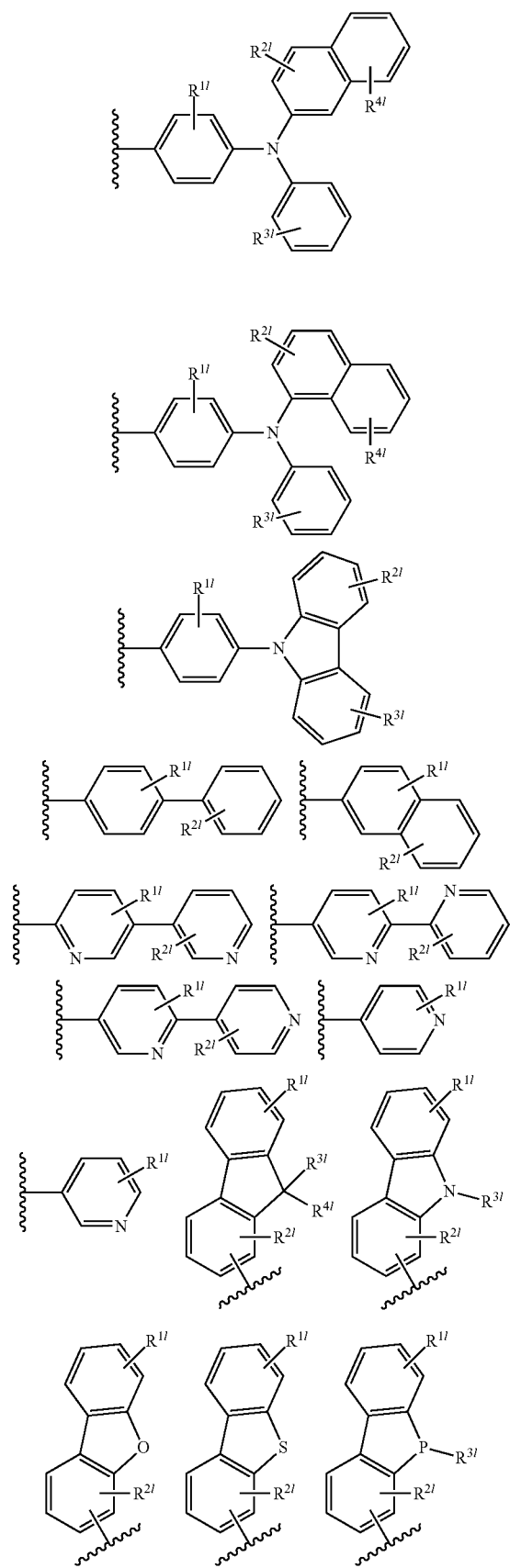
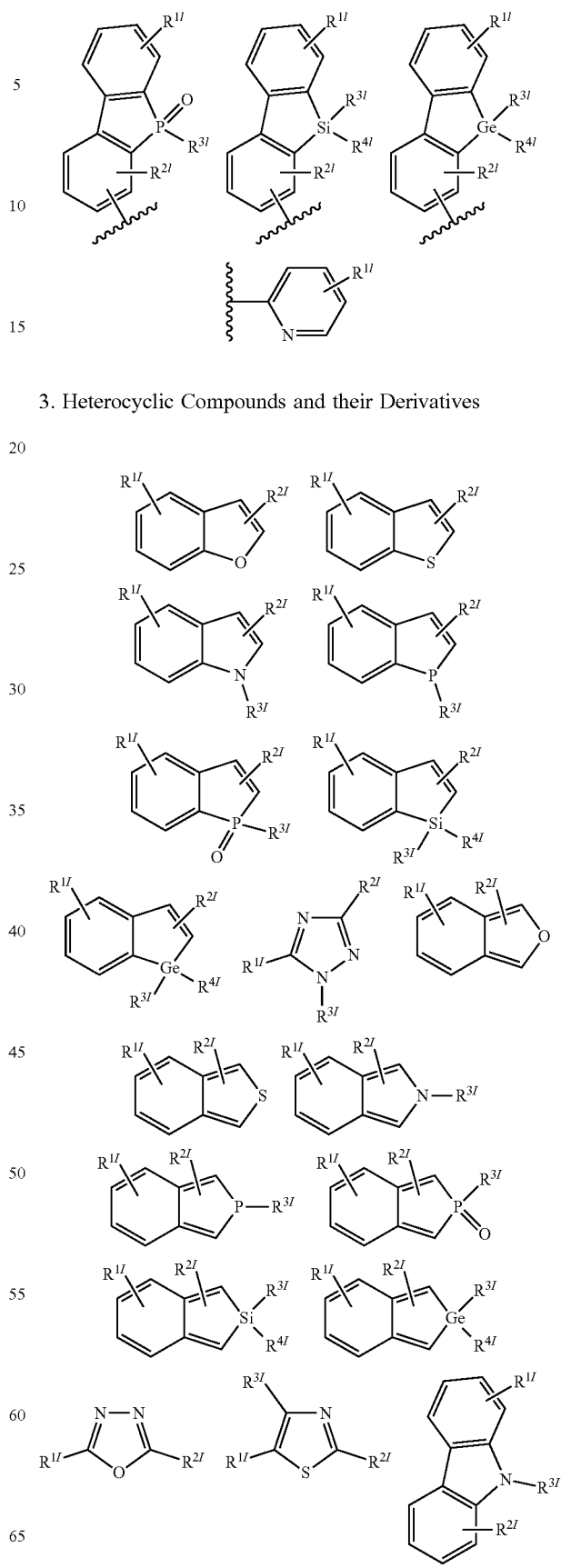
3. Heterocyclic Compounds and their Derivatives

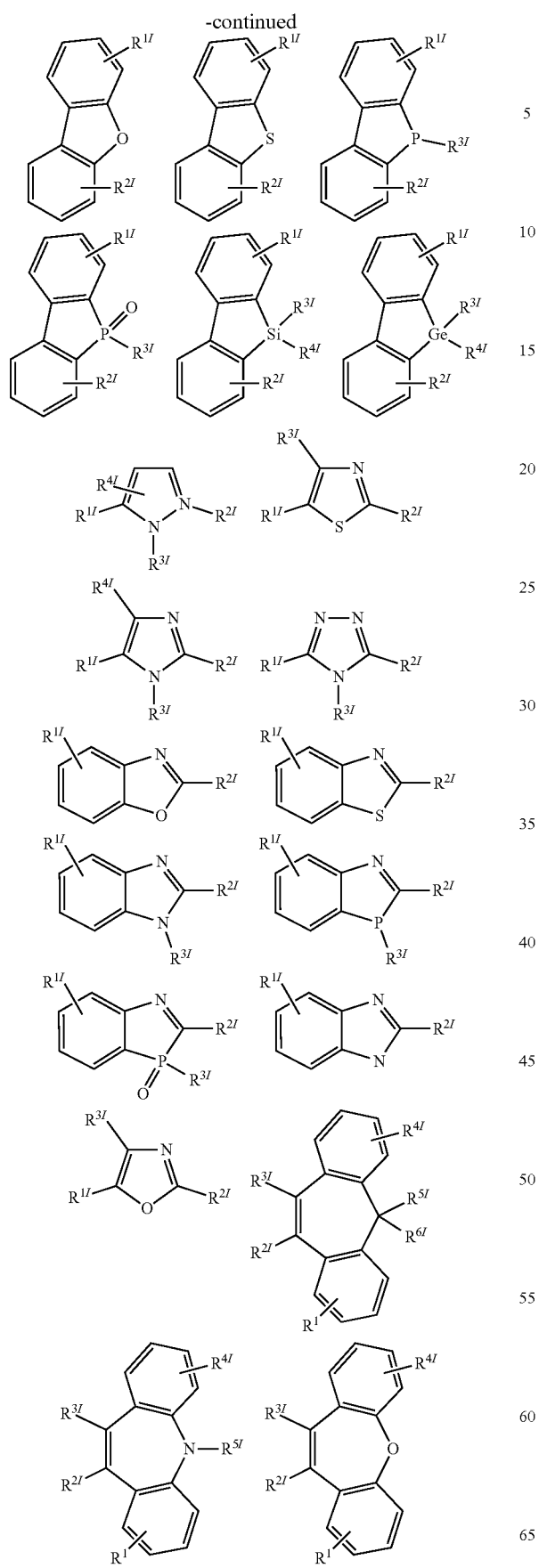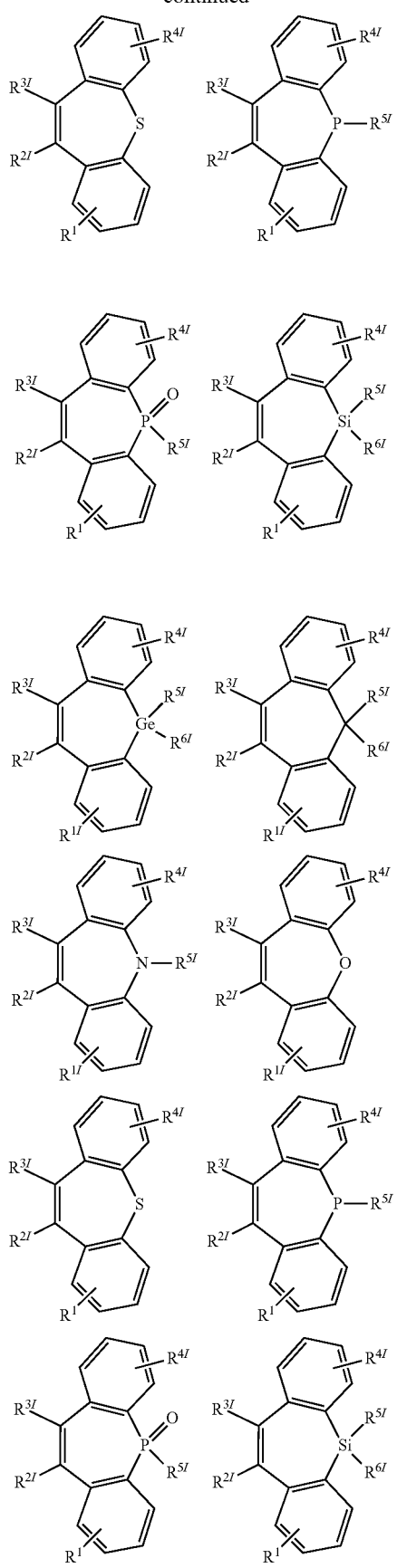

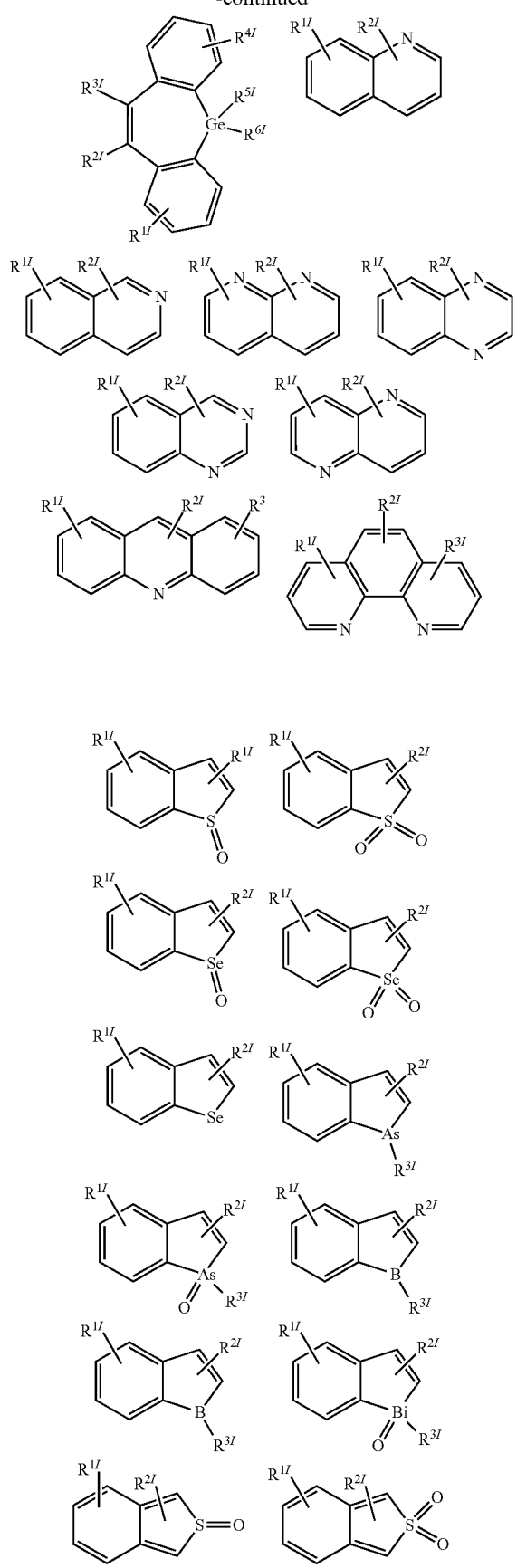
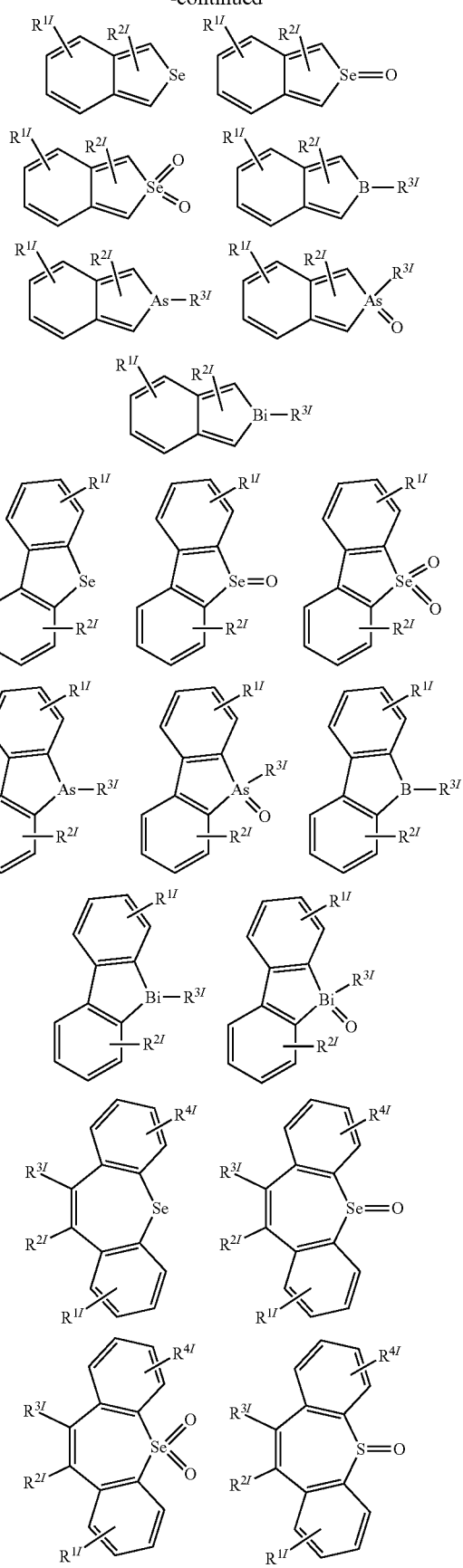

-continued
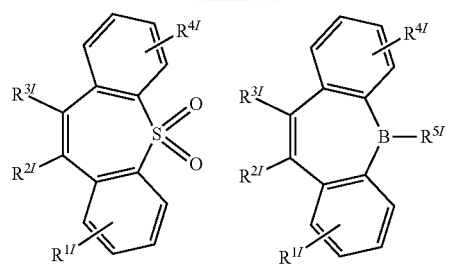
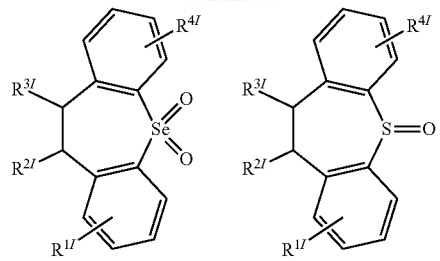
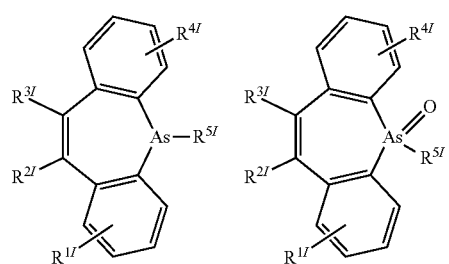
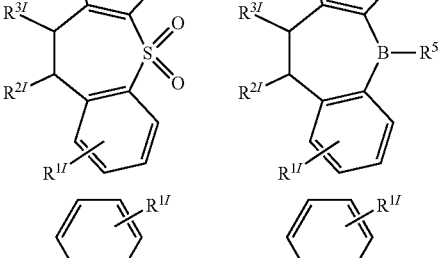
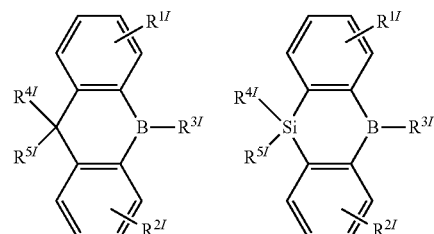
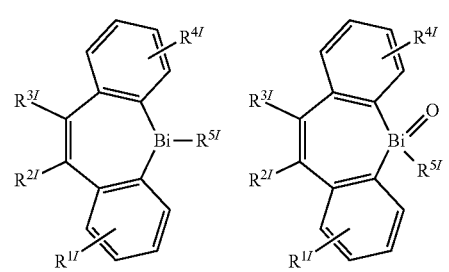
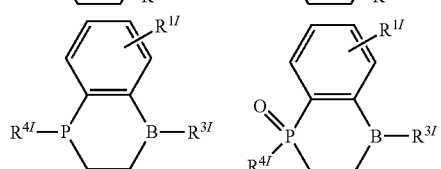
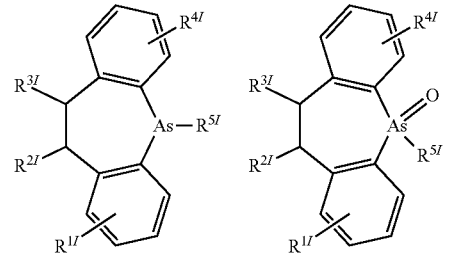
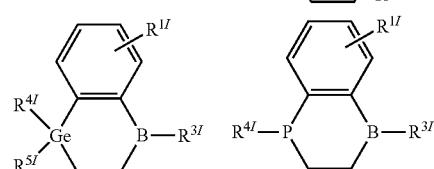
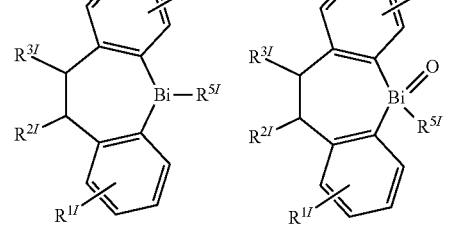
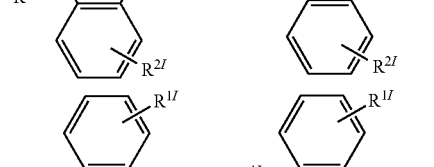
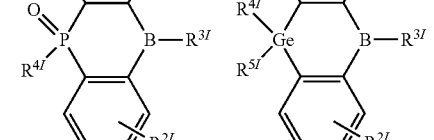
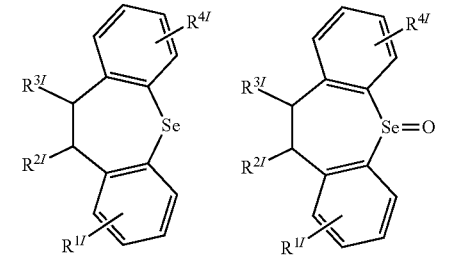
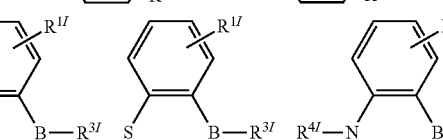

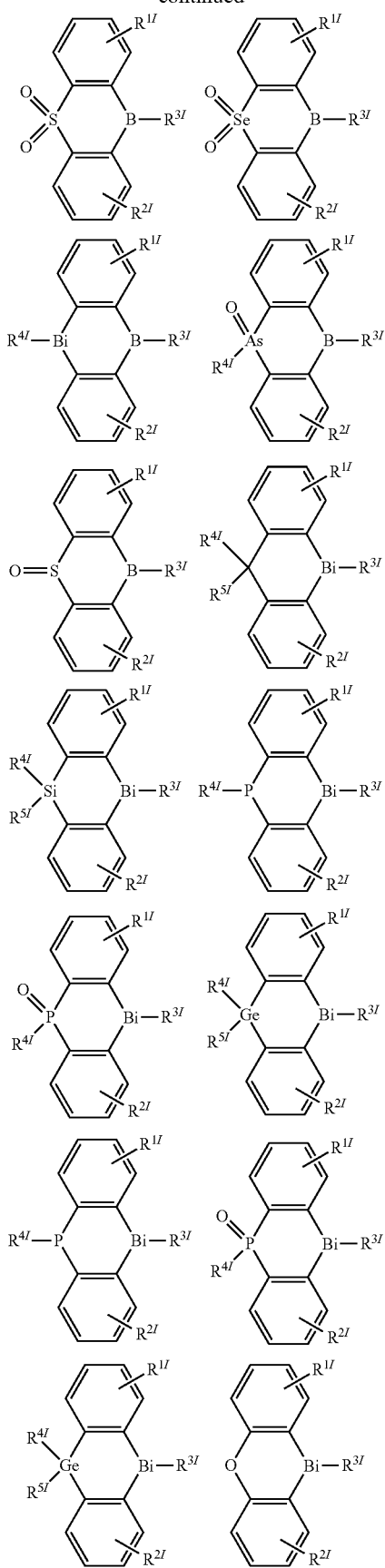
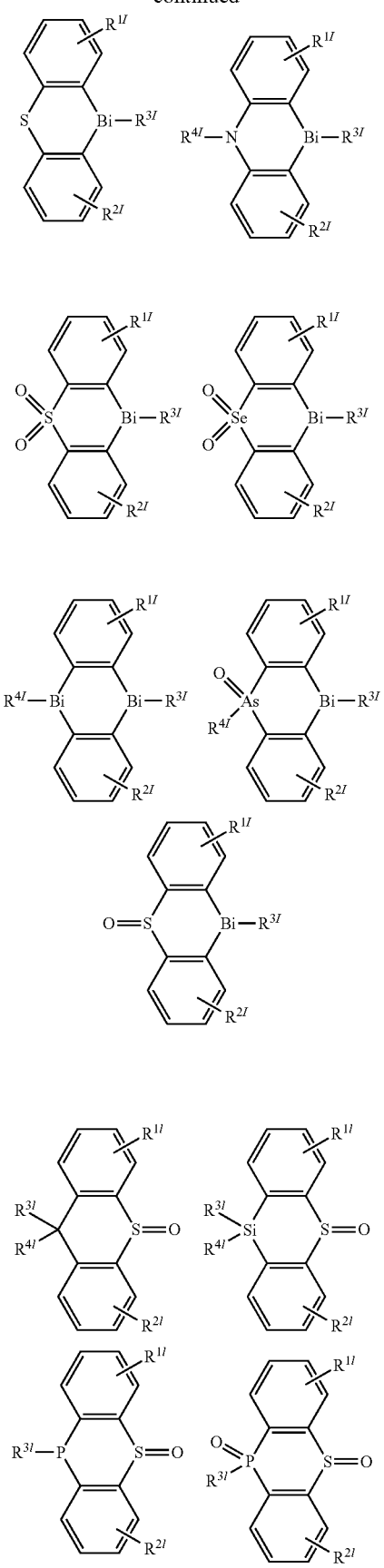

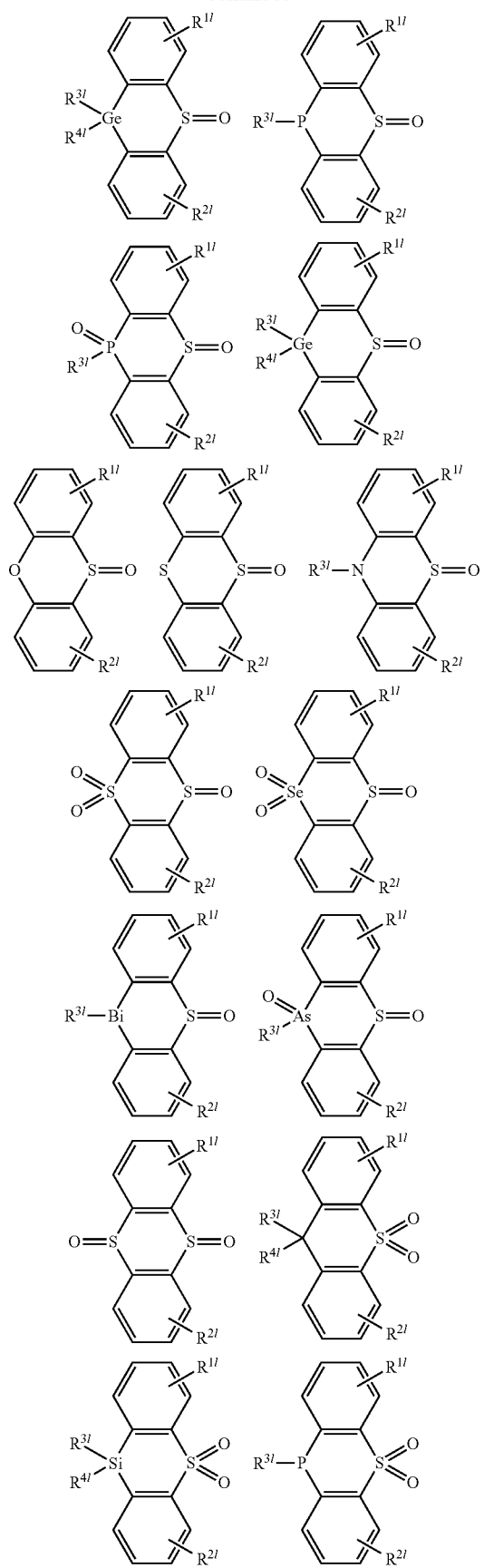
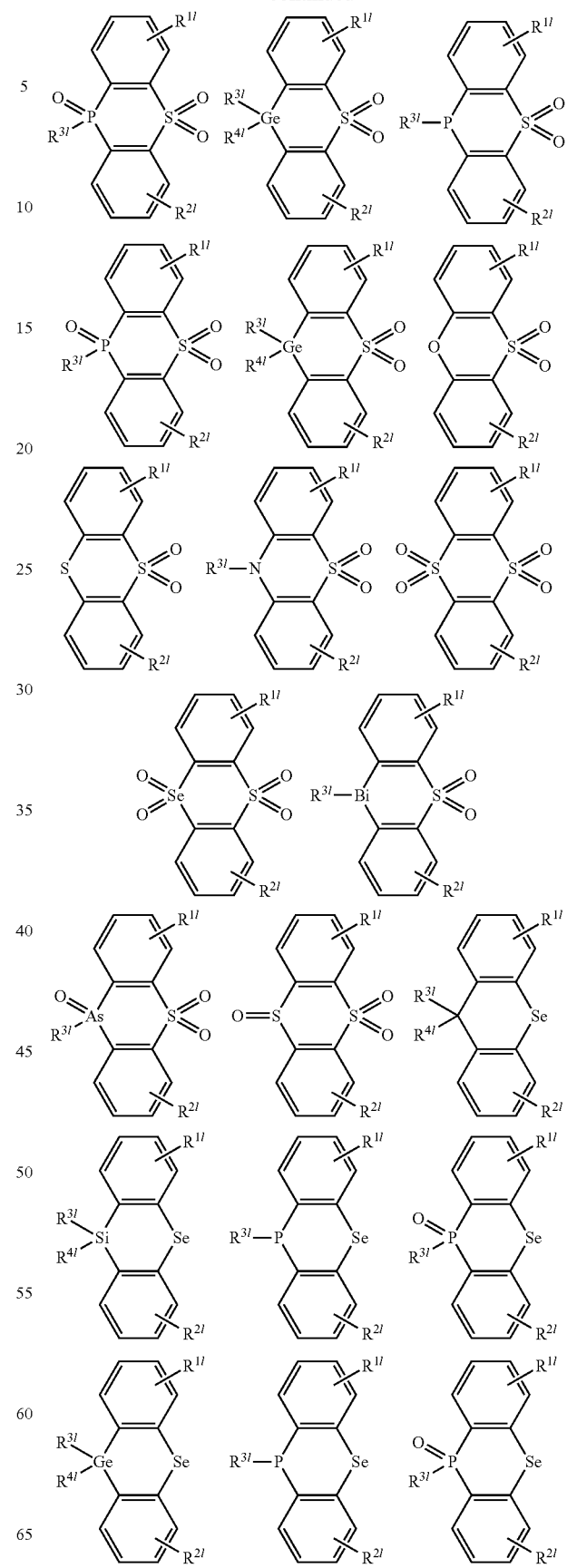

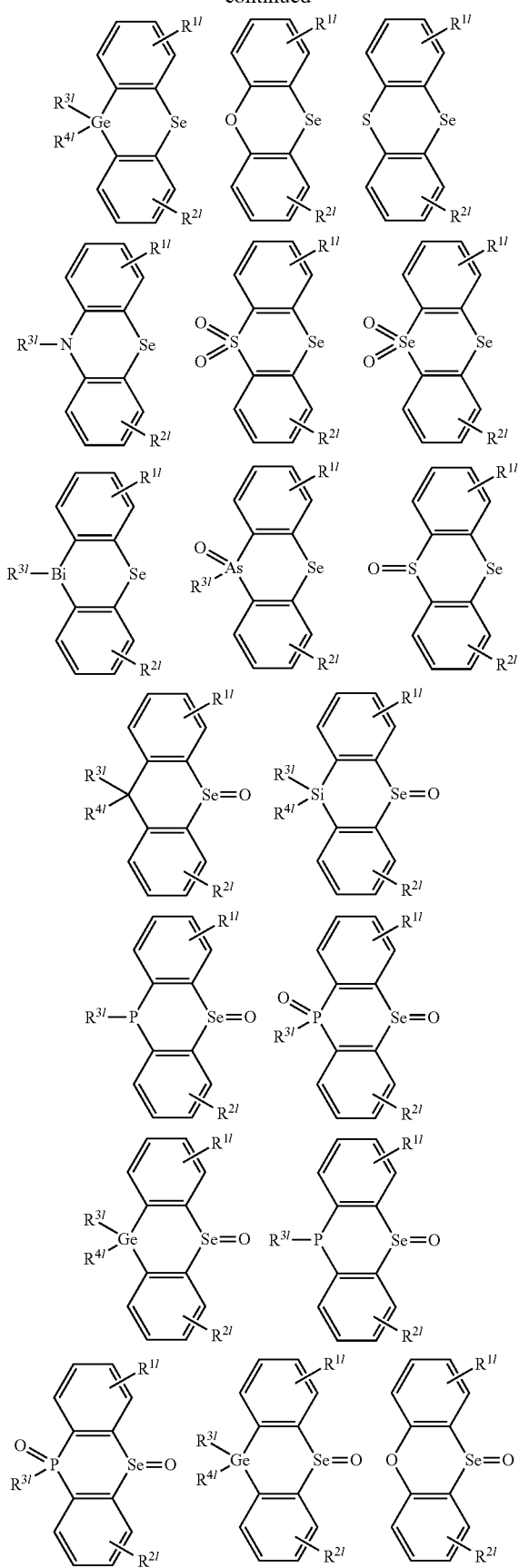
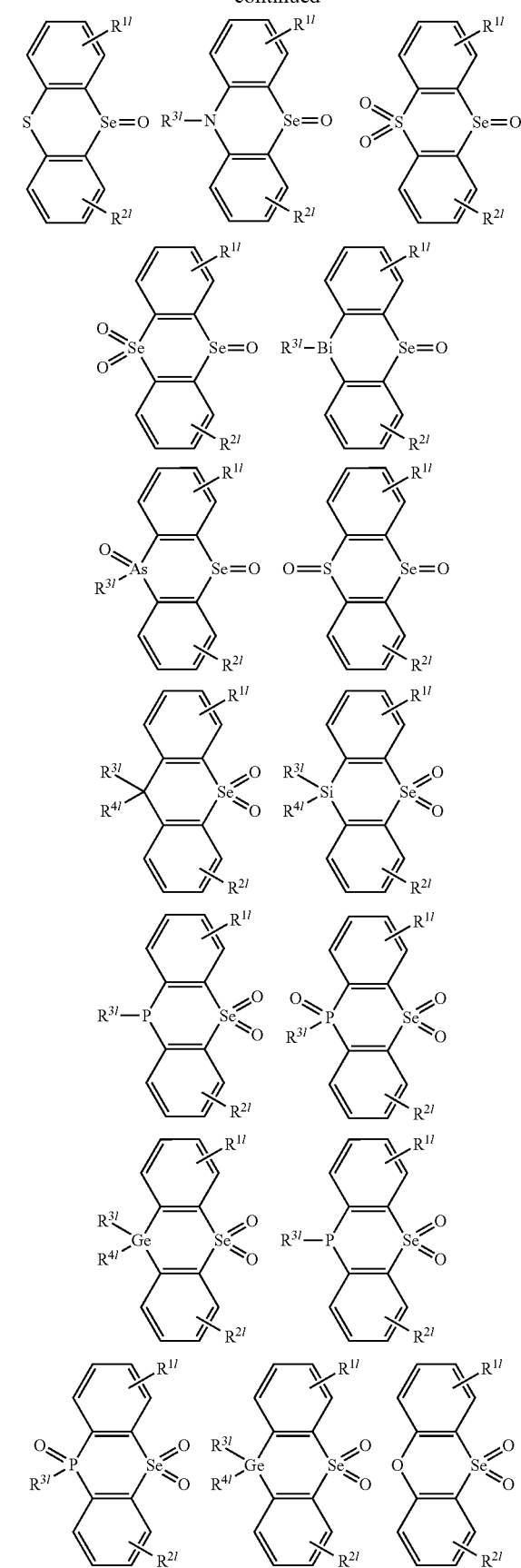

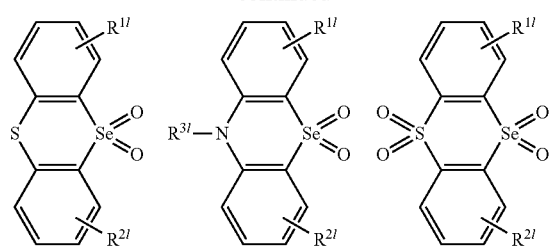
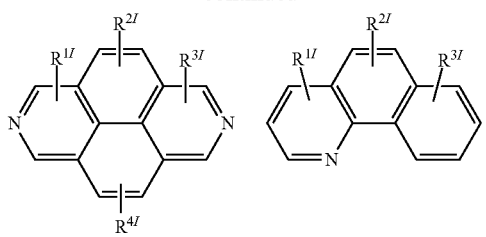
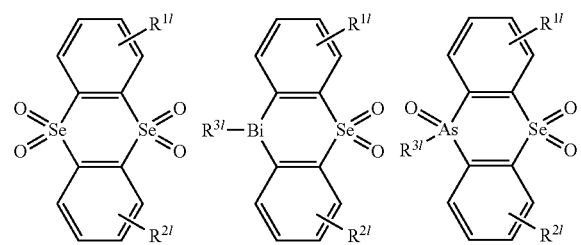
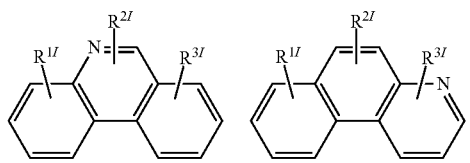
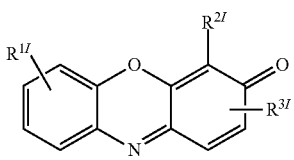
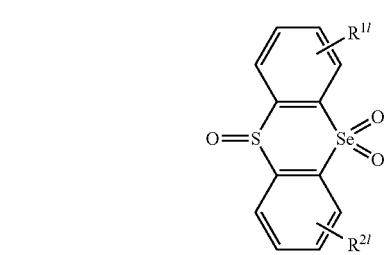
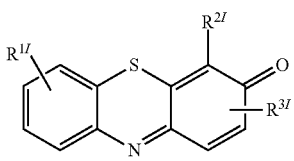
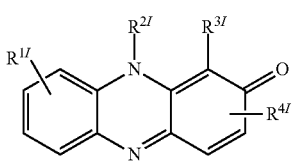
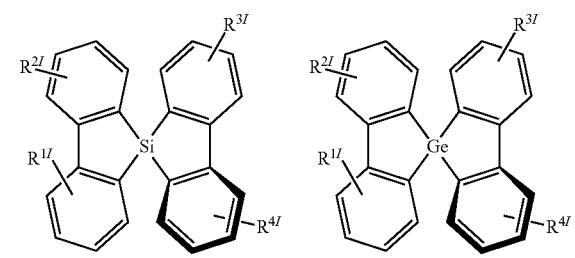
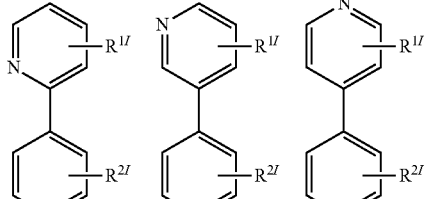
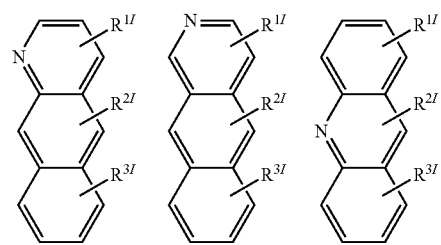
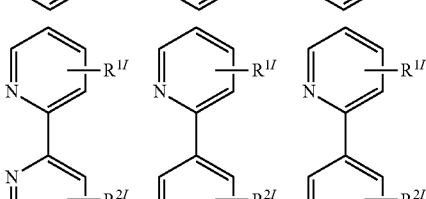
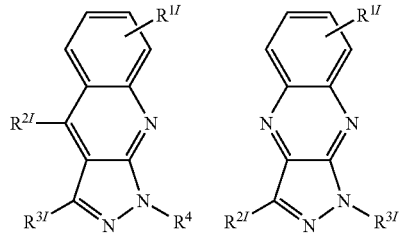
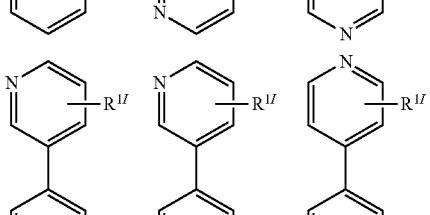

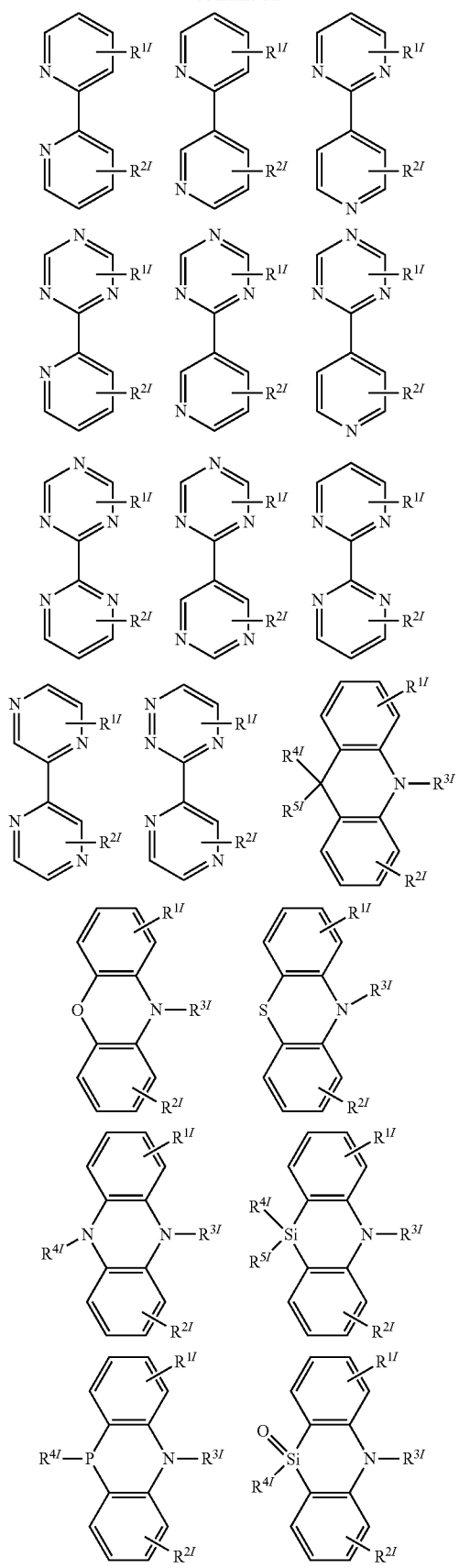
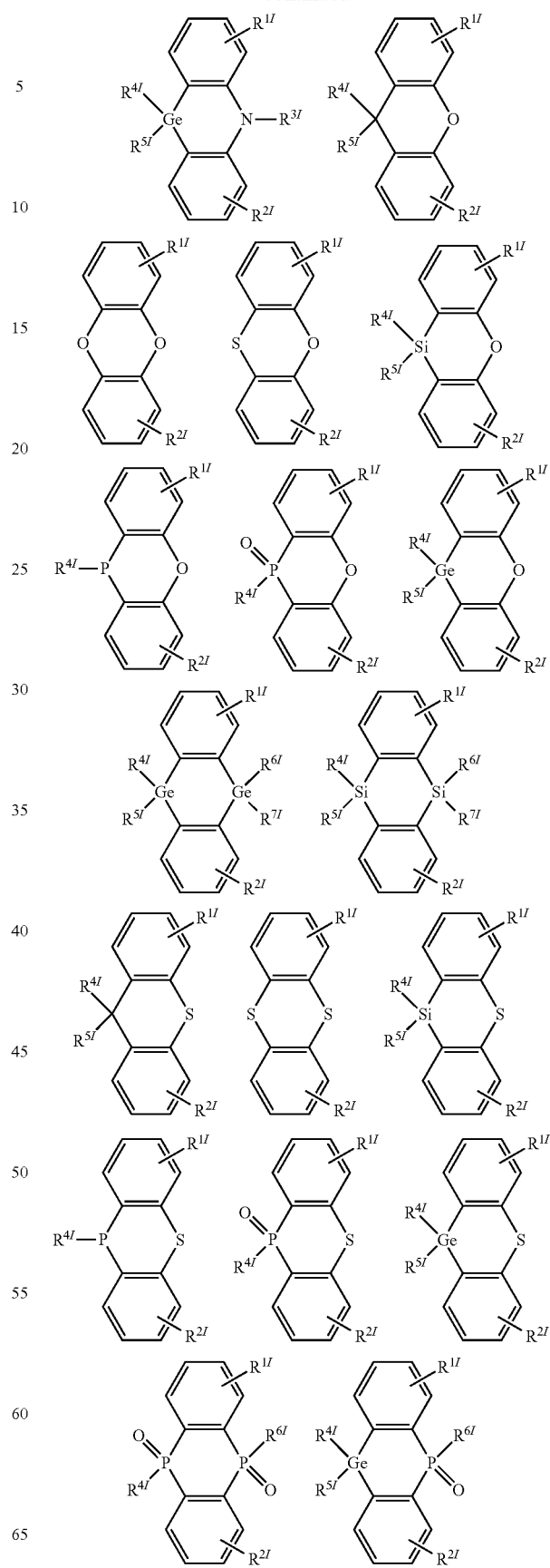

-continued
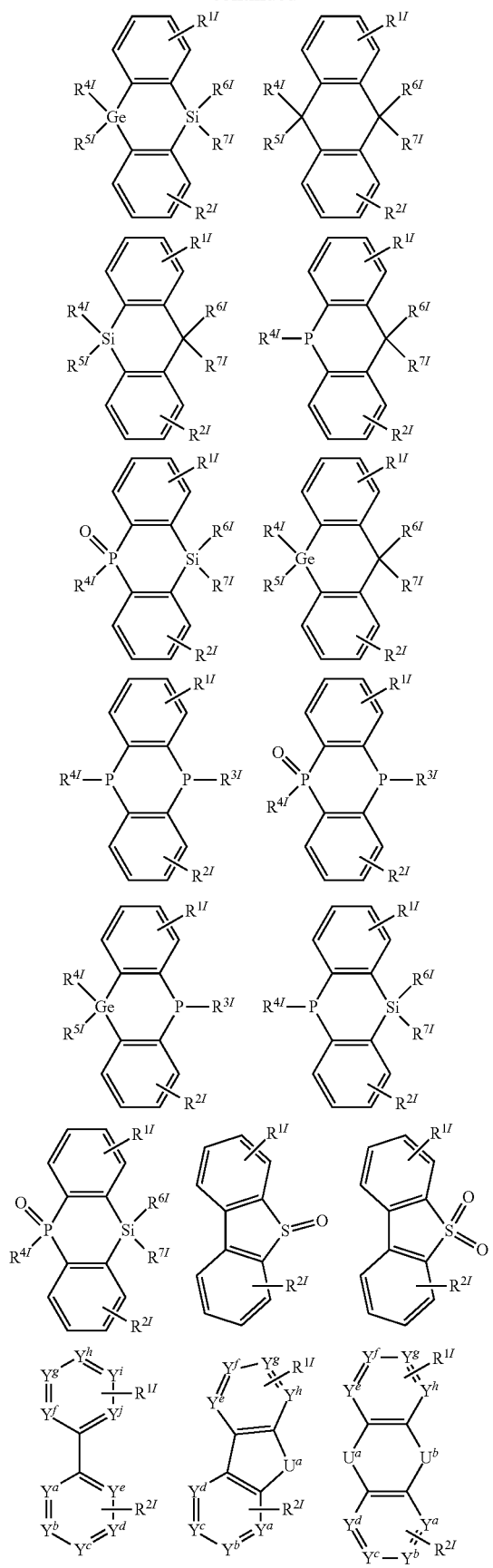
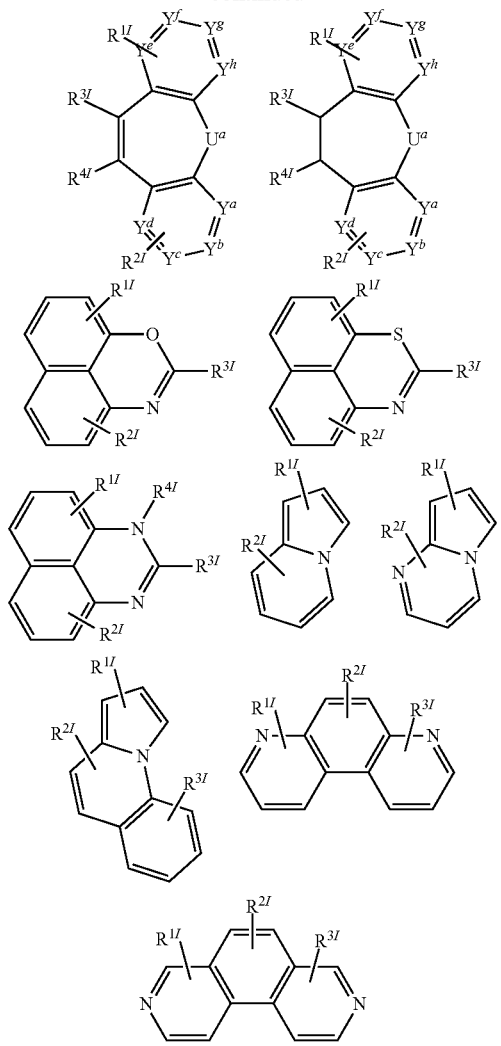
4. Other Fluorescent Luminophors
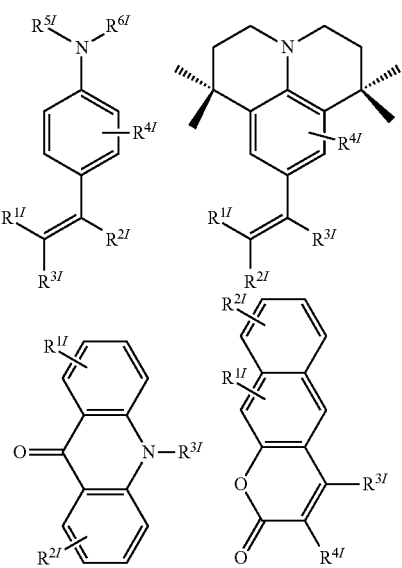

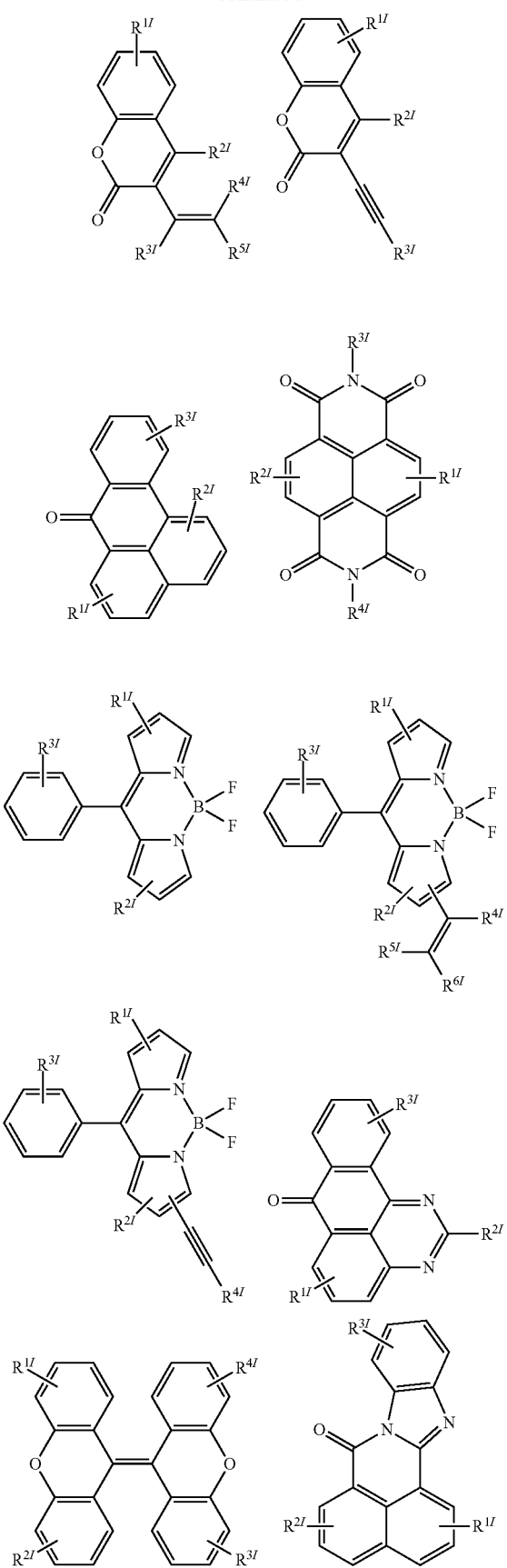
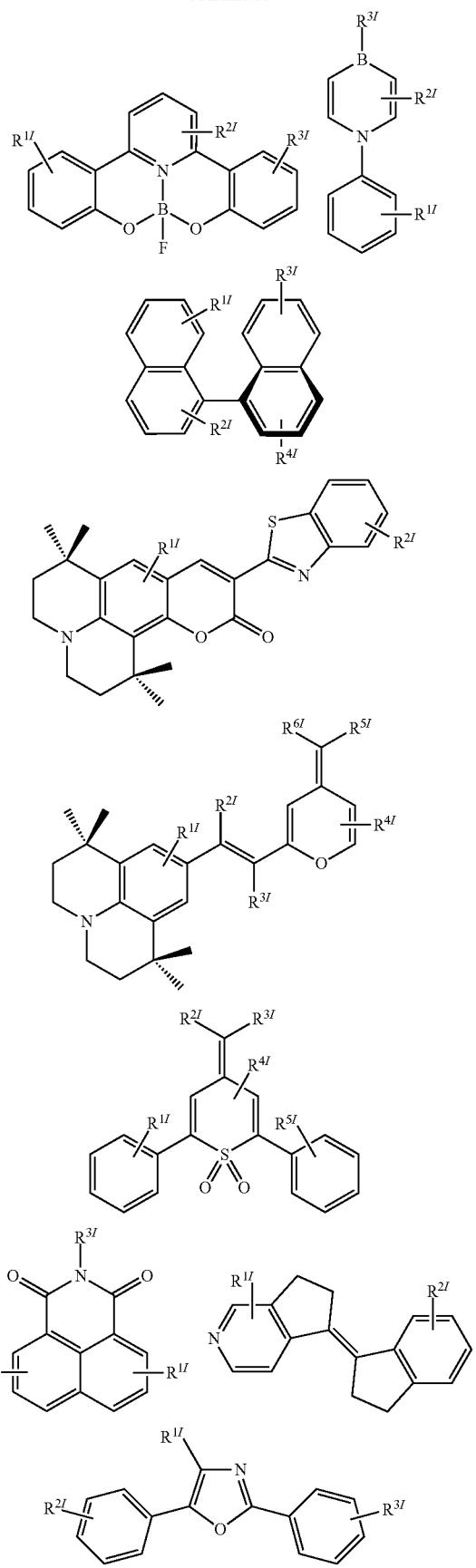

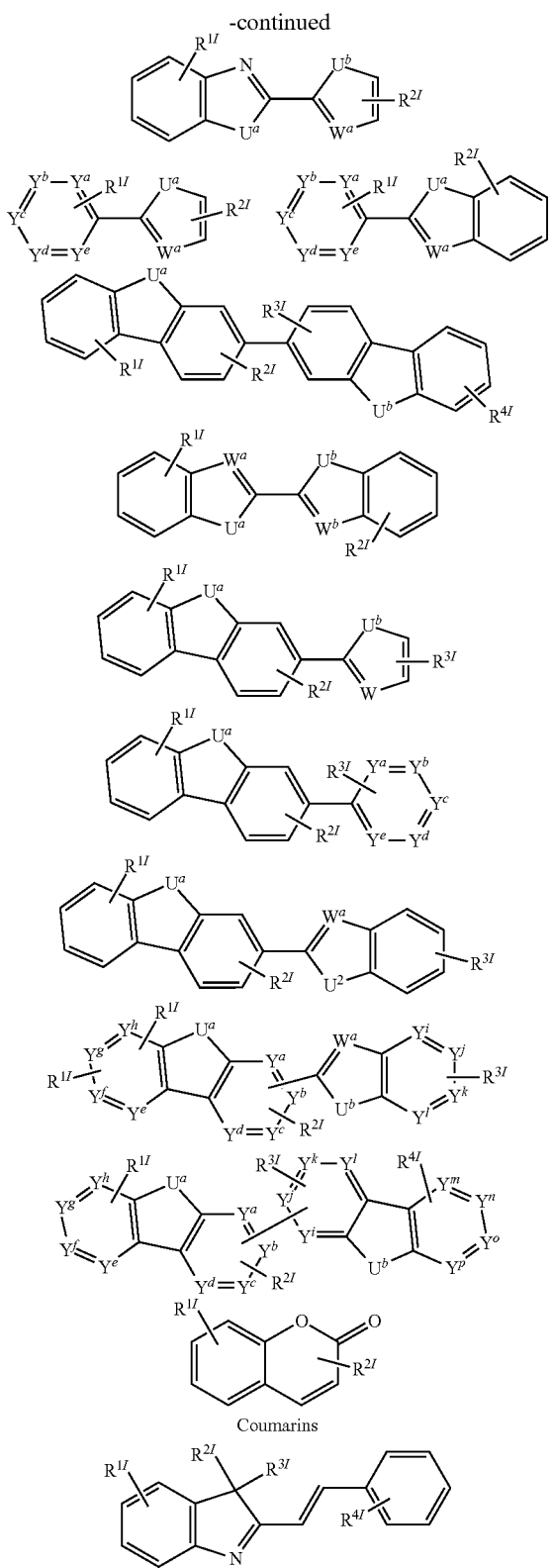

wherein each of $R^{1l}$, $R^{2l}$, $R^{3l}$, $R^{4l}$, $R^{5l}$, $R^{6l}$, $R^{7l}$ and $R^{8l}$ independently represents hydrogen, aryl, cycloalkyl, cycloalkenyl, heterocyclyl, heteroaryl, alkyl, alkenyl, alkynyl, deuterium, halogen, hydroxyl, thiol, nitro, cyano, amino, a mono- or di-alkylamino, a mono- or diarylamino, alkoxy, aryloxy, haloalkyl, aralkyl, ester, nitrile, isonitrile, heteroaryl, alkoxycarbonyl, acylamino, alkoxycarbonylamino, aryloxycarbonylamino, sulfonylamino, sulfamoyl, carbamoyl, alkylthio, sulfinyl, ureido, phosphoramide, mercapto, sulfo, carboxyl, hydrazino, substituted silyl, polymeric, or any conjugate or combination thereof.

wherein each of $Y^a$, $Y^b$, $Y^c$, $Y^d$, $Y^e$, $Y^f$, $Y^g$, $Y^h$, $Y^i$, $Y^j$, $Y^k$, $Y^l$, $Y^m$, $Y^n$, $Y^o$ and $Y^p$ independently represents C, N or B; and wherein each of $U^a$, $U^b$ and $U^c$ independently represents $CH_2$, $CR^1R^2$, C=O, $CH_2$, $SiR^1R^2$, $GeH_2$, $GeR^1R^2$, NH, $NR^3$, PH, $PR^3$, $R^3P$=O, $AsR^3$, $R^3As$=O, O, S, S=O, $SO_2$, Se, Se=O, $SeO_2$, BH, $BR^3$, $R^3Bi$=O, BiH, or $BiR^3$; wherein each of $R^1$, $R^2$, and $R^3$ independently are hydrogen, substituted or unsubstituted alkyl, alkenyl, alkynyl, aryl, heteroaryl, cycloalkane, cycloalkane, heterocyclyl, amino, nitro hydroxyl, halogen, thio, alkoxy, haloalkyl, arylalkane, or arylalkene.

In one embodiment, the fluorescent emitter is a thermally active delayed fluorescent (TADF) emitter. Exemplary TADF emitters include, but are not limited to, DABNA-1 and DABNA-2.

DABNA-1

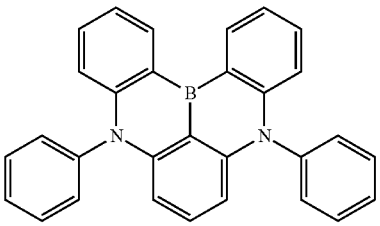

DABNA-2

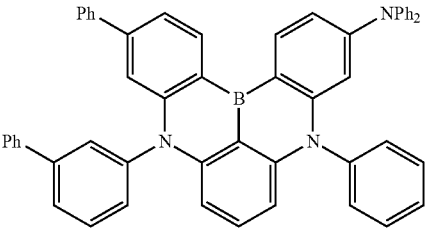

Hosts:

In one embodiment, the devices of the present disclosure may include a host material In one embodiment, the host material comprises a carbazole-based host material. Suitable carbazole based host materials include, but are not limited to, compounds having one to three carbazole skeletons, such as compounds of Formulas 1-3:

Formula 1

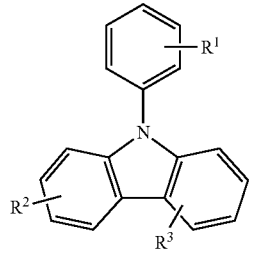

Formula 2

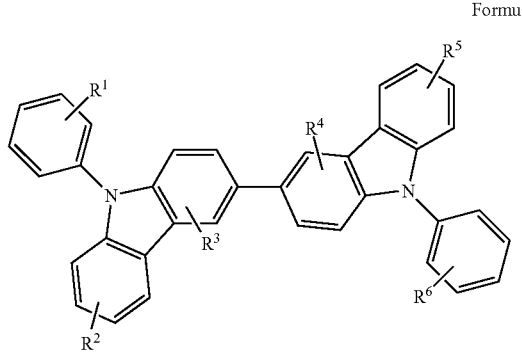

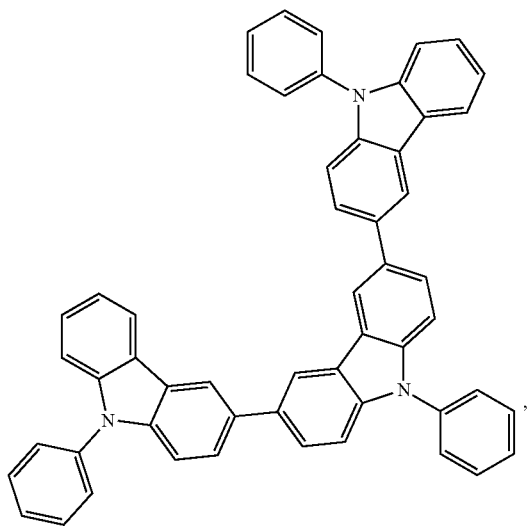

Tris-PCz

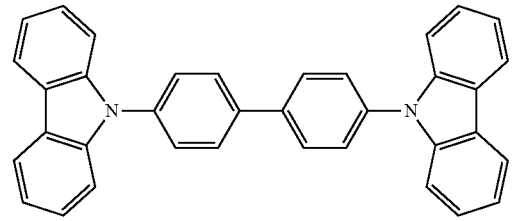

CBP

Formula 3

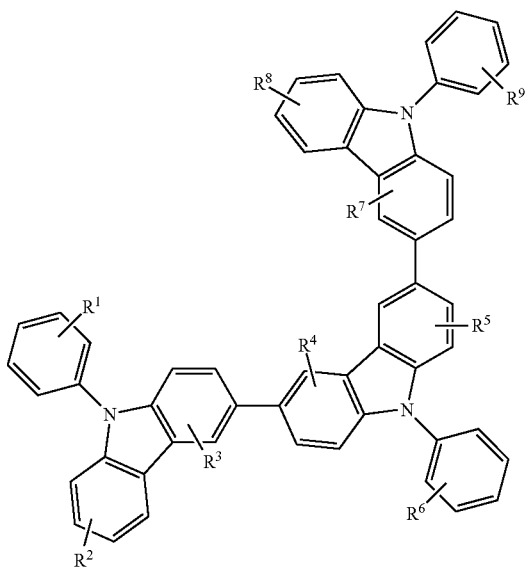

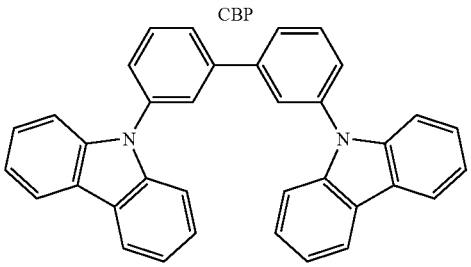

mCBP

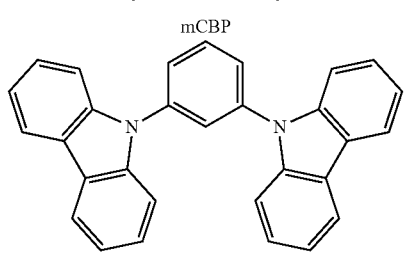

mCP

In Formulas 1-3, each of $R^1$-$R^9$ independently represents hydrogen, halogen, hydroxyl, nitro, cyanide, thiol, or optionally substituted alkyl, alkenyl, alkynyl, aryl, heteroaryl, cycloalkane, cycloalkane, heterocyclyl, amino, alkoxy, haloalkyl, arylalkane, or arylalkene.

Further non-limiting examples of suitable carbazole-based host materials include (9,9',9''-triphenyl-9H,9'H,9''H-3,3':6'3''-tercarbazole) (tris-PCz), (4,4-di(9H-carbazol-9-yl) biphenyl) (CBP), (3,3-di(9H-carbazol-9-yl) biphenyl) (mCBP), meta-di(carbazolyl) phenyl (mCP) shown below.

Additional carbazole-based hosts include, but are not limited to, mCPy (2,6-bis(N-carbazolyl)pyridine), TCP (1,3,5-tris(carbazol-9-yl)benzene), TCTA (4,4',4''-tris(carbazol-9-yl)triphenylamine), TPBi (1,3,5-tris(1-phenyl-1-H-benzimidazol-2-yl)benzene), pCBP (4,4'-bis(carbazol-9-yl) biphenyl), CDBP (4,4'-bis(9-carbazolyl)-2,2'-dimethylbiphenyl), DMFL-CBP (4,4'-bis(carbazol-9-yl)-9,9-dimethylfluorene), FL-4CBP (4,4'-bis(carbazol-9-yl)-9,9-bis(9-phenyl-9H-carbazole)fluorene), FL-2CBP (9,9-bis(4-carbazol-9-yl)phenyl)fluorene, also abbreviated as CPF), DPFL-CBP (4,4'-bis(carbazol-9-yl)-9,9-ditolylfluorene), FL-2CBP (9,9-bis(9-phenyl-9H-carbazole)fluorene), Spiro-CBP (2,2',7,7'-tetrakis(carbazol-9-yl)-9,9'-spirobifluorene). In one embodiment, a single host is used. In one embodiment, a mixture of two or more hosts is used. In one embodiment, the mixture of hosts may comprise between 0.01% and 99.99% of at least one host and between 0.01% and 99.99% of a second host.

Compositions and Devices

Also disclosed herein are devices comprising one or more compound and/or compositions disclosed herein.

In one aspect, the device is an electro-optical device. Electro-optical devices include, but are not limited to, photo-absorbing devices such as solar- and photo-sensitive devices, organic light emitting devices (OLEDs), photo-emitting devices, or devices capable of both photo-absorption and emission and as markers for bio-applications. For example, the device can be an OLED.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art. Such devices are disclosed herein which comprise one or more of the compounds or compositions disclosed herein.

OLEDs can be produced by methods known to those skilled in the art. In general, the OLED is produced by successive vapor deposition of the individual layers onto a suitable substrate. Suitable substrates include, for example, glass, inorganic materials such as ITO or IZO or polymer films. For the vapor deposition, customary techniques may be used, such as thermal evaporation, chemical vapor deposition (CVD), physical vapor deposition (PVD) and others.

In an alternative process, the organic layers may be coated from solutions or dispersions in suitable solvents, in which case coating techniques known to those skilled in the art are employed. Suitable coating techniques are, for example, spin-coating, the casting method, the Langmuir-Blodgett ("LB") method, the inkjet printing method, dip-coating, letterpress printing, screen printing, doctor blade printing, slit-coating, roller printing, reverse roller printing, offset lithography printing, flexographic printing, web printing, spray coating, coating by a brush or pad printing, and the like. Among the processes mentioned, in addition to the aforementioned vapor deposition, preference is given to spin-coating, the inkjet printing method and the casting method since they are particularly simple and inexpensive to perform. In the case that layers of the OLED are obtained by the spin-coating method, the casting method or the inkjet printing method, the coating can be obtained using a solution prepared by dissolving the composition in a concentration of 0.0001 to 90% by weight in a suitable organic solvent such as benzene, toluene, xylene, tetrahydrofuran, methyltetrahydrofuran, N,N-dimethylformamide, acetone, acetonitrile, anisole, dichloromethane, dimethyl sulfoxide, water and mixtures thereof.

According to one aspect of the present disclosure, an OLED is provided. The OLED includes an anode, a cathode, and at least one organic layer disposed between the anode and the cathode. The at least one organic layer may include a host and a phosphorescent dopant and/or a fluorescent dopant The organic layer can include a compound of Formula I or Formula II, and its variations as described herein.

FIG. 1 depicts a cross-sectional view of an exemplary OLED 100. OLED 100 includes substrate 102, anode 104, hole-transporting material(s) (HTL) 106, light processing material 108, electron-transporting material(s) (ETL) 110, and a metal cathode layer 112. Anode 104 is typically a transparent material, such as indium tin oxide. Light processing material 108 may be an emissive material (EML) including an emitter and a host.

In various aspects, any of the one or more layers depicted in FIG. 1 may include indium tin oxide (ITO), poly(3,4-ethylenedioxythiophene) (PEDOT), polystyrene sulfonate (PSS), N,N'-di-1-naphthyl-N,N-diphenyl-1,1'-biphenyl-4,4' diamine (NPD), 1,1-bis((di-4-tolylamino)phenyl)cyclohexane (TAPC), 2,6-Bis(N-carbazolyl)pyridine (mCpy), 2,8-bis(diphenylphosphoryl)dibenzothiophene (PO15), LiF, Al, or a combination thereof.

Light processing material 108 may include one or more compounds of the present disclosure optionally together with a host material. The host material can be any suitable host material known in the art. The emission color of an OLED is determined by the emission energy (optical energy gap) of the light processing material 108, which can be tuned by tuning the electronic structure of the emitting compounds, the host material, or both. Both the hole-transporting material in the HTL layer 106 and the electron-transporting material(s) in the ETL layer 110 may include any suitable hole-transporter known in the art.

Compounds described herein may exhibit phosphorescence. Phosphorescent OLEDs (i.e., OLEDs with phosphorescent emitters) typically have higher device efficiencies than other OLEDs, such as fluorescent OLEDs. Light emitting devices based on electrophosphorescent emitters are described in more detail in WO2000/070655 to Baldo et al., which is incorporated herein by this reference for its teaching of OLEDs, and in particular phosphorescent OLEDs.

An exemplary OLED is represented in FIG. 4 which depicts OLED device 400. Device 400 includes substrate 402, anode 404, HTL 406, EML 408, ETL 410, and cathode 412. EML 408 includes a MADF/phosphorescent donor material and a fluorescent emitter dispersed within a host matrix. In such a case where both the MADF/phosphorescent and fluorescent materials exist within the same layer, care must be taken to avoid direct formation of excitons on the fluorescent emitter (which can only harvest singlet excitons) to ensure that all (100%) or substantially all of the electrogenerated excitons are utilized. On the other hand, the concentration of the fluorescent emitter must be high enough for there to close proximity between the MADF/phosphorescent material and the fluorescent emitter so that rapid transfer from the MADF/phosphorescent donor to the fluorescent emitter can be achieved and direct triplet emission or triplet-triplet annihilation can be avoided.

Another exemplary OLED is represented in FIG. 5, which depicts OLED device 500. Device 500 includes substrate 502, anode 504, HTL 506, EML 508, ETL 510, and cathode 512. EML 508 includes alternating MADF/phosphorescent doped layers 514 and fluorescent doped layers 516. MADF/phosphorescent emitter layer 514 and fluorescent emitter layer 516 alternate and are present in pairs (e.g., n pairs, where n is an integer such as 1, 2, 3, or the like). In FIG. 5, a space is depicted between layer 516 and one of layers 514 for clarity.

In some embodiments, the emissive layer includes n emitter layers including the fluorescent emitter and/or a host, and m donor layers including the MADF/phosphorescent emitter and/or a host, where n and m are integers≥1. In some implementations, n=m, n=m+1, or m=n+1. In one embodiment, each emitter layer is adjacent to at least one donor layer. In one embodiment, each emitter layer and each donor layer further comprise a host. In one embodiment, each host can be the same or different.

In device 500, the thickness and location of the layers must be tuned to ensure that exciton formation primarily occurs in the region that is doped with the MADF material. Furthermore, the region that contains the fluorescent doped layer should be close enough to the exciton formation zone so that the fluorescent emitters are within the distance for FRET to occur.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In one embodiment, the consumer product is selected from the group consisting of a flat panel display, a computer monitor, a medical monitor, a television, a billboard, a light for interior or exterior illumination and/or signaling, a heads-up display, a fully or partially transparent display, a flexible display, a laser printer, a telephone, a cell phone, a tablet, a phablet, a personal digital assistant (PDA), a wearable device, a laptop computer, a digital camera, a camcorder, a viewfinder, a micro-display that is less than 2 inches diagonal, a 3-D display, a virtual reality or augmented reality display, a vehicle, a video wall comprising multiple displays tiled together, a theater or stadium screen, and a sign.

In some embodiments of the emissive region, the emissive region further comprises a host, wherein the host comprises at least one selected from the group consisting of metal complex, triphenylene, carbazole, dibenzothiophene, dibenzofuran, dibenzoselenophene, aza-triphenylene, aza-carbazole, aza-dibenzothiophene, aza-dibenzofuran, and aza-dibenzoselenophene.

The organic layer(s) can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be a triphenylene containing benzo-fused thiophene or benzo-fused furan. Any substituent in the host can be an unfused substituent independently selected from the group consisting of $C_nH_{2n+1}$, $OC_nH_{2n+1}$, $OAr^1$, $N(C_nH_{2n+1})_2$, $N(Ar^1)(Ar^2)$, $CH=CH-C_nH_{2n+1}$, $C\equiv C-C_nH_{2n+1}$, $Ar^1$, $Ar^1-Ar^2$, and $C_nH_{2n}-Ar^1$, or the host has no substitutions. In the preceding substituents n can range from 1 to 10; and $Ar^1$ and $Ar^2$ can be independently selected from the group consisting of benzene, biphenyl, naphthalene, triphenylene, carbazole, and heteroaromatic analogs thereof. The host can be an inorganic compound. For example, a Zn containing inorganic material e.g. ZnS. In some embodiments, the host comprises at least one selected from the group consisting of metal complex, triphenylene, carbazole, dibenzothiophene, dibenzofuran, dibenzoselenophene, aza-triphenylene, aza-carbazole, aza-dibenzothiophene, aza-dibenzofuran, and aza-dibenzoselenophene.

In some embodiments, the emitting dipole of the fluorescent emitter is horizontally oriented. In one embodiment, the ratio of organic dipoles in at least one organic layer is greater than 0.1. In one embodiment, the ratio of organic dipoles in at least one organic layer is greater than 0.2. In one embodiment, the ratio of organic dipoles in at least one organic layer is greater than 0.3. In one embodiment, the ratio of organic dipoles in at least one organic layer is greater than 0.4. In one embodiment, the ratio of organic dipoles in at least one organic layer is greater than 0.5. In one embodiment, the ratio of organic dipoles in at least one organic layer is greater than 0.6. In one embodiment, the ratio of organic dipoles in at least one organic layer is greater than 0.7. In one embodiment, the ratio of organic dipoles in at least one organic layer is greater than 0.8. In one embodiment, the ratio of organic dipoles in at least one organic layer is greater than 0.9.

In one embodiment, the ratio of organic dipoles in at least one organic layer is between about 0.5 and about 0.9. In one embodiment, the ratio of organic dipoles in at least one organic layer is between about 0.6 and about 0.9. In one embodiment, the ratio of organic dipoles in at least one organic layer is between about 0.7 and about 0.8. In one embodiment, the ratio of organic dipoles in at least one organic layer is about 0.75. In one embodiment, the ratio of organic dipoles in at least one organic layer is about 0.8.

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

Non-limiting examples of the conductivity dopants that may be used in an OLED in combination with materials disclosed herein are exemplified below together with references that disclose those materials: EP01617493, EP01968131, EP2020694, EP2684932, US20050139810, US20070160905, US20090167167, US2010288362, WO06081780, WO2009003455, WO2009008277, WO2009011327, WO2014009310, US2007252140, US2015060804, US20150123047, and US2012146012.

A hole injecting/transporting material is not particularly limited, and any compound may be used as long as the compound is typically used as a hole injecting/transporting material. Examples of the material include, but are not limited to: a phthalocyanine or porphyrin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and silane derivatives; a metal oxide derivative, such as $MoO_x$; a p-type semiconducting organic compound, such as 1,4,5,8,9,12-Hexaazatriphenylenehexacarbonitrile; a metal complex, and a cross-linkable compounds.

An electron blocking layer (EBL) may be used to reduce the number of electrons and/or excitons that leave the emissive layer. The presence of such a blocking layer in a device may result in substantially higher efficiencies, and/or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and/or higher triplet energy than one or more of the hosts closest to the EBL interface. In one aspect, the compound used in EBL contains the same molecule or the same functional groups used as one of the hosts described below.

The light emitting layer of the organic EL device preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

One or more additional emitter dopants may be used in conjunction with the compound of the present disclosure. Examples of the additional emitter dopants are not particularly limited, and any compounds may be used as long as the compounds are typically used as emitter materials. Examples of suitable emitter materials include, but are not limited to, compounds which can produce emissions via phosphorescence, fluorescence, thermally activated delayed fluorescence, i.e., TADF (also referred to as E-type delayed fluorescence), triplet-triplet annihilation, or combinations of these processes.

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and/or higher triplet energy than the emitter closest to the HBL interface. In some embodiments, the HBL material has a lower HOMO (further from the vacuum level) and/or higher triplet energy than one or more of the hosts closest to the HBL interface.

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

In any above-mentioned compounds used in each layer of the OLED device, the hydrogen atoms can be partially or fully deuterated. Thus, any specifically listed substituent, such as, without limitation, methyl, phenyl, pyridyl, etc. may be undeuterated, partially deuterated, and fully deuterated versions thereof. Similarly, classes of substituents such as, without limitation, alkyl, aryl, cycloalkyl, heteroaryl, etc. also may be undeuterated, partially deuterated, and fully deuterated versions thereof.

In yet another aspect of the present disclosure, a formulation that comprises the novel compound disclosed herein is described. The formulation can include one or more components selected from the group consisting of a solvent, a host, a hole injection material, hole transport material, and an electron transport layer material, disclosed herein.

EXPERIMENTAL EXAMPLES

The following experimental examples are provided for purposes of illustration only, and are not intended to be limiting unless otherwise specified. Thus, the disclosure should in no way be construed as being limited to the following examples, but rather, should be construed to encompass any and all variations which become evident as a result of the teaching provided herein.

Without further description, it is believed that one of ordinary skill in the art can, using the preceding description and the following illustrative examples, make and utilize the composite materials disclosed herein and practice the claimed methods. The following working examples therefore, specifically point out the preferred embodiments of the present disclosure, and are not to be construed as limiting in any way the remainder of the disclosure.

Example 1: Horizontally Oriented OLEDs

Figure 8:
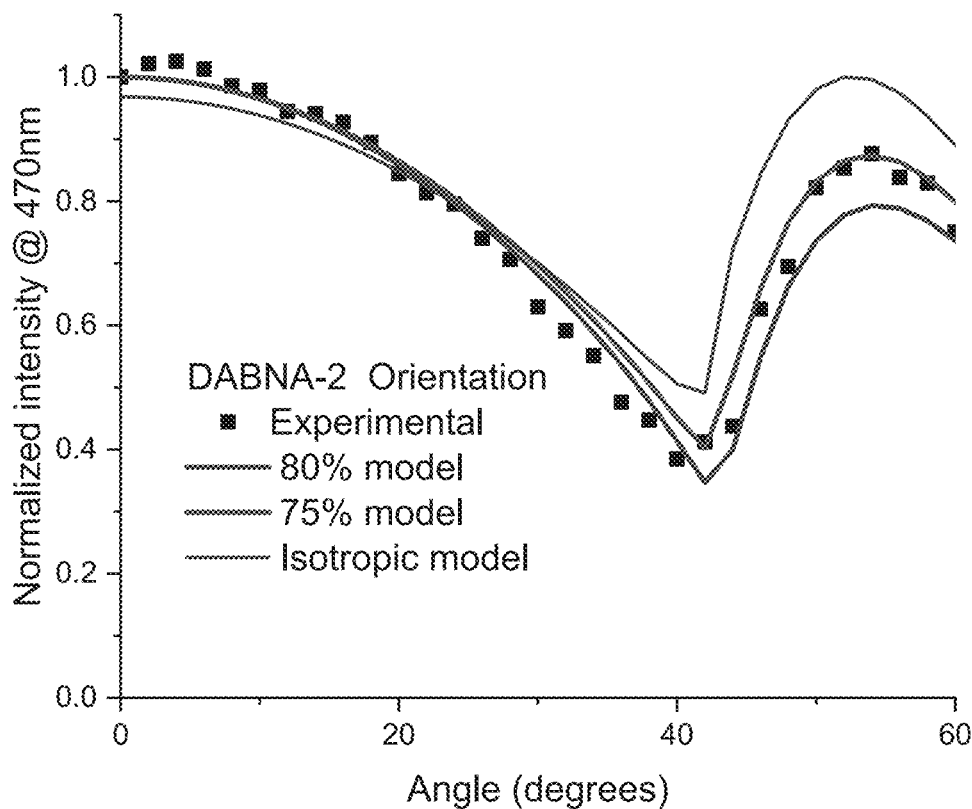
FIG. 8 is a plot of angle-dependent PL intensity of p-polarized light at 470 nm from 25 nm 2%-doped DABNA-2:mCBP film.
Figure 9A:
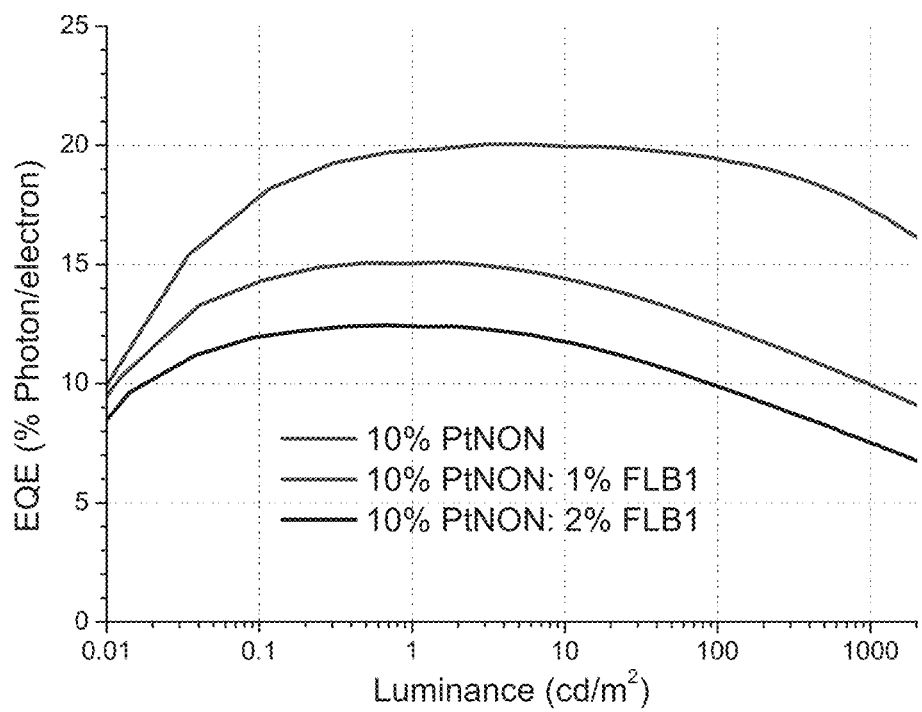
FIGS. 9A to 9D present data for an exemplary organic light emitting device with a general device structure of ITO/HATCN/NPD/TAPc/EML/DPPS/BmPyPB/LiF/Al, where EMLs are (1) 10% PtNON:26mCPy; (2) 10% PtNON:1% FL1:26mCPy and (3) 10% PtNON:2% FL1: 26mCPy.
Figure 9B:
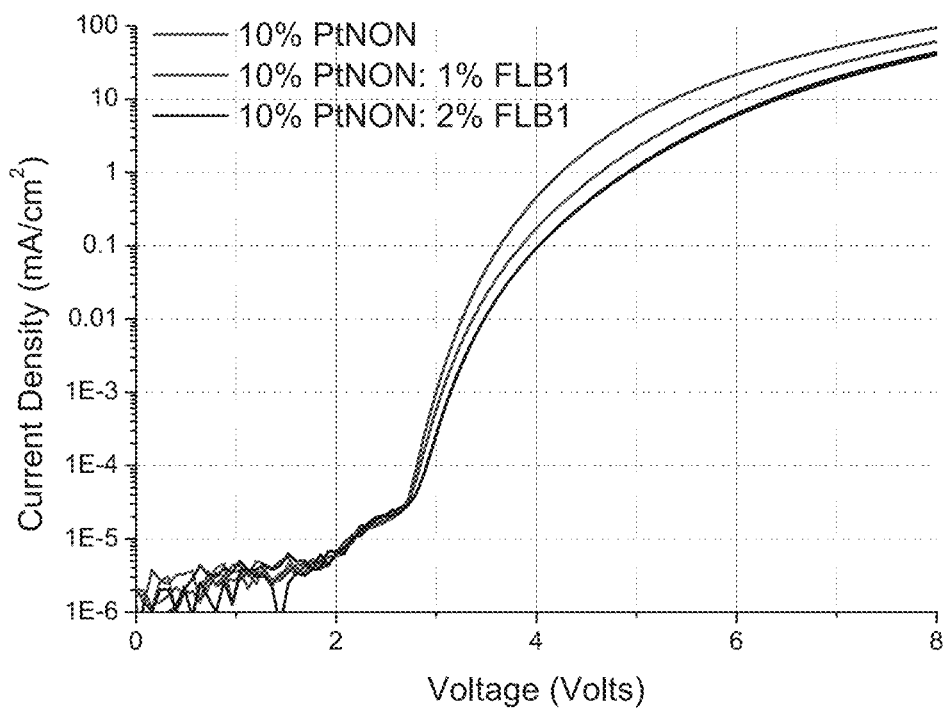
Figure 9C:
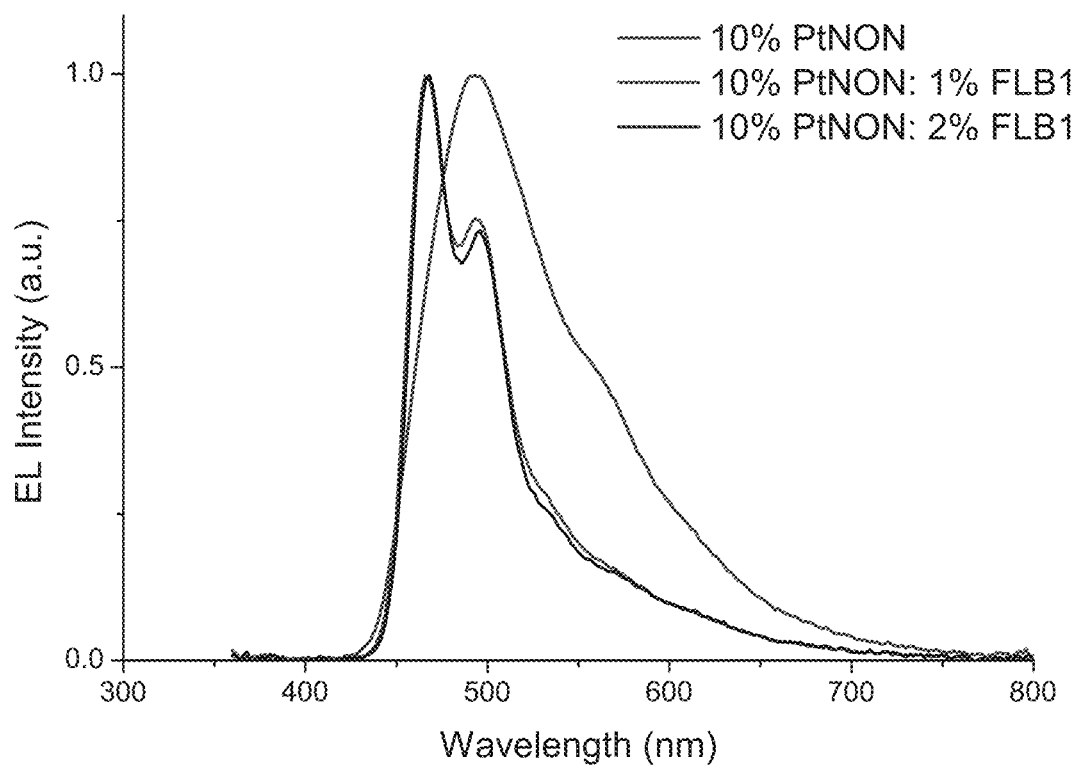
Figure 9D:
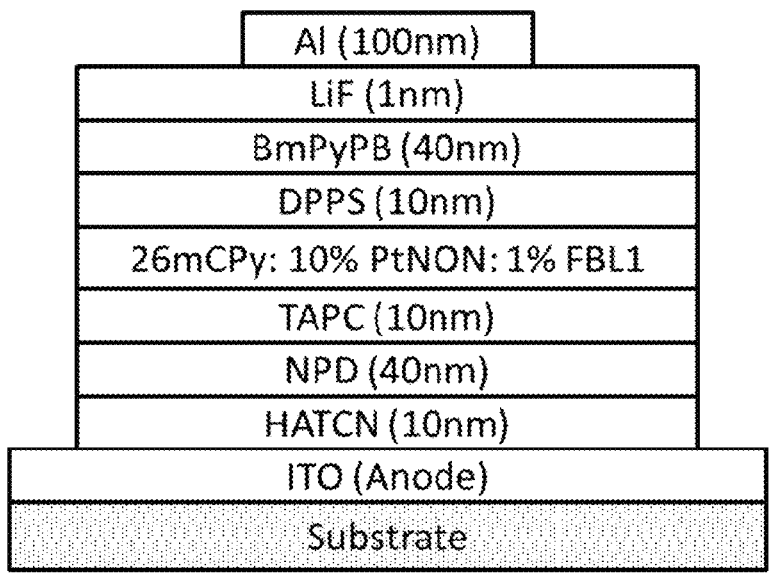
Figure 10A:
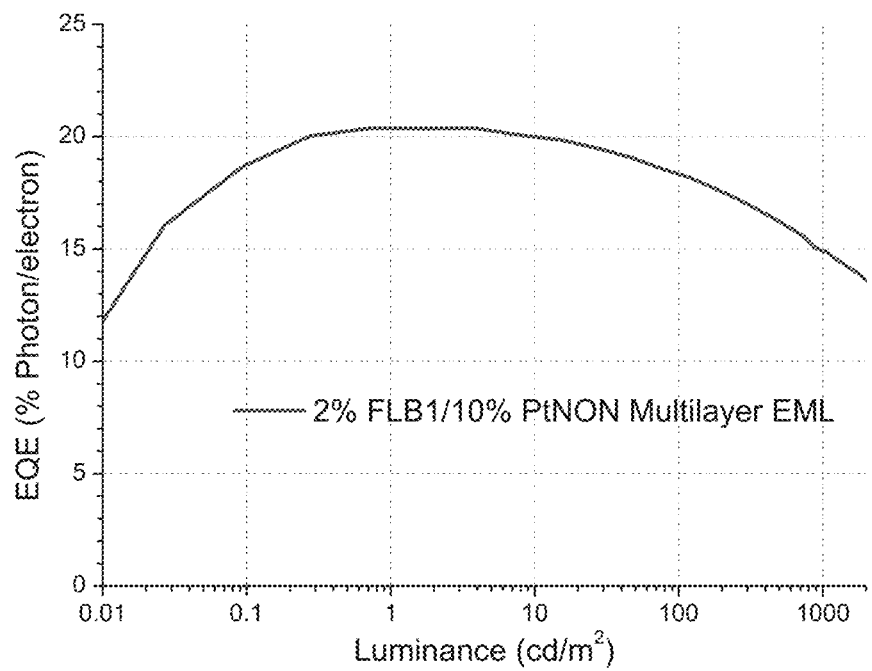
FIGS. 10A to 10D present data for an exemplary organic light emitting device with a general device structure of ITO/HATCN(10 nm)/NPD (40 nm)/TAPC (10 nm)/ 26mCPy:10% PtNON (4 nm)/26mCPy:2% FLB1 (2 nm)/ 26mCPy: 10% PtNON (4 nm)/26mCPy:2% FLB1 (2 nm)/ 26mCPy: 10% PtNON (4 nm)/DPPS (10 nm)/BmPyPB(40 nm)/LiF/Al.
Figure 10B:
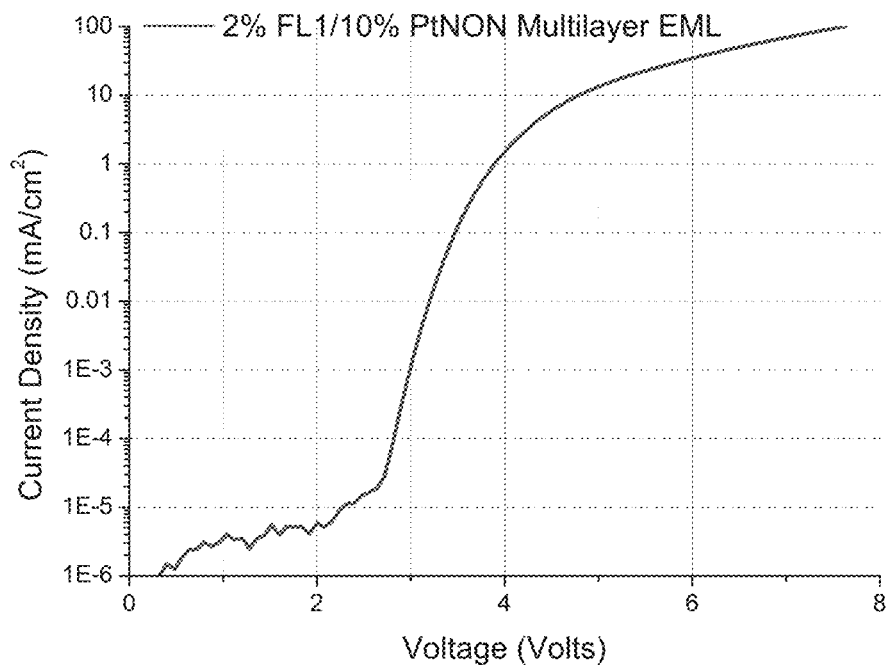
Figure 10C:
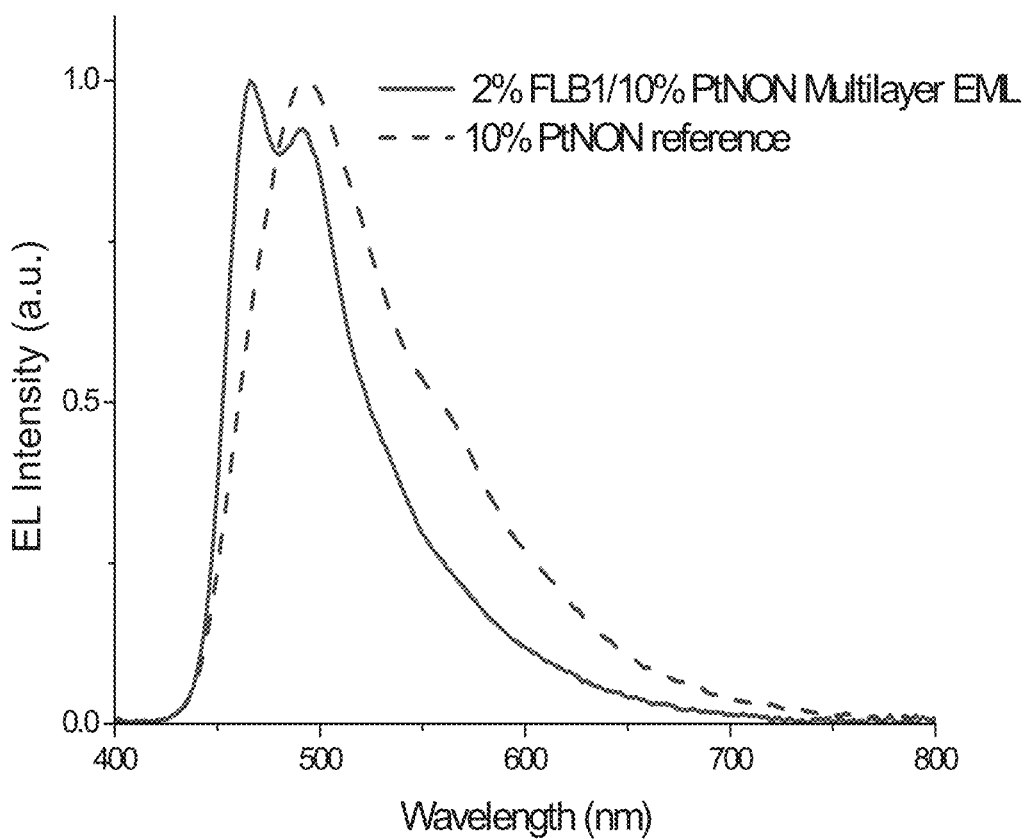
Figure 10D:
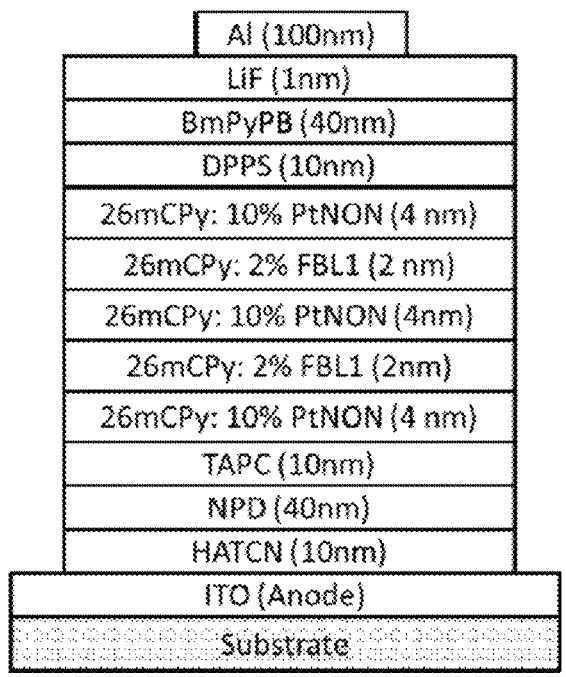

To demonstrate the utility of this disclosure, devices were made for each general structure shown in FIG. 4 and FIG. 5. As suggested in FIG. 5, devices were fabricated in the structure ITO/HATCN/NPD/Tris-PCz/EML/mCBT/BPyTP/LiF/Al, where EMLs are (1) 20% PtNON:mCBP (5 nm)/10% PtNON:mCBP (5 nm)/5% PtNON:mCBP (5 nm); (2) 20% PtNON:mCBP (5 nm)/2% DABNA-2:mCBP (2 nm)/10% PtNON:mCBP (5 nm)/2% DABNA-2:mCBP (2 nm)/5% PtNON:mCBP (5 nm). As illustrated in FIGS. 7A to 7D, preliminary data indicated that PtNON emitter can have a very efficient energy transfer to DABNA-2 and such device structure can efficiently utilize the triplet excitons as well. More encouragingly, the device efficiency is also increased due to high PL efficiency and preferred horizontally aligned fluorescent emitter DABNA-2 (indicated in FIG. 8).

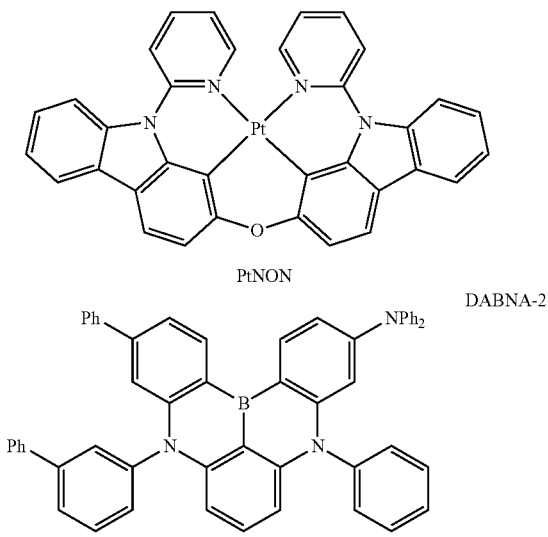

PtNON

DABNA-2

Example 2

The second system of selected materials for the demonstration of this disclosure is the use of a t-butyl-perylene based fluorescent emitter (FLB1) and the phosphorescent platinum emitter PtNON. These materials are selected due to the high PLQY for each and favorable overlap between the PtNON emission spectrum, with emission onset as low as 430 nm, and the absoption spectrum of FLB1. Furthermore, the advantage of the emission onset of PtNON at a much higher energy than the room temperature peak emission wavelength (~500 nm) and the fact that there is very little stokes shift in the FLB1 emitter will result in an emission primarily from the fluorescent emitter that is remarkably bluer than that of the phosphorescent emitter alone. Further materials optimization of a narrow blue emitters may further enhance this effect.

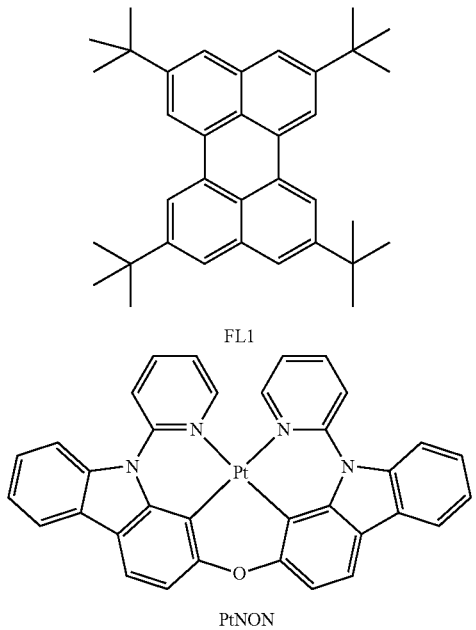

FL1

PtNON

Devices were made for each general structure shown in FIG. 4 and FIG. 5. For the first case (FIG. 4) devices were fabricated in the structure ITO/HATCN(10 nm)/NPD (40 nm)/TAPC (10 nm)/26mCPy: 10% PtNON:x % FLB1 (25 nm)/DPPS (10 nm)/BmPyPB(40 nm)/LiF/Al where HATCN is 1,4,5,8,9,11-hexaazatriphenylene-hexacarbonitrile, NPD is N,N'-diphyenyl-N,N'-bis(1-naphthyl)-1,1'-biphenyl-4,4"-diamine, TAPC is di-[4-(N,N-di-toylyl-amino)-phyenyl]cyclohexane, 26mCPy is 2,6-bis(N-carbazolyl) pyridine, DPPS is diphenyl-bis[4-(pyridin-3-yl)phenyl]silane, and BmPyPB is 1,3-bis[3,5-di(pyridin-3-yl)phenyl]benzene.

As shown in FIGS. 9A to 9D, when PtNON devices were doped with a small amount of FLB1 (1% or 2%) the emission originated nearly exclusively from the fluorescent emitter. Furthermore, the moderate external quantum efficiencies (EQE) of 10-15% indicate that a large portion of the electrogenerated excitons are being harvested, assuming a 100% electron to photon conversion efficiency corresponds to an EQE of 20-30° % due to outcoupling losses. When considering both of these results, it is clear that exciton are being formed on the phosphorescent PtNON molecules, as evidenced by the high efficiencies, which then transfer to the fluorescent FLB1 emitter via FRET as evidenced by the nearly exclusive fluorescent emission. It also appears that there is a crucial control over the FLB1 necessary since the efficiency drops rapidly with increasing concentration. This is attributed to the direct formation of excitons on the fluorescent dopant, possibly due to charge trapping as suggested by the change in current-voltage characteristics although other mechanisms for losses may exist.

To circumvent any potential tradeoff between high FRET efficiency and efficiency losses from direct exciton formation on FLB1 molecules, the second strategy (FIG. 4) was developed. Devices were fabricated in the structure ITO/HATCN(10 nm)/NPD (40 nm)/TAPC (10 nm)/26mCPy: 10% PtNON (4 nm)/26mCPy:2% FLB1 (2 nm)/26mCPy: 10% PtNON (4 nm)/26mCPy:2% FLB1 (2 nm)/26mCPy: 10% PtNON (4 nm)/DPPS (10 nm)/BmPyPB(40 nm)/LiF/Al. In this structure, alternating phosphorescent and fluorescent doped layers were used. This order was selected so that the recombination zone, which typically resides near one of the charge blocking layers due to potential charge imbalances, is located on the PtNON doped layer so that the majority of the excitons are formed on the PtNON molecules which can harvest 100% of the electrogenerated excitons. The layer thicknesses were also kept low so that there was a sufficiently small distance between the phosphorescent material and the fluorescent emitters so that rapid FRET could occur. As shown in FIG. 10A to 10D, this device showed much higher efficiency over 20% while still exhibiting emission primarily originating from the fluorescent emitter indicating the utility of the devices/compositions disclosed herein to manipulate the emission spectrum and emit nearly exclusively from fluorescent emitters while maintaining a high efficiency.

The disclosures of each and every patent, patent application, and publication cited herein are hereby incorporated herein by reference in their entirety. While this disclosure refers to specific embodiments, it is apparent that other embodiments and variations of this disclosure may be devised by others skilled in the art without departing from the true spirit and scope of the disclosure. The appended claims are intended to be construed to include all such embodiments and equivalent variations.

I claim:

1. An organic light emitting device (OLED) comprising:
an anode;
a cathode; and
at least one organic layer disposed between the anode and the cathode;
wherein the at least one organic layer includes a triplet emitter and a fluorescent emitter
wherein the ratio of organic dipoles in the at least one organic layer is greater than 0.7.

2. The OLED of claim 1, wherein the triplet emitter and a fluorescent emitter exist in a single layer which further comprises a host matrix.

3. The OLED of claim 1, wherein the at least one organic layer is an emissive layer comprising n emitter layers including the fluorescent emitter, and m donor layers including the triplet emitter;
wherein n and m are integers;
wherein each emitter layer is adjacent to at least one donor layer;
wherein each emitter layer and each donor layer further comprise a host; and
wherein each host can be the same or different.

4. The OLED of claim 3, wherein n=m, n=m+1, or m=n+1.

5. The OLED of claim 3, wherein the triplet emitter is a compound having Formula I or Formula II;

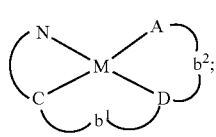
Formula I

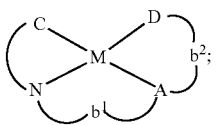
Formula II wherein A is an accepting group comprising one or more of the following structures, which can optionally be substituted:

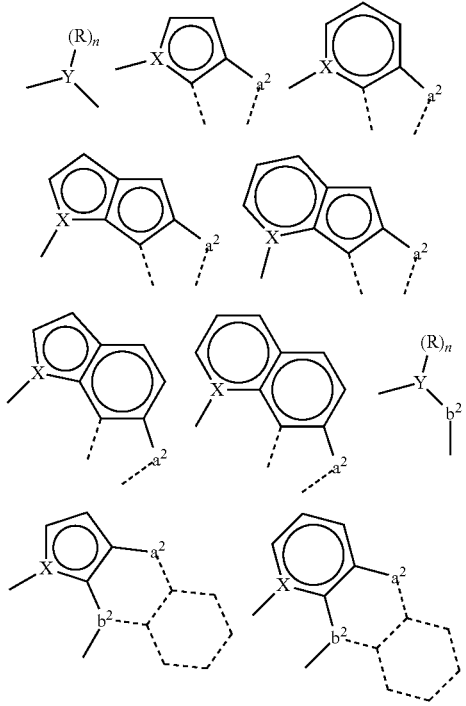

wherein D is a donor group comprising of one or more of the following structures, which can optionally be substituted:

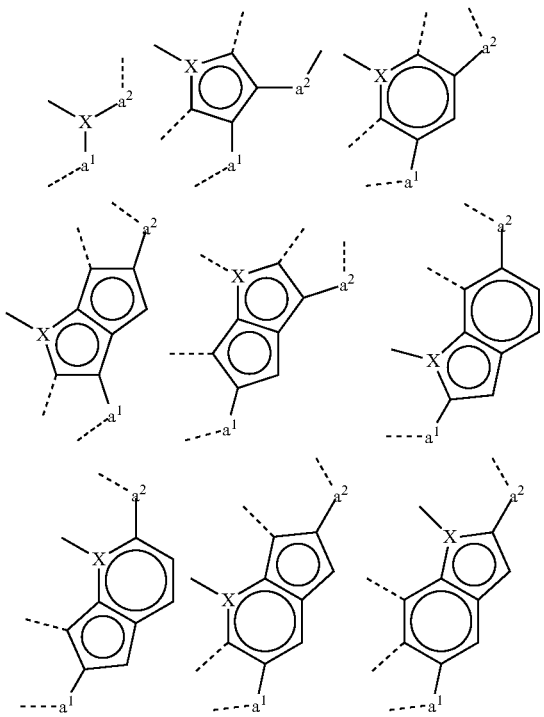

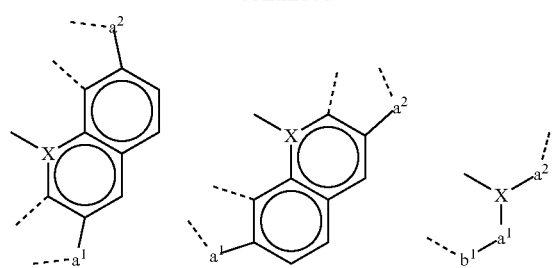

-continued
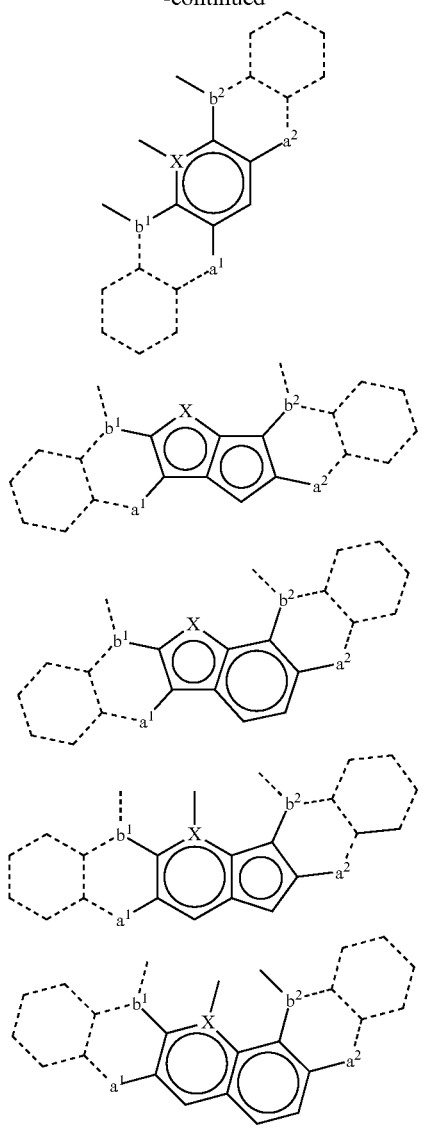
wherein C in Formula I or Formula II comprises one or more of the following structures, which can optionally be substituted:
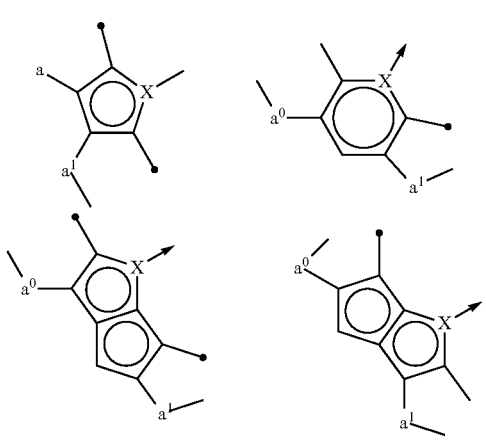
-continued
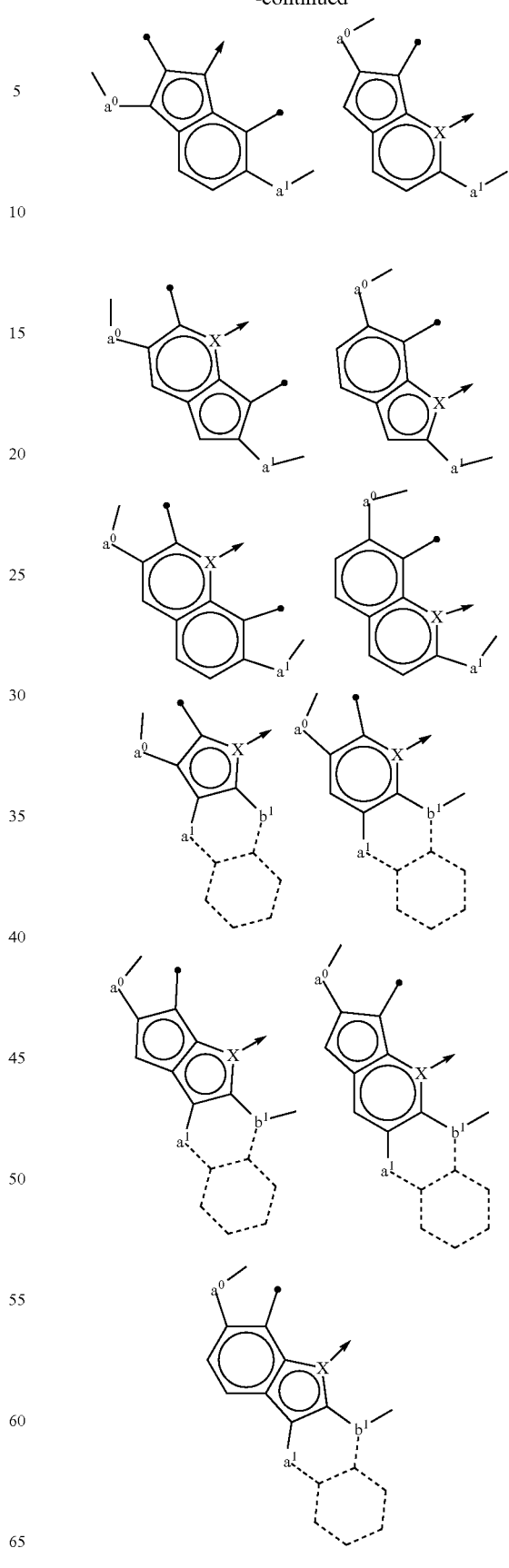

-continued

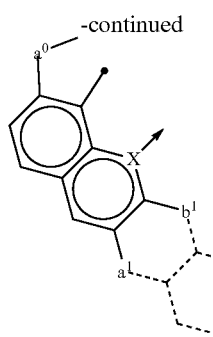

wherein N in Formula I or II comprises one or more of the following structures, which can optionally be substituted:

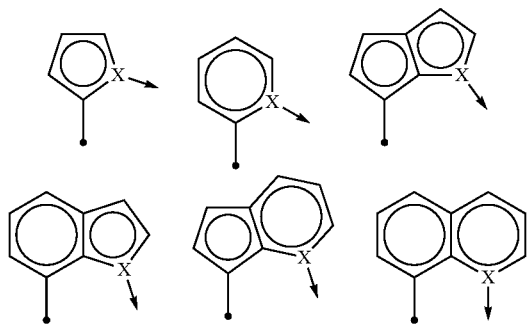

wherein each of $a^0$, $a^1$, and $a^2$ independently is present or absent, and if present, comprises a direct bond and/or linking group comprising one or more of the following:

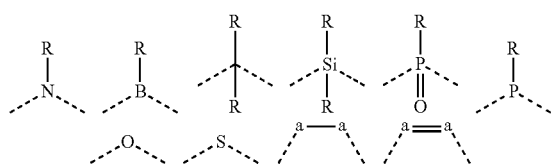

wherein each occurrence of a is independently substituted or unsubstituted N or substituted or unsubstituted C;
wherein $b^1$ and $b^2$ independently is present or absent, and if present, comprises a linking group comprising one or more of the following:

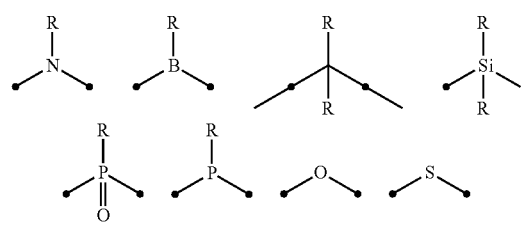

wherein each occurrence of X is independently B, C, N, O, Si, P, S, Ge, As, Se, Sn, Sb, or Te;
wherein Y is O, S, S=O, $SO_2$, Se, N, $NR^3$, $PR^3$, RP=O, $CR^1R^2$, C=O, SiR'$R^2$, GeR'$R^2$, BH, P(O)H, PH, NH, $CR^1H$, $CH_2$, $SiH_2$, $SiHR^1$, BH, or $BR^3$, wherein each of R, $R^1$, $R^2$, and $R^3$ independently is hydrogen, aryl, cycloalkyl, cycloalkenyl, heterocyclyl, heteroaryl, alkyl, alkenyl, alkynyl, deuterium, halogen, hydroxyl, thiol, nitro, cyano, amino, a mono- or dialkylamino, a mono- or diaryl amino, alkoxy, aryloxy, haloalkyl, aralkyl, ester, nitrile, isonitrile, alkoxycarbonyl, acylamino, alkoxycarbonylamino, aryloxycarbonylamino, sulfonylamino, sulfamoyl, carbamoyl, alkylthio, sulfinyl, ureido, phosphoramide, mercapto, sulfo, carboxyl, hydrazino, substituted silyl, or polymerizable, or any conjugate or combination thereof,
wherein n is a number that satisfies the valency of Y; and
wherein M is platinum, palladium, nickel, manganese, zinc, gold, silver, copper, iridium, rhodium, and/or cobalt.

6. The OLED of claim 5, wherein $a^2$ is absent in Formula I.

7. The OLED of claim 5, wherein $a^2$ and $b^2$ are absent in Formula I or Formula II.

8. The OLED of claim 5, wherein A is

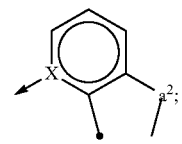

$a^2$ and $b^2$ are absent; and
D is

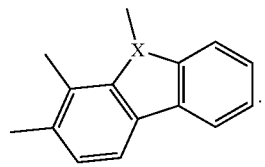

9. The OLED of claim 5, wherein C in Formula I or Formula II is

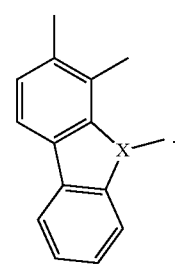

10. The OLED of claim 5, wherein N in Formula I or Formula II is substituted or unsubstituted

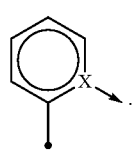

11. The OLED of claim 5, wherein the compound having Formula I or Formula II is a compound having Formula III or Formula V;

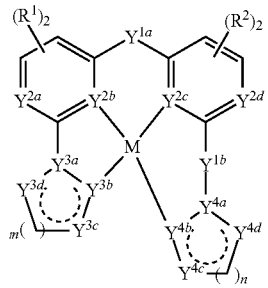

Formula III wherein M is Ir, Rh, Mn, Ni, Cu, or Ag;

wherein each of $R^1$ and $R^2$ independently are hydrogen, substituted or unsubstituted alkyl, alkenyl, alkynyl, aryl, heteroaryl, cycloalkane, cycloalkane, heterocyclyl, amino, nitro hydroxyl, halogen, thio, alkoxy, haloalkyl, arylalkane, or arylalkene;

wherein each of $Y^{1a}$ and $Y^{1b}$ independently is O, $NR^2$, $CR^2R^3$, S, $AsR^2$, $BR^2$, $PR^2$, $P(O)R^2$, or $SiR^2R^3$, or a combination thereof, wherein each of $R^2$ and $R^3$ independently is hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, arylalkene, or $R^2$ and $R^3$ together form C=O, wherein each of $R^2$ and $R^3$ independently is optionally linked to an adjacent ring structure, thereby forming a cyclic structure;

wherein each of $Y^{2a}$, $Y^{2b}$, $Y^{2c}$ and $Y^{2d}$ independently is N or $CR^{6a}$, wherein $R^{6a}$ is hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, or arylalkene;

each of $Y^{3a}$, $Y^{3b}$, $Y^{3c}$, $Y^{3d}$, $Y^{4a}$, $Y^{4b}$, $Y^{4c}$ and $Y^{4d}$ independently is N, O, S, $NR^{6a}$, $CR^{6b}$, or $Z(R^{6c})_2$, wherein each of $R^{6a}$ and $R^{6b}$ is independently hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, or arylalkene; wherein Z is C or Si, and wherein each $R^{6c}$ independently is hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, or arylalkene;

wherein each of m and n independently is an integer of 1 or 2;

wherein each of

independently is partial or full unsaturation of the ring with which it is associated;

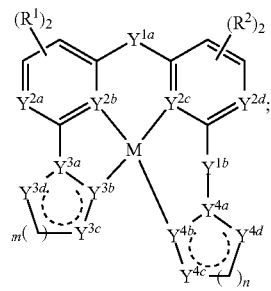

Formula V wherein M is Pt, Pd, Au, Ag;

wherein each of $R^1$ and $R^2$ independently are hydrogen, substituted or unsubstituted alkyl, alkenyl, alkynyl, aryl, heteroaryl, cycloalkane, cycloalkane, heterocyclyl, amino, nitro hydroxyl, halogen, thio, alkoxy, haloalkyl, arylalkane, or arylalkene;

wherein one of $Y^{1a}$ and $Y^{1b}$ is $B(R^2)_2$ and the other of $Y^{1a}$ and $Y^{1b}$ is O, $NR^2$, $CR^2R^3$, S, $AsR^2$, $BR^2$, $PR^2$, $P(O)R^2$, or $SiR^2R^3$, or a combination thereof, wherein each of $R^2$ and $R^3$ independently is hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, arylalkene, or $R^2$ and $R^3$ together form C=O, wherein each of $R^2$ and $R^3$ independently is optionally linked to an adjacent ring structure, thereby forming a cyclic structure;

wherein each of $Y^{2a}$, $Y^{2b}$, $Y^{2c}$ and $Y^{2d}$ independently is N or $CR^{6a}$, wherein $R^{6a}$ is hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, or arylalkene;

wherein each of $Y^{3a}$, $Y^{3b}$, $Y^{3c}$, $Y^{3d}$, $Y^{4a}$, $Y^{4b}$, $Y^{4c}$, and $Y^{4d}$ independently is N, O, S, $NR^{6a}$, $CR^{6b}$, or $Z(R^{6c})_2$, wherein each of $R^{6a}$ and $R^{6b}$ is independently hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, or arylalkene; wherein Z is C or Si, and wherein each $R^{6c}$ independently is hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, or arylalkene;

wherein each of m and n independently are an integer 1 or 2;

wherein each of

independently is partial or full unsaturation of the ring with which it is associated.

12. The OLED of claim 5, wherein the compound having Formula I or Formula II is a compound having Formula IV;

Formula IV

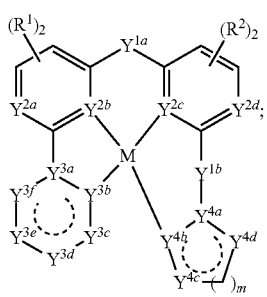

wherein M is Pt, Pd and Au;

wherein each of $R^1$ and $R^2$ independently is hydrogen, substituted or unsubstituted alkyl, alkenyl, alkynyl, aryl, heteroaryl, cycloalkane, cycloalkane, heterocyclyl, amino, nitro hydroxyl, halogen, thio, alkoxy, haloalkyl, arylalkane, or arylalkene;

wherein each of $Y^{1a}$ and $Y^{1b}$ independently is O, $NR^2$, $CR^2R^3$, S, $AsR^2$, $BR^2$, $PR^2$, $P(O)R^2$, or $SiR^2R^3$, or a combination thereof, wherein each of $R^2$ and $R^3$ independently is hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, arylalkene, or $R^2$ and $R^3$ together form C=O, wherein each of $R^2$ and $R^3$ independently is optionally linked to an adjacent ring structure, thereby forming a cyclic structure;

wherein each of $Y^{2a}$, $Y^{2b}$, $Y^{2c}$, and $Y^{2d}$ independently is N or $CR^{6b}$, wherein $R^{6a}$ is hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, or arylalkene;

wherein each of $Y^{3a}$, $Y^{3b}$, $Y^{3c}$, $Y^{3d}$, $Y^{3e}$, $Y^{3f}$, $Y^{4a}$, $Y^{4b}$, $Y^{4c}$ and $Y^{4d}$ independently is N, O, S, $NR^{6a}$, $CR^{6b}$, or $Z(R^{6c})_2$, where in each of $R^{6a}$ and $R^{6b}$ is independently hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, or arylalkene; wherein Z is C or Si, and wherein each $R^{6c}$ independently is hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, or arylalkene;

wherein each of m is an integer of 1 or 2; and wherein each of independently is partial or full unsaturation of the ring with which it is associated.

13. The OLED of claim 5, wherein the compound having Formula I or Formula II is a compound having Formula VI;

Formula VI

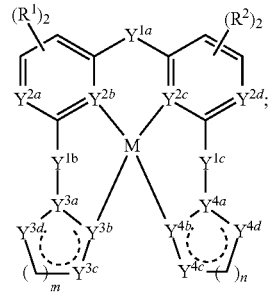

wherein M is Pt, Pd, Ir, Rh, or Au;

wherein each of $R^1$ and $R^2$ independently are hydrogen, substituted or unsubstituted alkyl, alkenyl, alkynyl, aryl, heteroaryl, cycloalkane, cycloalkane, heterocyclyl, amino, nitro hydroxyl, halogen, thio, alkoxy, haloalkyl, arylalkane, or arylalkene;

wherein each of $Y^{1a}$ $Y^{1b}$ and $Y^{1c}$ independently is O, $NR^2$, $CR^2R^3$, S, $AsR^2$, $BR^2$, $PR^2$, $P(O)R^2$, or $SiR^2R^3$, or a combination thereof, wherein each of $R^2$ and $R^3$ independently is hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, arylalkene, or $R^2$ and $R^3$ together form C=O, wherein each of $R^2$ and $R^3$ independently is optionally linked to an adjacent ring structure, thereby forming a cyclic structure;

wherein each of $Y^{2a}$, $Y^{2b}$, $Y^{2c}$, and $Y^{2d}$ independently is N, $NR^{6a}$, or $CR^{6b}$, wherein each of $R^{6a}$ and $R^{6b}$ independently is hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, or arylalkene;

wherein each of $Y^{3a}$, $Y^{3b}$, $Y^{3c}$, $Y^{3d}$, $Y^{3e}$, $Y^{4a}$, $Y^{4b}$, $Y^{4c}$, and $Y^{4d}$ independently is N, O, S, $NR^{6a}$, $CR^{6b}$, or $Z(R^{6c})_2$, wherein each of $R^{6a}$ and $R^{6b}$ is independently hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, or arylalkene; wherein Z is C or Si, and wherein each $R^{6c}$ independently is hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, or arylalkene;

wherein each of m and n independently are an integer 1 or 2;

wherein each of independently is partial or full unsaturation of the ring with which it is associated.

14. The OLED of claim 5, wherein the compound having Formula I or Formula II is a compound having Formula VII;

Formula VII

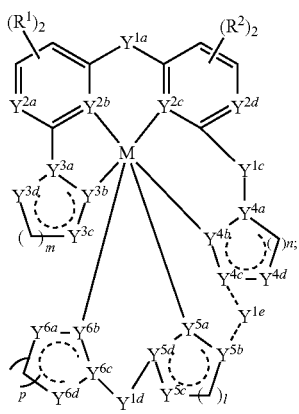

wherein M comprises Ir, Rh, Pt, Os, Zr, Co or Ru;
wherein each of $R^1$ and $R^2$ independently are hydrogen, substituted or unsubstituted alkyl, alkenyl, alkynyl, aryl, heteroaryl, cycloalkane, cycloalkane, heterocyclyl, amino, nitro hydroxyl, halogen, thio, alkoxy, haloalkyl, arylalkane, or arylalkene;
wherein each of $Y^{1a}$, $Y^{1c}$ and $Y^{1d}$ independently is O, $NR^2$, $CR^2R^3$, S, $AsR^2$, $BR^2$, $PR^2$, $P(O)R^2$, or $SiR^2R^3$, or a combination thereof, wherein each of $R^2$ and $R^3$ independently is hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, arylalkene, or $R^2$ and $R^3$ together form C=O, wherein each of $R^2$ and $R^3$ independently is optionally linked to an adjacent ring structure, thereby forming a cyclic structure;
wherein $Y^{1e}$ is present or not present; wherein when $Y^{1e}$ is present, $Y^{1e}$ represents O, $NR^2$, $CR^2R^3$, S, $AsR^2$, $BR^2$, $PR^2$, $P(O)R^2$, or $SiR^2R^3$, or a combination thereof; wherein each of $R^2$ and $R^3$ independently is hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, arylalkene, or $R^2$ and $R^3$ together form C=O, wherein each of $R^2$ and $R^3$ independently is optionally linked to an adjacent ring structure, thereby forming a cyclic structure; wherein when $Y^{1e}$ is not present, $Y^{1e}$ represents no bond;
wherein each of $Y^{2a}$, $Y^{2b}$, $Y^{2c}$, and $Y^{2d}$ independently is N or $CR^{6a}$, wherein $R^{6a}$ is hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, or arylalkene;
wherein each of $Y^{3a}$, $Y^{3b}$, $Y^{3c}$, $Y^{3d}$, $Y^{3e}$, $Y^{4a}$, $Y^{4b}$, $Y^{4c}$, and $Y^{4d}$ independently is N, O, S, $NR^{6a}$, $CR^{6b}$, or $Z(R^{6c})_2$, wherein each of $R^{6a}$ and $R^{6b}$ is independently hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, or arylalkene; wherein Z is C or Si, and wherein each $R^{6c}$ independently is hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, or arylalkene;
wherein in each of each of $Y^{5a}$, $Y^{5b}$, $Y^{5c}$, $Y^{5d}$, $Y^{6a}$, $Y^{6b}$, $Y^{6c}$, and $Y^{6d}$ independently is N, O, S, $NR^{6a}$, or $CR^{6b}$;

wherein each of m, n, l and p independently is an integer of 1 or 2;
wherein each of

independently is partial or full unsaturation of the ring with which it is associated.

15. The OLED of claim 1, wherein the fluorescent emitter is selected from the following:

1. Aromatic Hydrocarbons and Their Derivatives

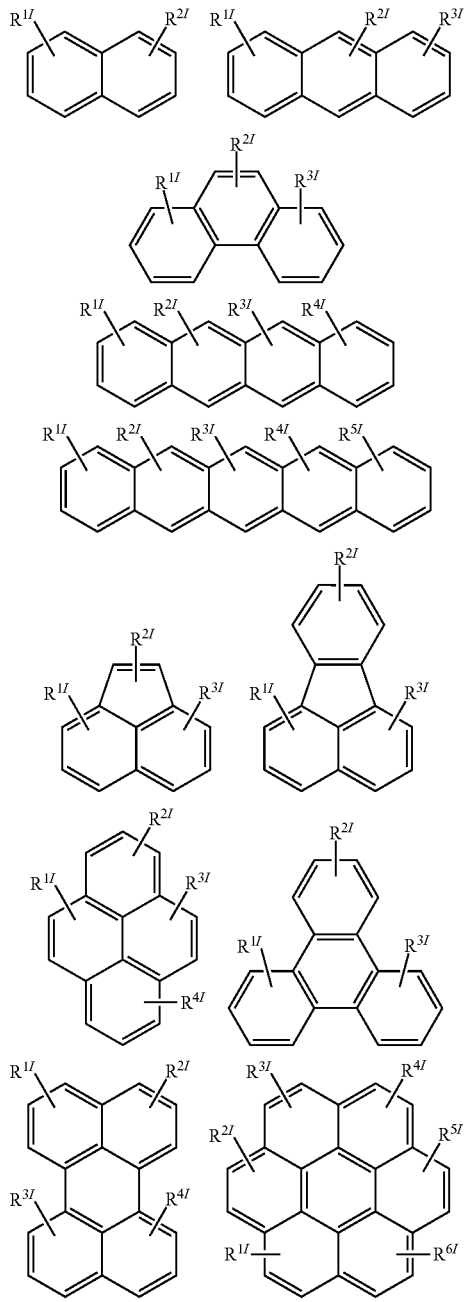

-continued
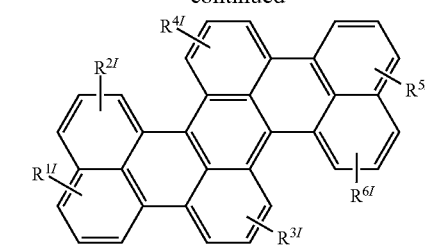
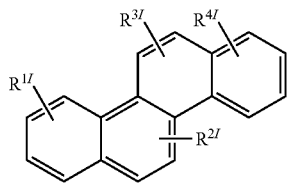
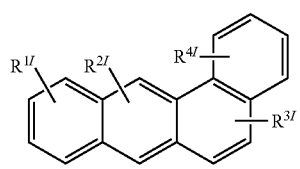
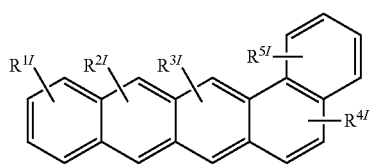
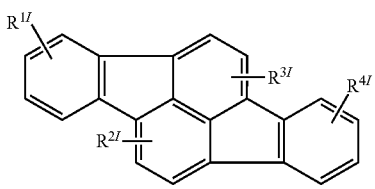
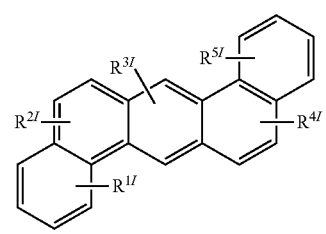
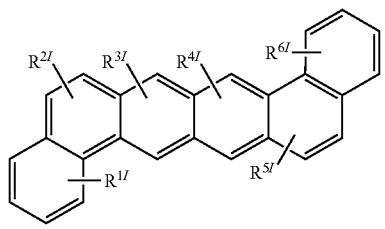
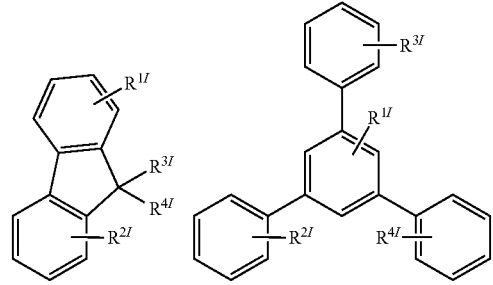
-continued
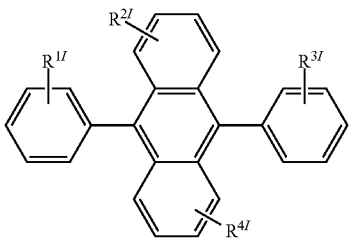
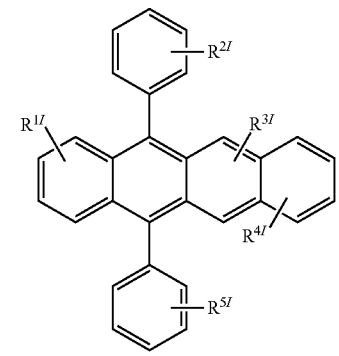
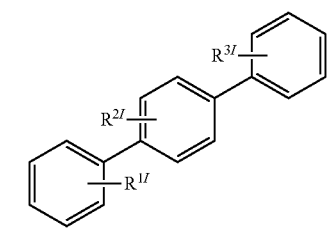
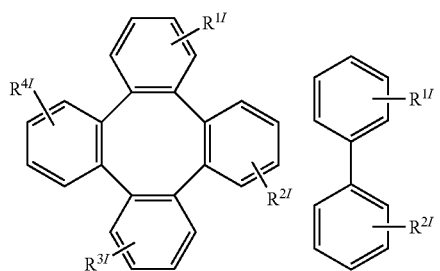
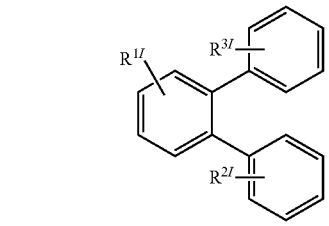
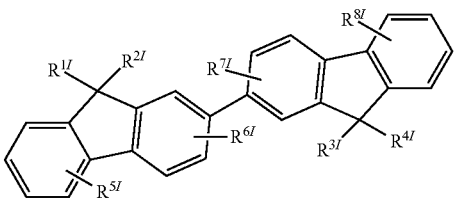

95
-continued
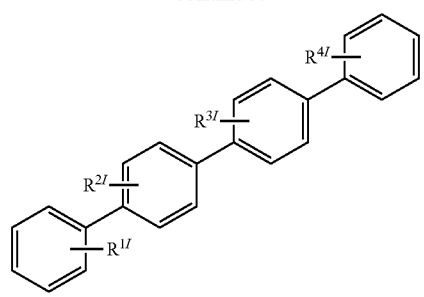
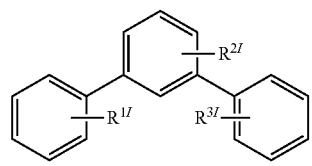
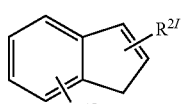
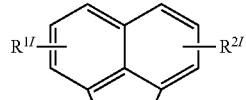
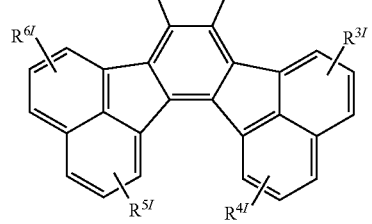
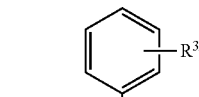
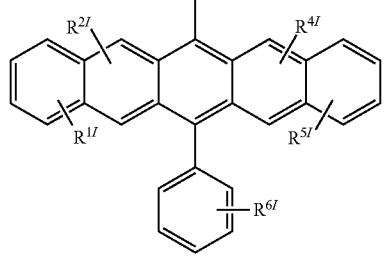
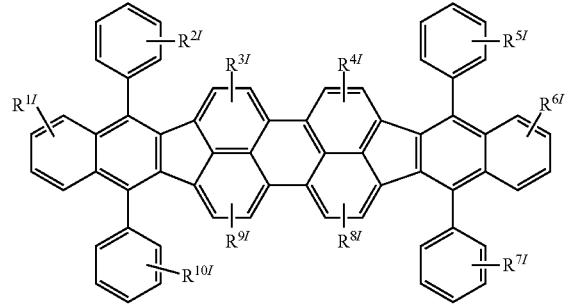
96
-continued
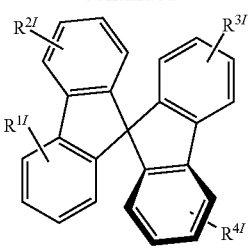
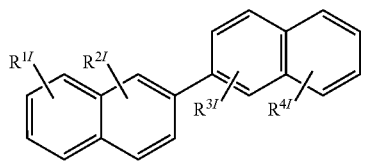
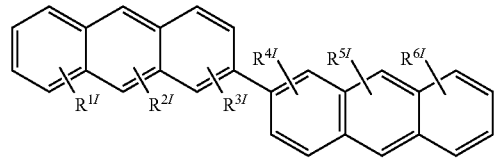
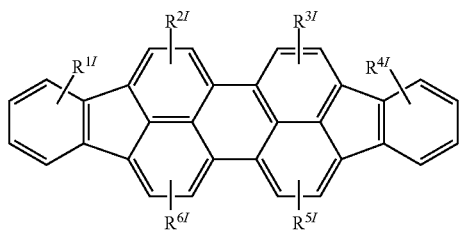
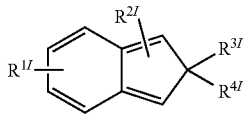
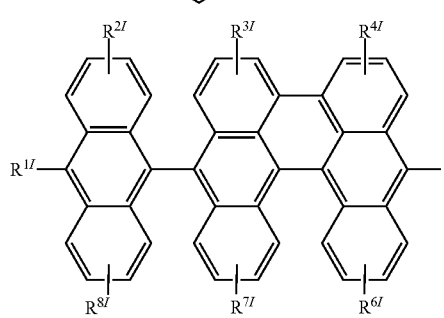
2. Arylethylene, Arylacetylene and Their Derivatives
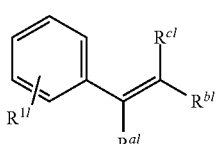 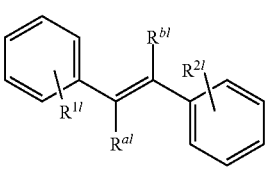
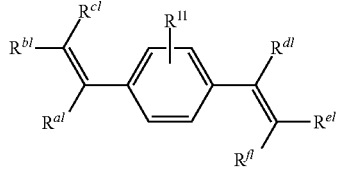

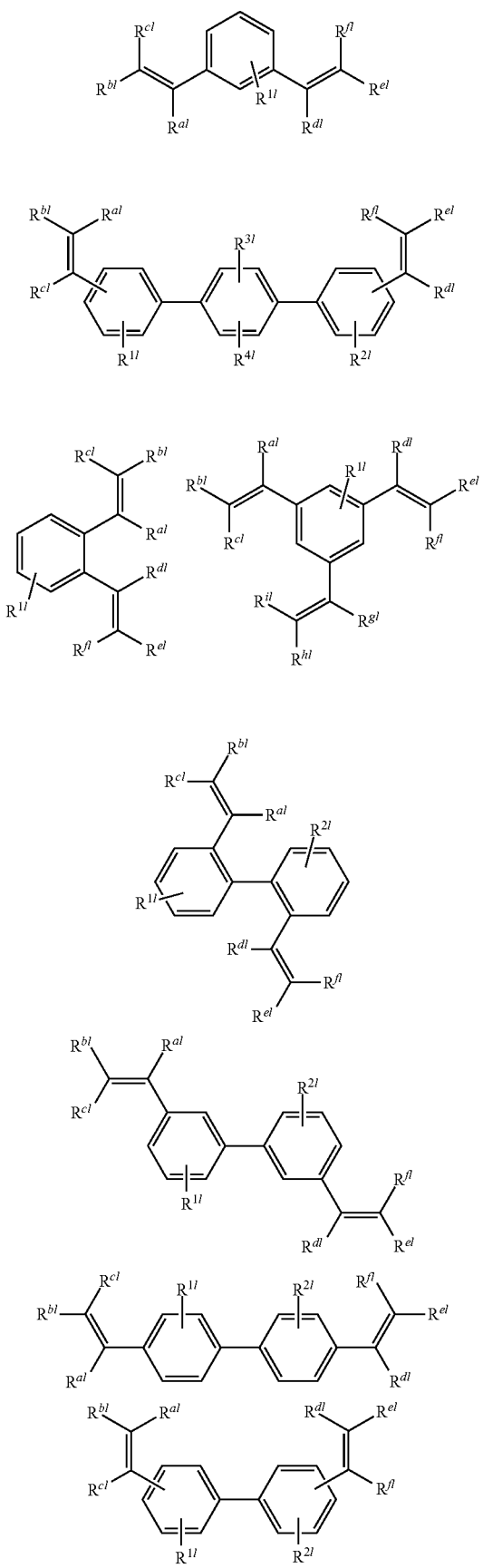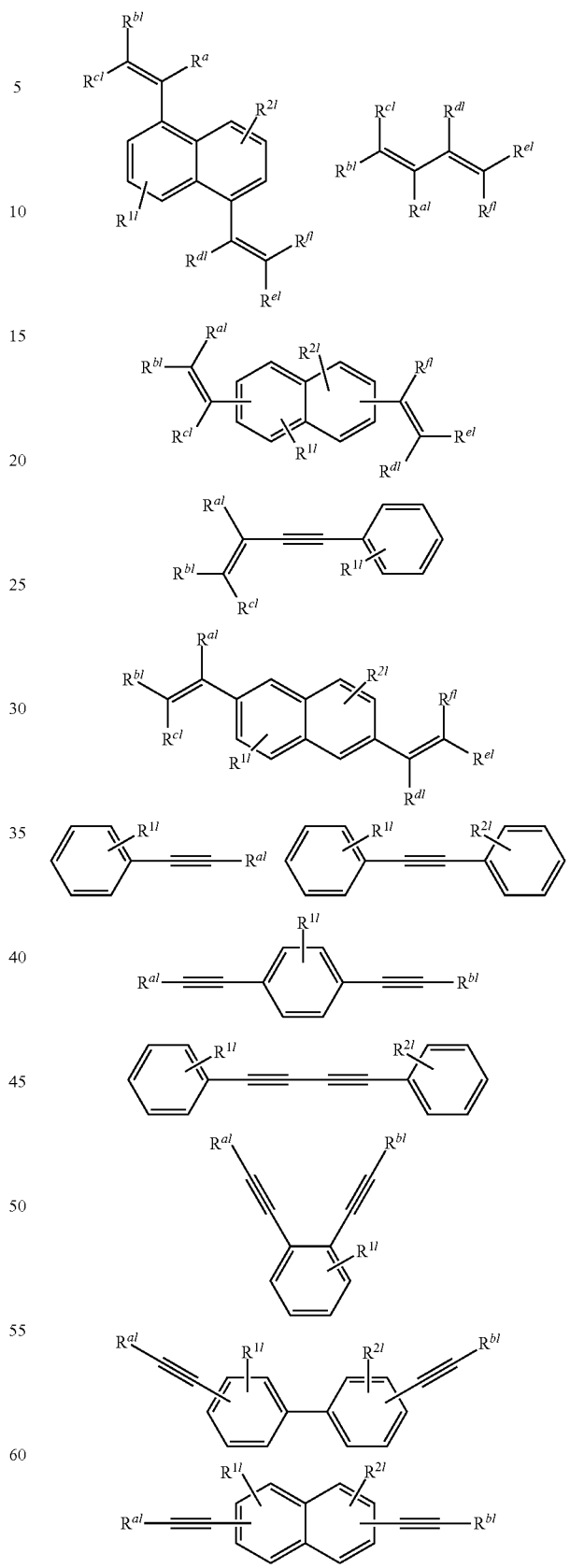

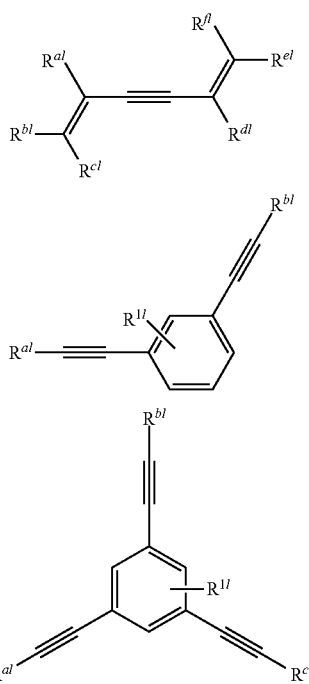
wherein $R^{al}$, $R^{bl}$, $R^{cl}$, $R^{dl}$, $R^{el}$, $R^{fl}$, $R^{gl}$, $R^{hl}$, and $R^{il}$ can be one of the following structure:
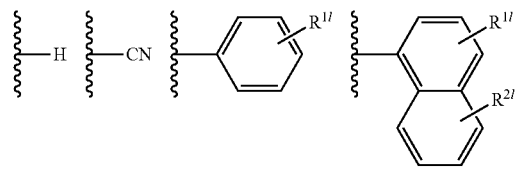
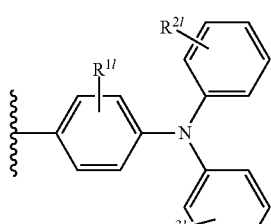
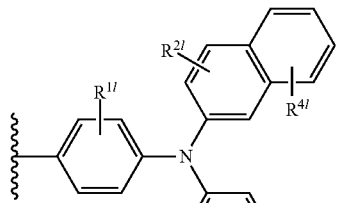
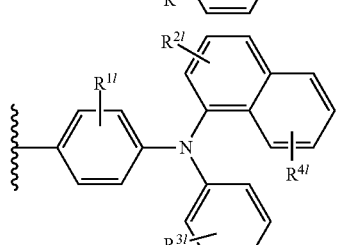
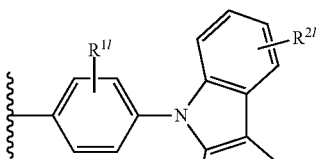
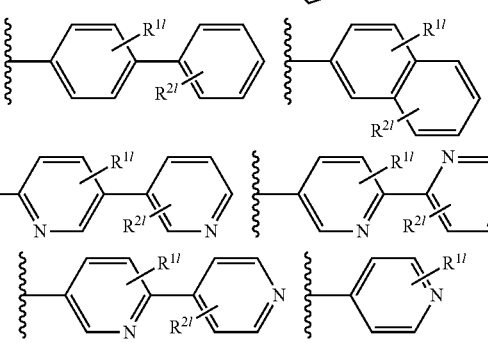
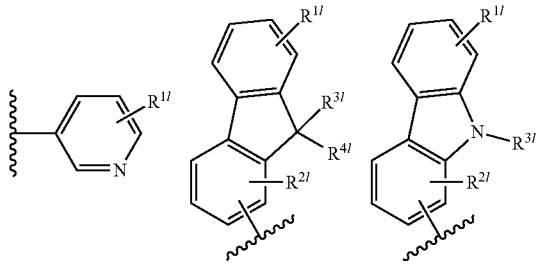
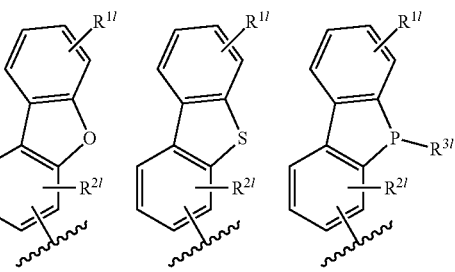
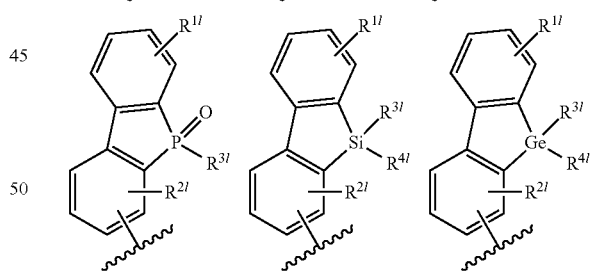
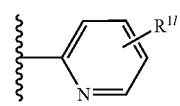
3. Heterocyclic Compounds and Their Derivatives
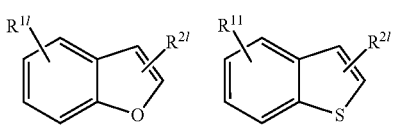

101
-continued
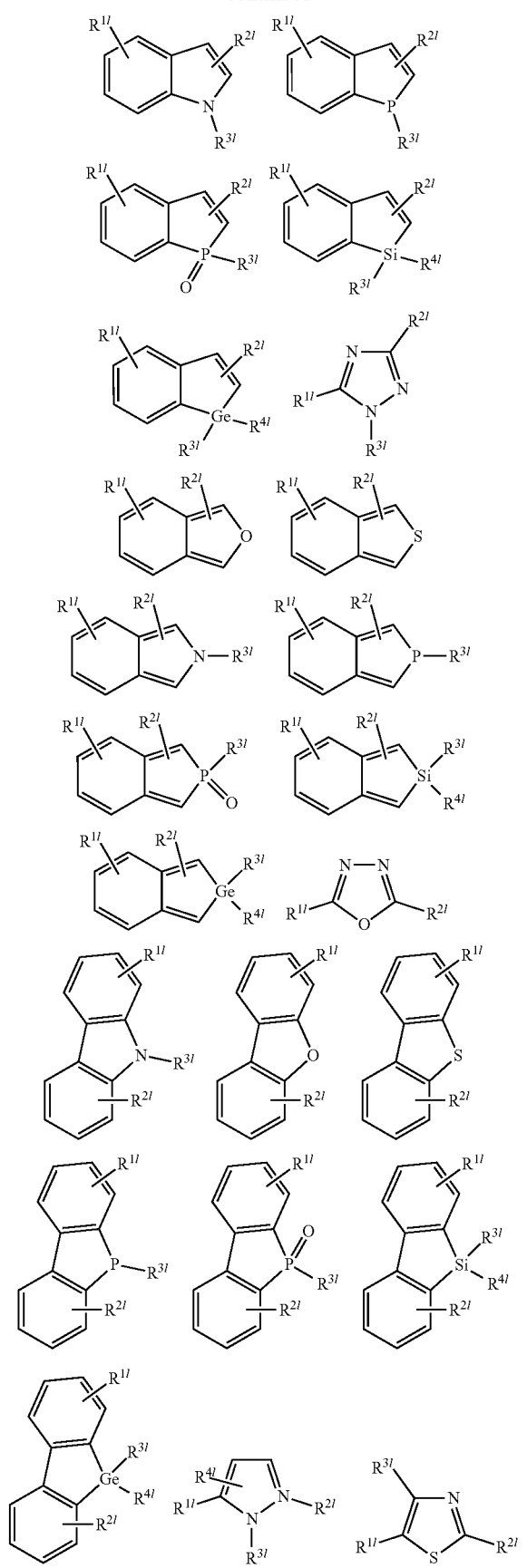
102
-continued
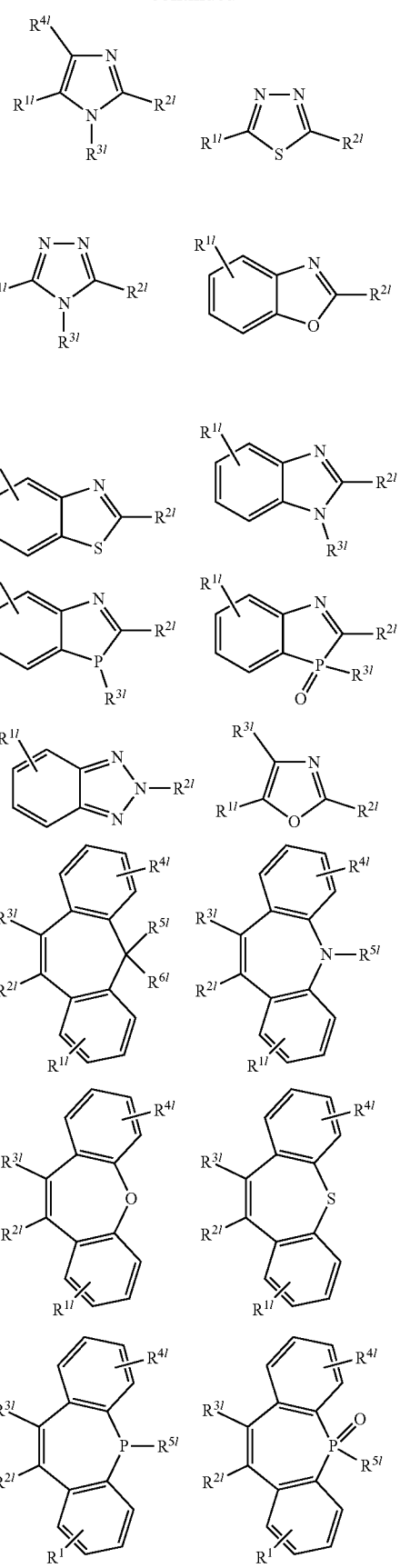

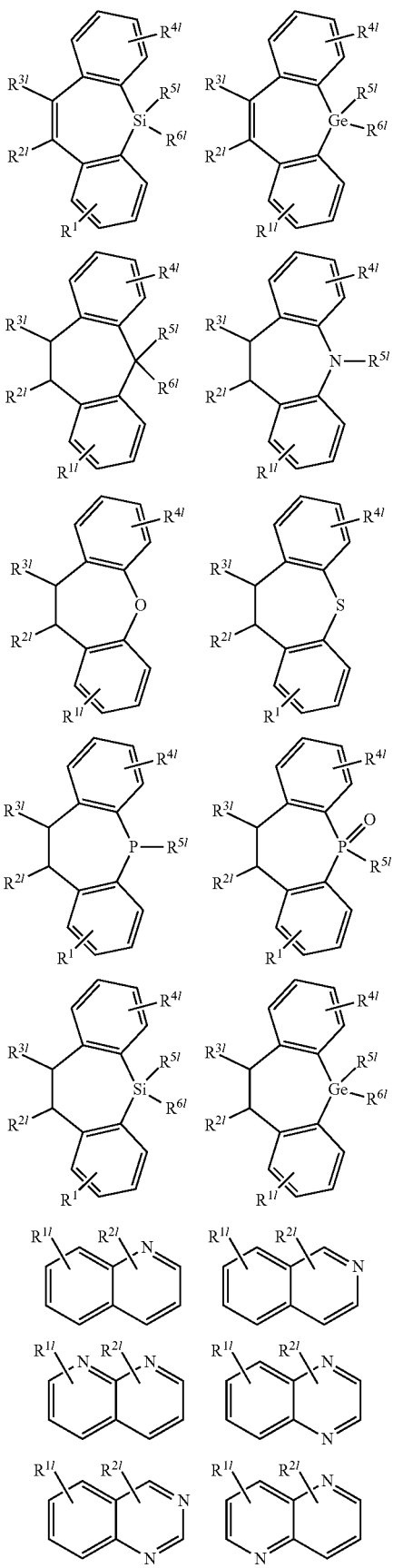
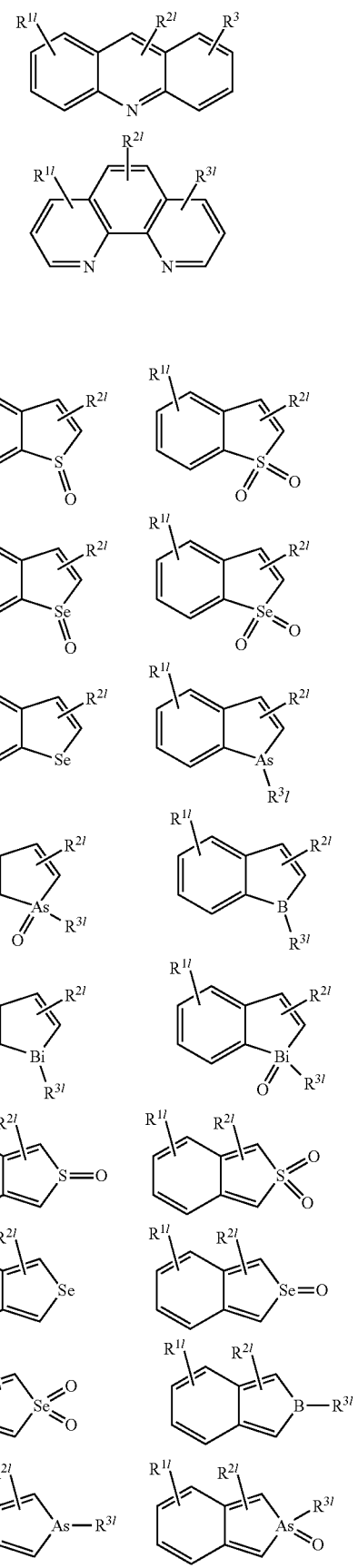

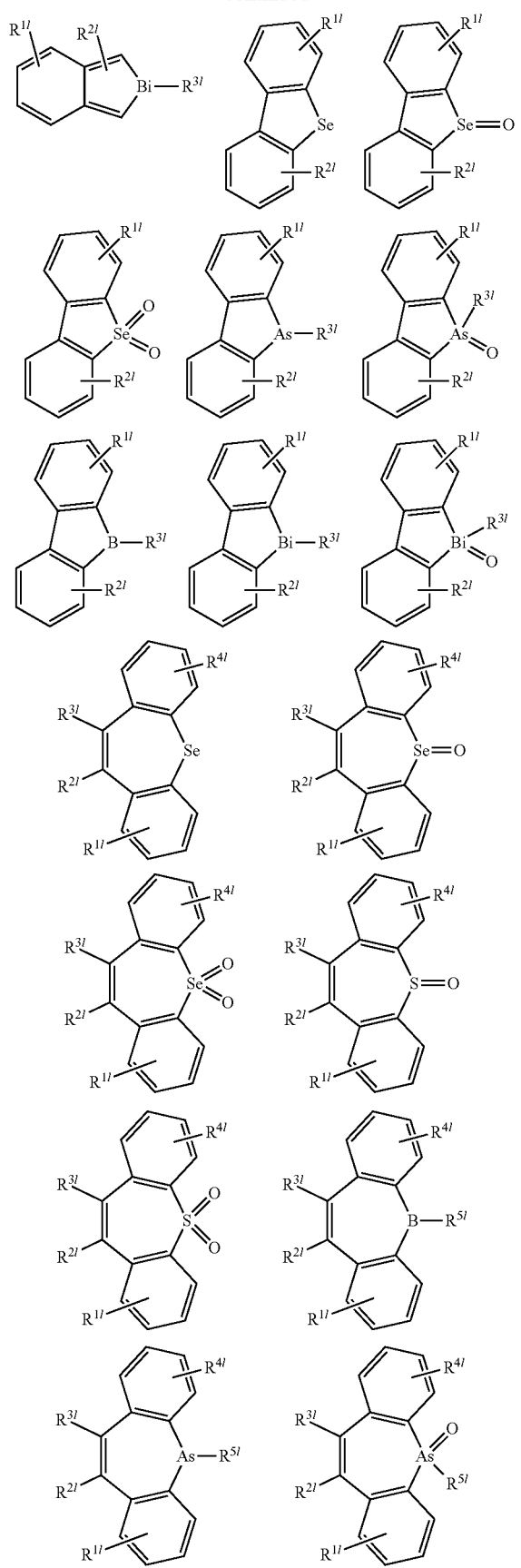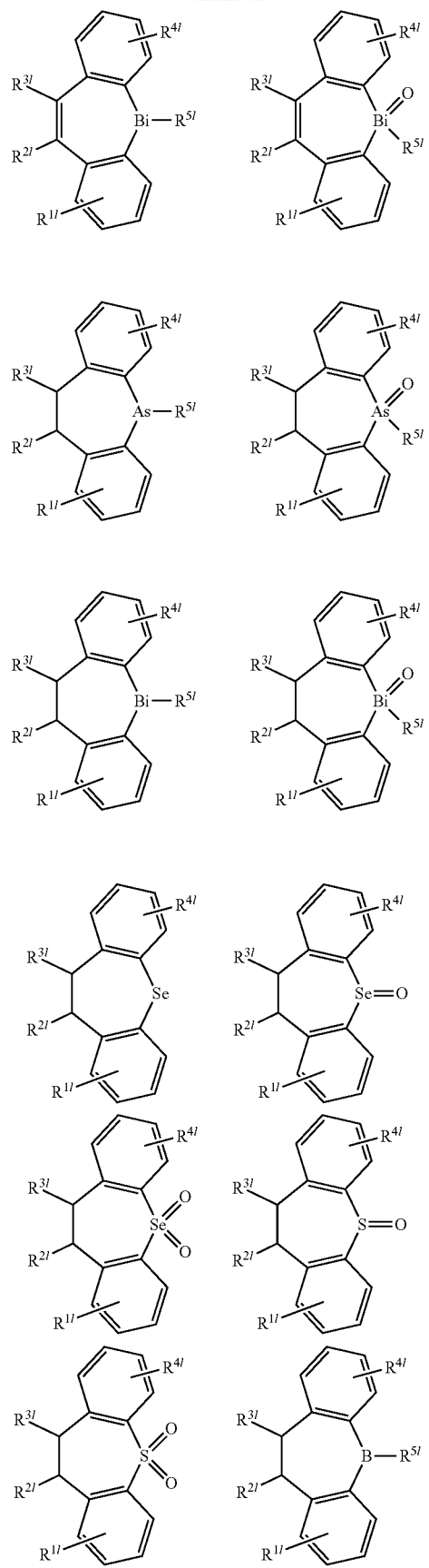

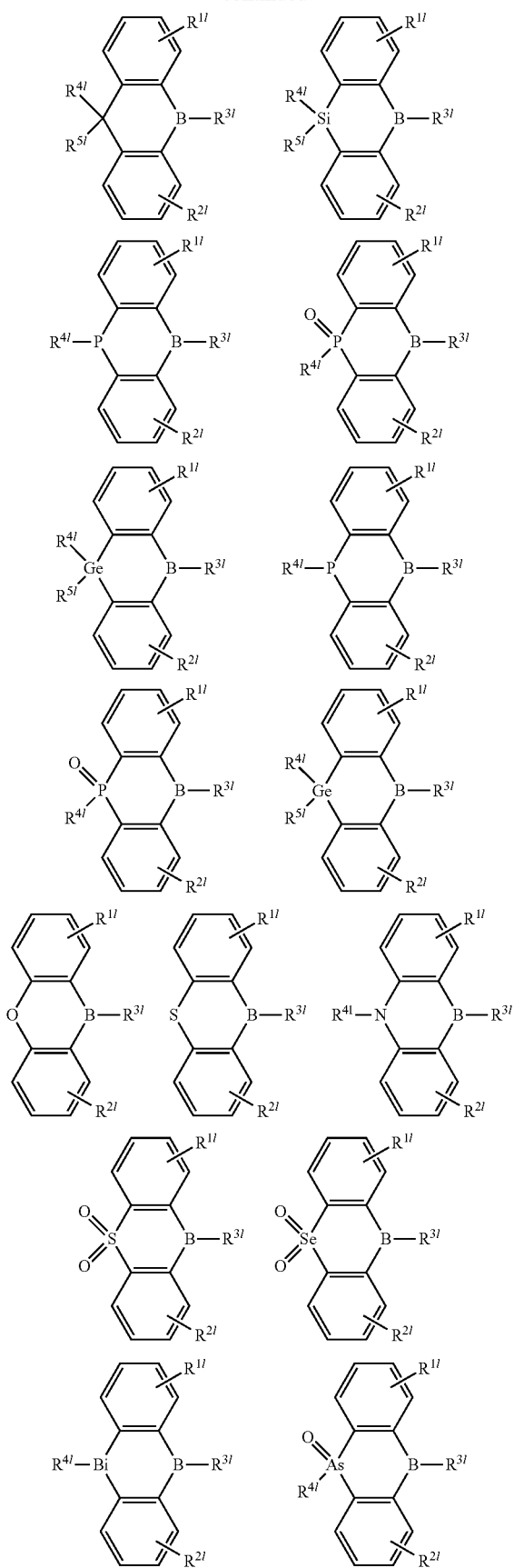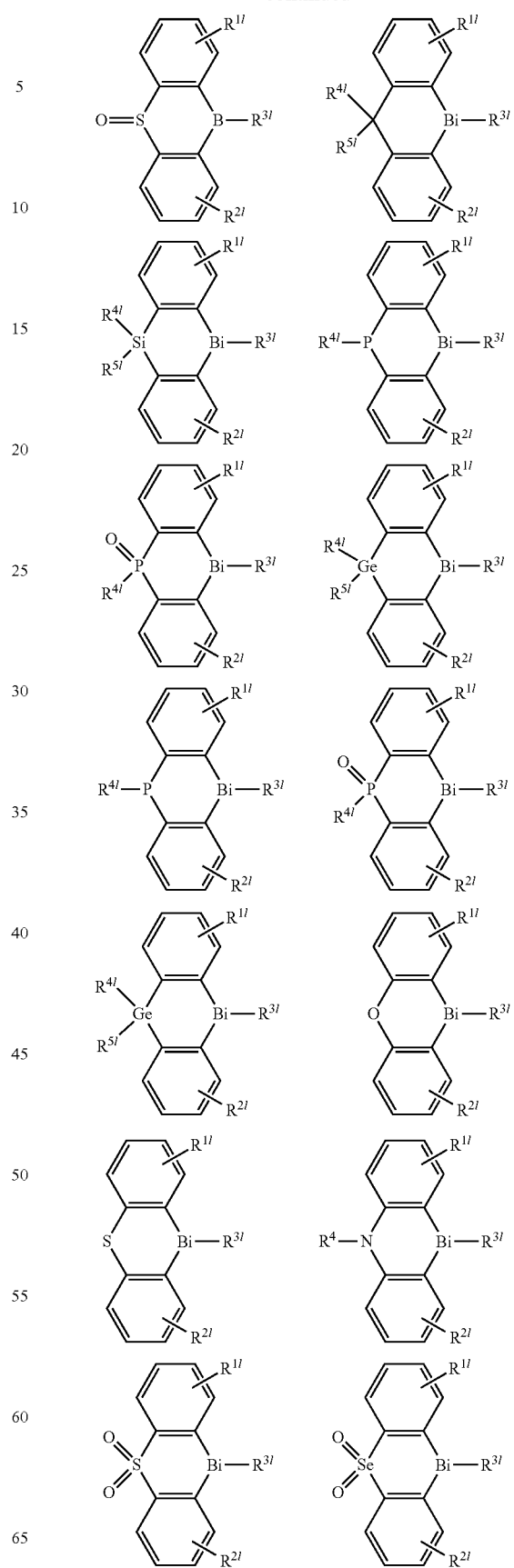

-continued
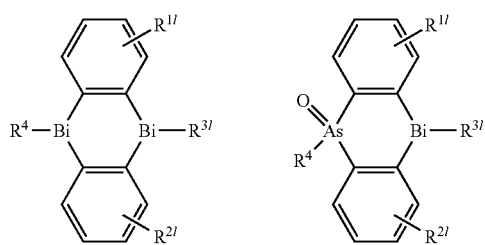
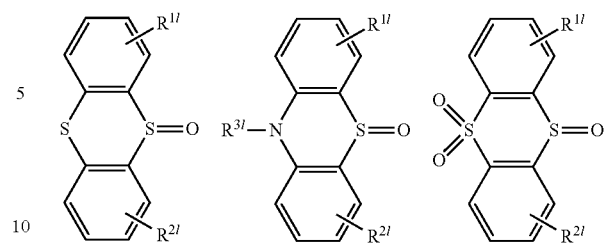
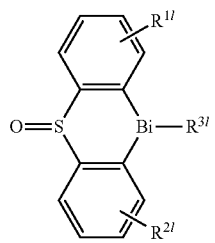
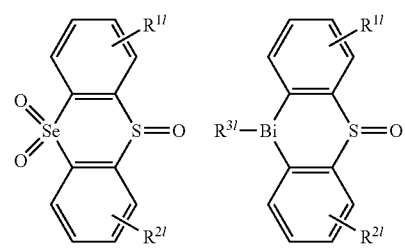
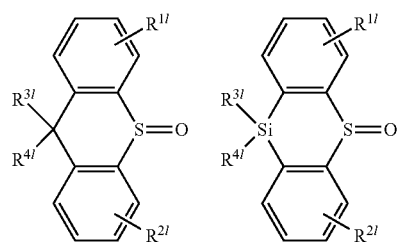
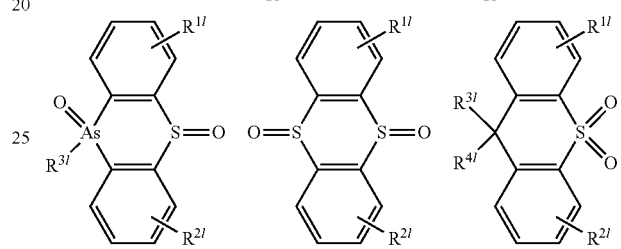
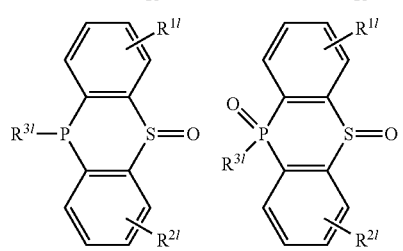
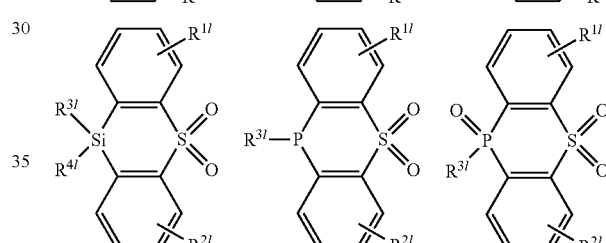
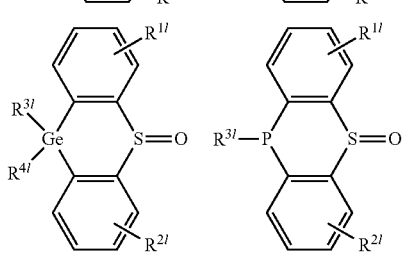
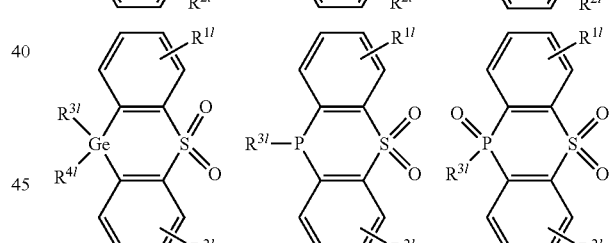
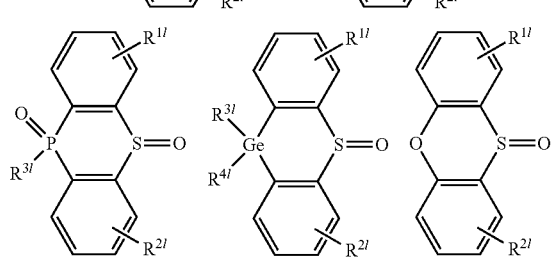
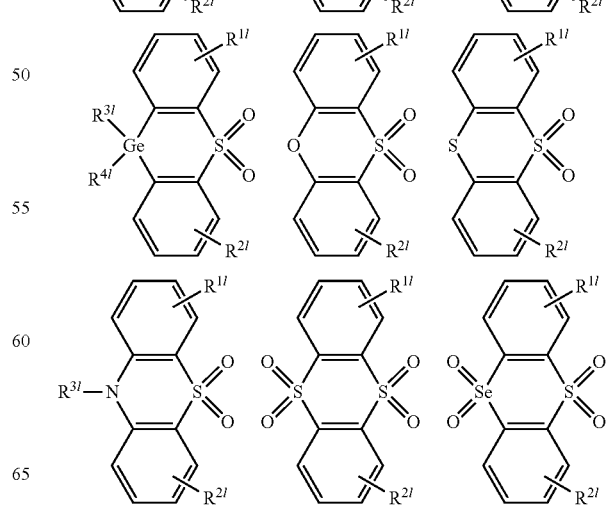

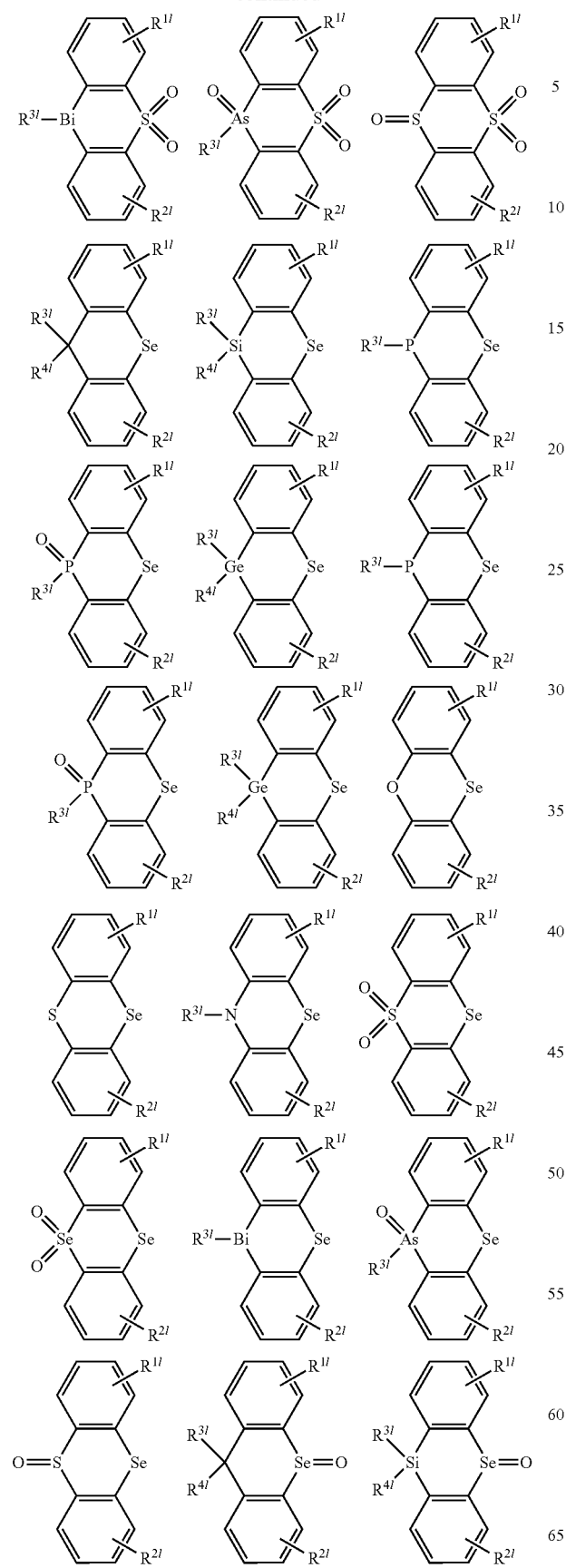
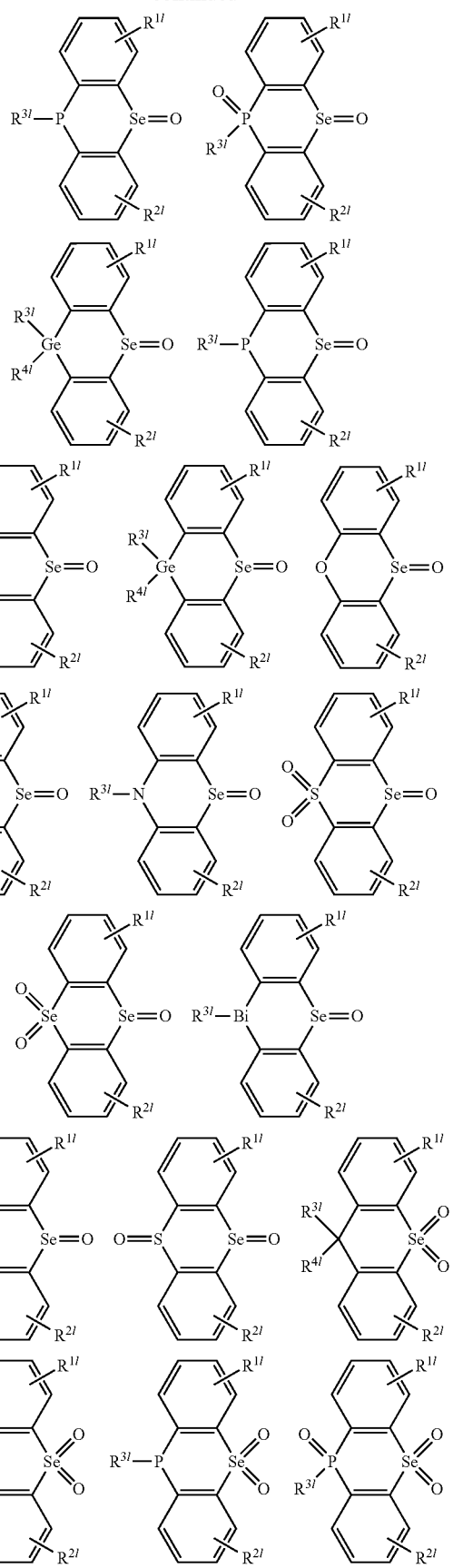

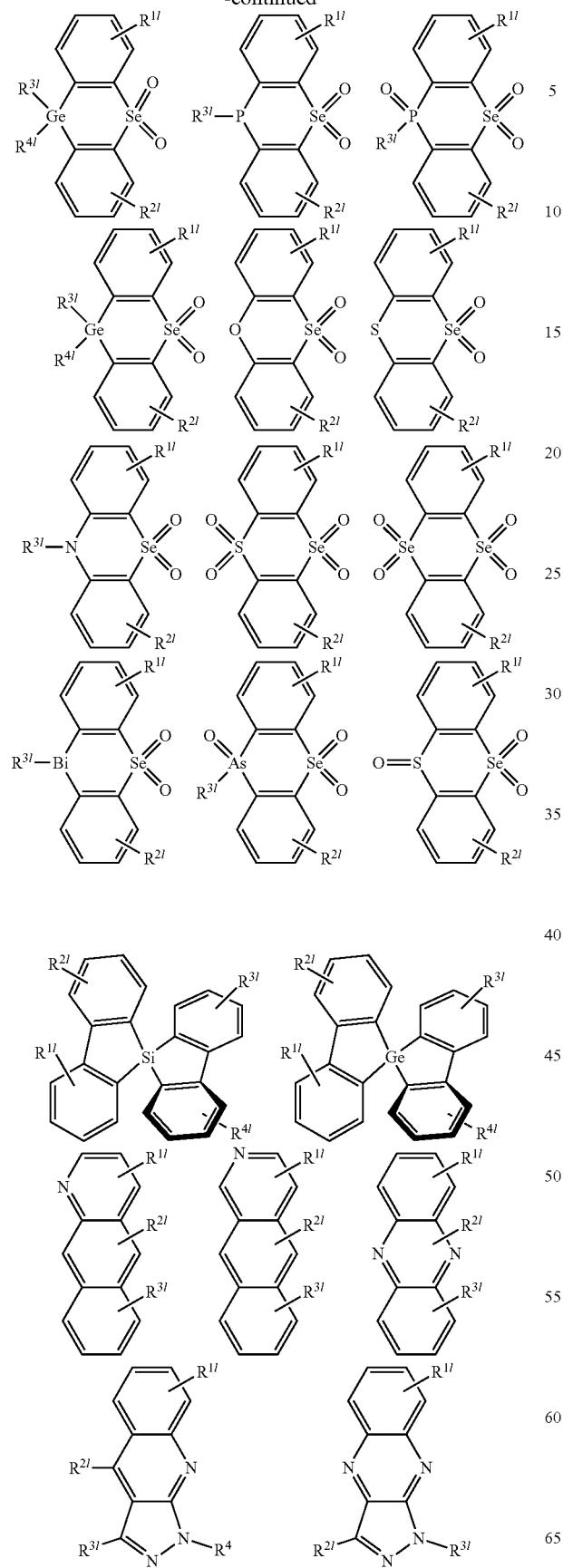

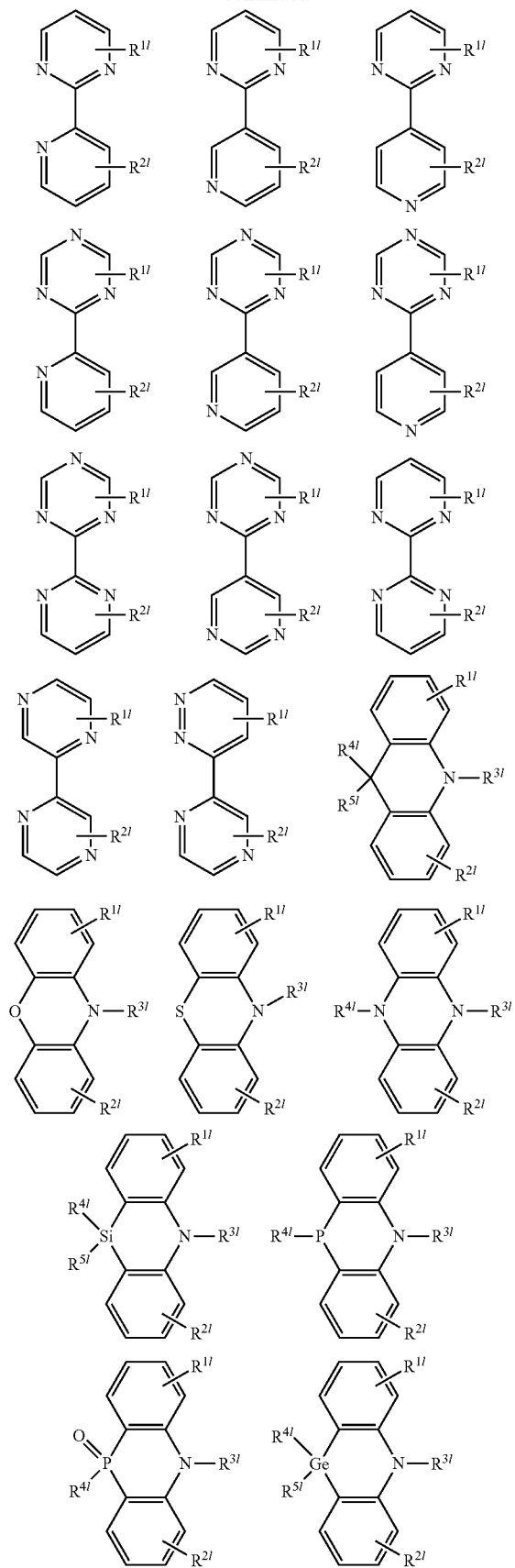
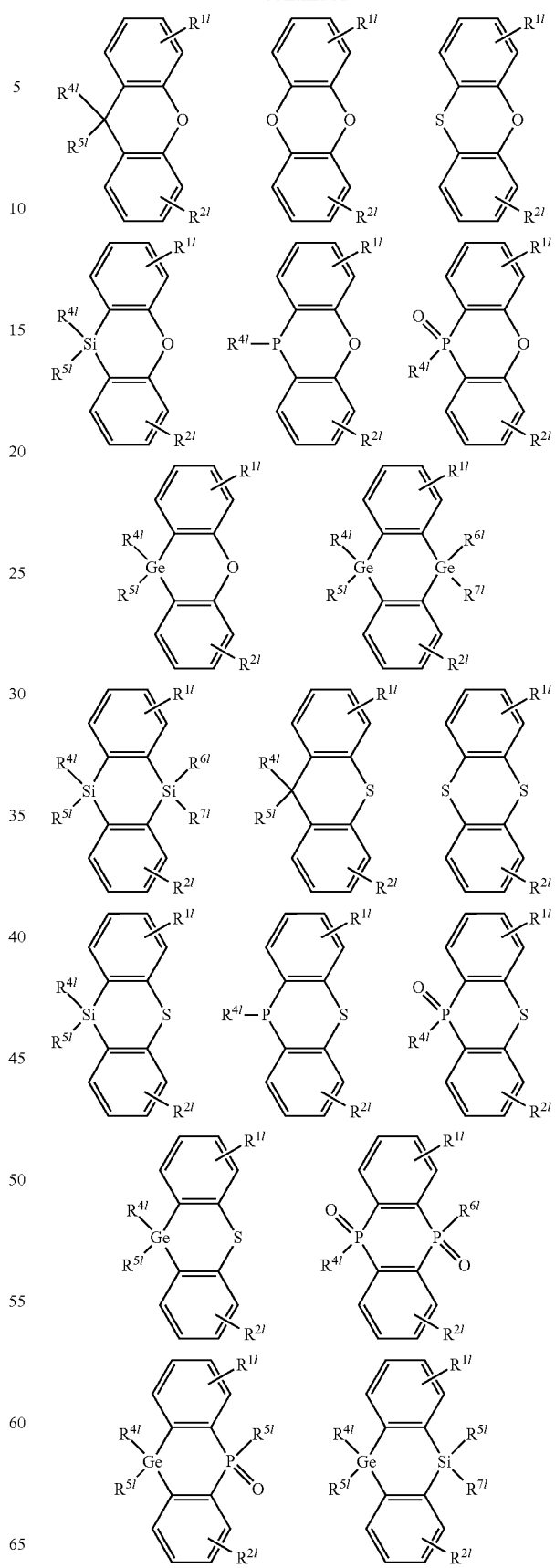

-continued
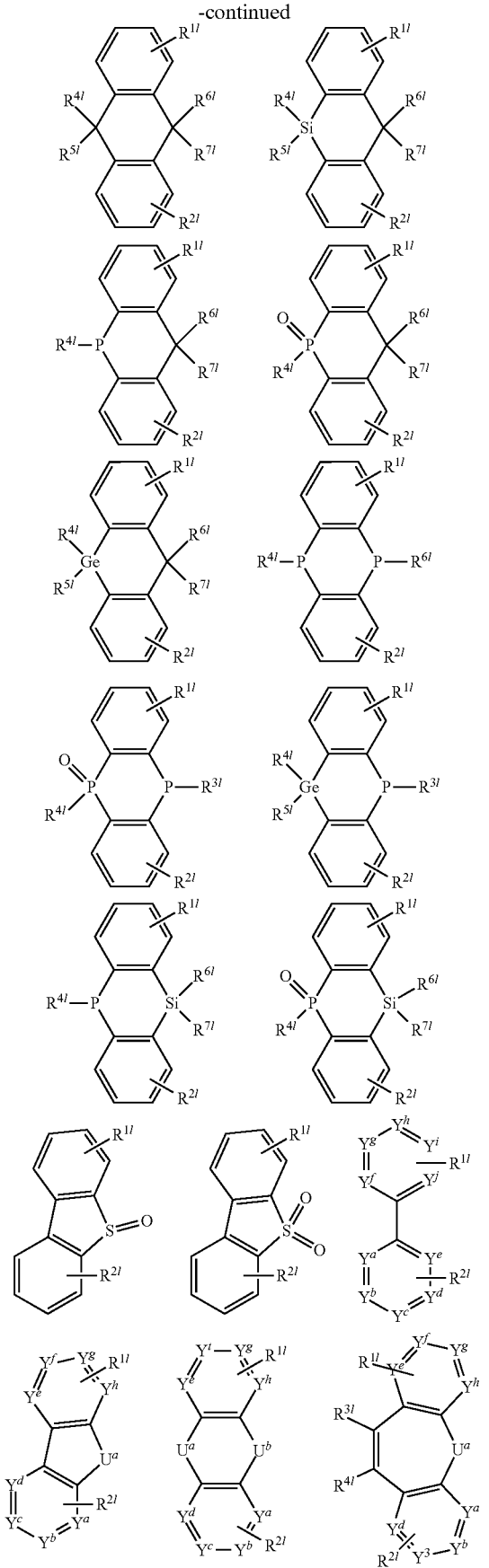
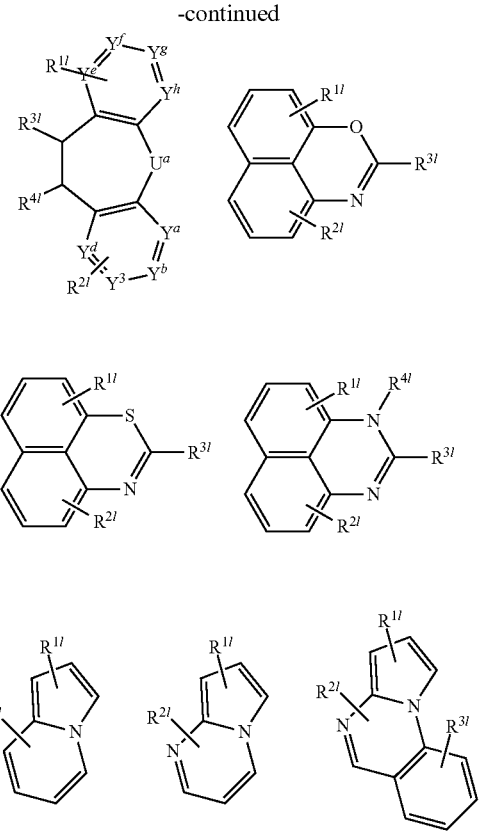
4. Other fluorescent luminophors
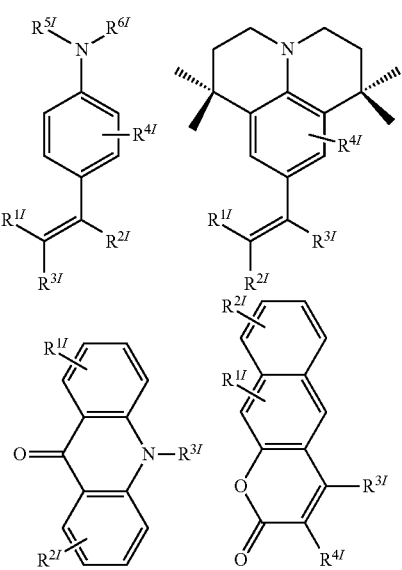

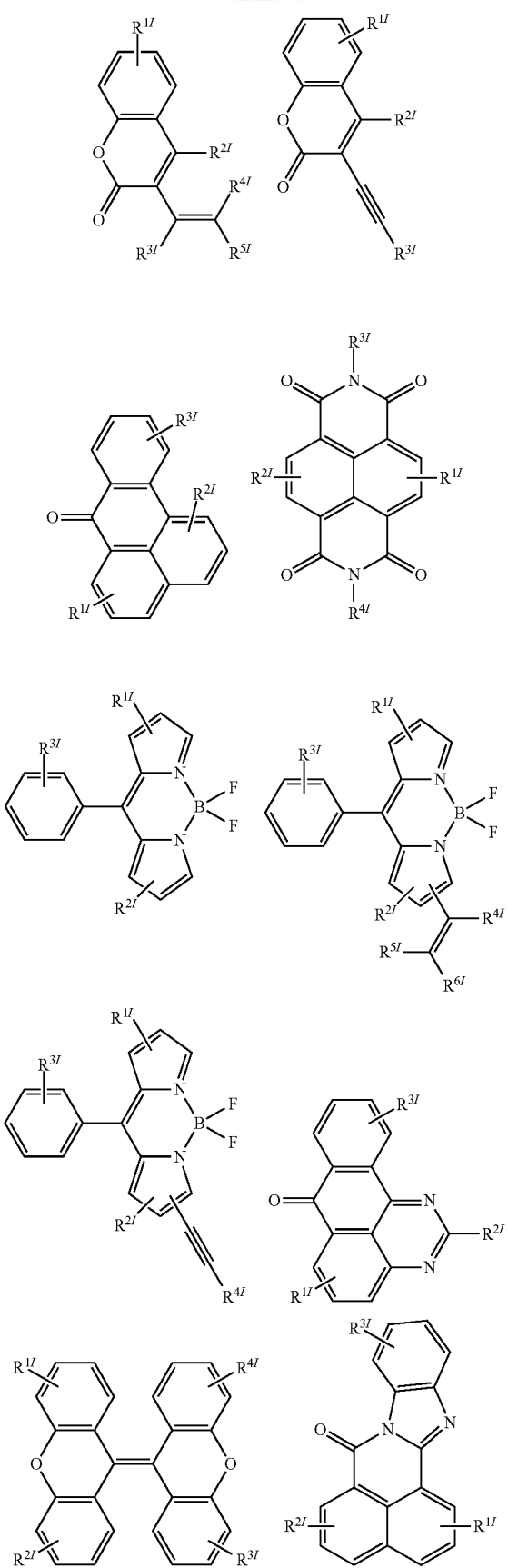
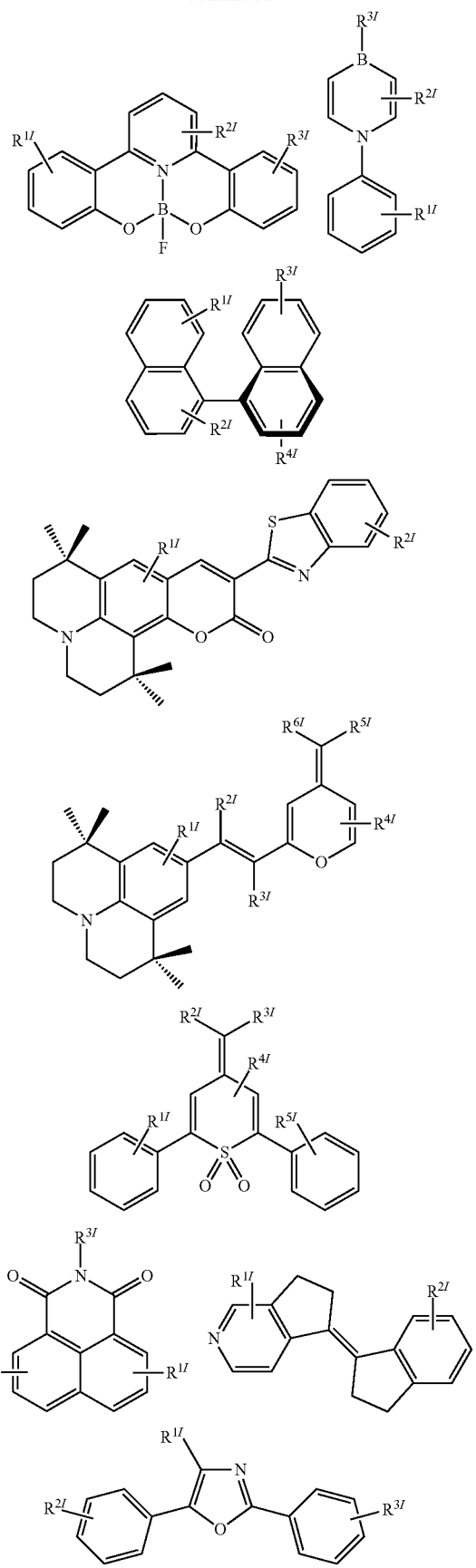

-continued

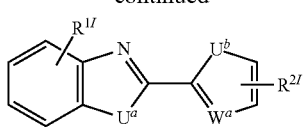

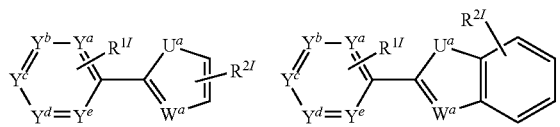

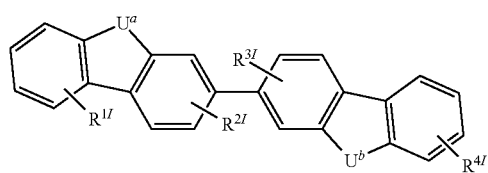

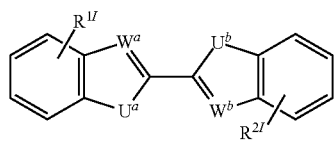

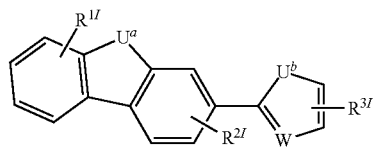

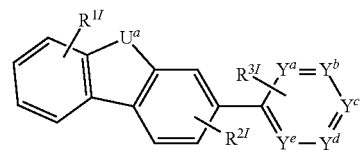

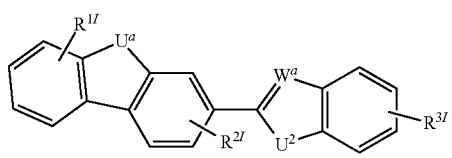

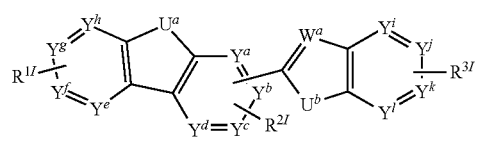

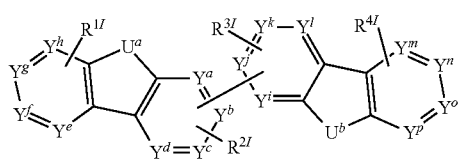

Coumarins

-continued

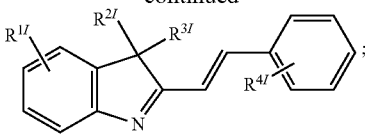

wherein each of $R^{1l}$, $R^{2l}$, $R^{3l}$, $R^{4l}$, $R^{5l}$, $R^{6l}$, $R^{7l}$, and $R^{8l}$, independently represents hydrogen, aryl, cycloalkyl, cycloalkenyl, heterocyclyl, heteroaryl, alkyl, alkenyl, alkynyl, deuterium, halogen, hydroxyl, thiol, nitro, cyano, amino, a mono- or di-alkylamino, a mono- or diarylamino, alkoxy, aryloxy, haloalkyl, aralkyl, ester, nitrile, isonitrile, heteroaryl, alkoxycarbonyl, acylamino, alkoxycarbonylamino, aryloxycarbonylamino, sulfonylamino, sulfamoyl, carbamoyl, alkylthio, sulfinyl, ureido, phosphoramide, mercapto, sulfo, carboxyl, hydrazino, substituted silyl, polymeric, or any conjugate or combination thereof, wherein each of $Y^a$, $Y^b$, $Y^c$, $Y^d$, $Y^e$, $Y^f$, $Y^g$, $Y^h$, $Y^i$, $Y^j$, $Y^k$, $Y^l$, $Y^m$, $Y^n$, $Y^o$, and $Y^p$ independently represents C, N or B; and wherein each of $U^a$, $U^b$ and $U^c$ independently represents $CH_2$, $CR^1R^2$, $C=O$, $CH^2$, $SiR^1R^2$, $GeH_2$, $GeR^1R^2$, NH, $NR^3$, PH, $PR^3$, $R^3P=O$, $AsR^3$, $R^3As=O$, O, S, $S=O$, $SO_2$, Se, $Se=O$, $SeO_2$, BH, $BR^3$, $R^3Bi=O$, BiH, or $BiR^3$; wherein each of $R^1$, $R^2$, and $R^3$ independently represents hydrogen, substituted or unsubstituted alkyl, alkenyl, alkynyl, aryl, heteroaryl, cycloalkane, cycloalkane, heterocyclyl, amino, nitro hydroxyl, halogen, thio, alkoxy, haloalkyl, arylalkane, or arylalkene.

16. The OLED of claim 1, wherein the triplet emitter is PtNON;

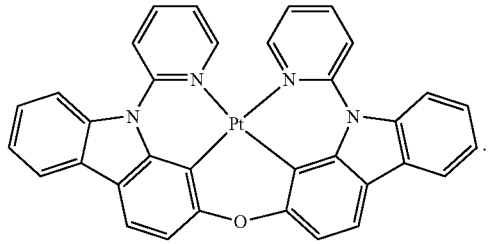

PtNON

17. The OLED of claim 1, wherein the fluorescent emitter is DABNA-2

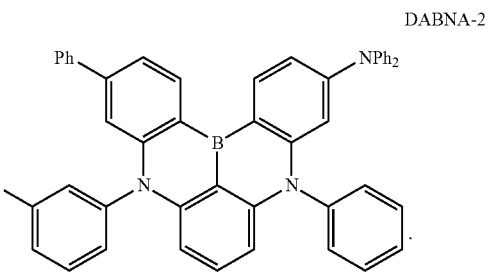

DABNA-2

18. The OLED of claim 1, wherein the emitting dipole of the fluorescent emitter is horizontally oriented.

19. The OLED of claim 1, wherein the ratio of organic dipoles in at least one organic layer is greater than 0.8.

20. The OLED of claim 1, wherein the fluorescent emitter has the following structure:

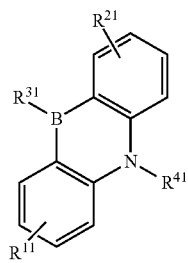

wherein each of $R^{1l}$, $R^{2l}$, $R^{3l}$, and $R^{4l}$ independently represents hydrogen, aryl, cycloalkyl, cycloalkenyl, heterocyclyl, heteroaryl, alkyl, alkenyl, alkynyl, deuterium, halogen, hydroxyl, thiol, nitro, cyano, amino, a mono- or di-alkylamino, a mono- or diarylamino, alkoxy, aryloxy, haloalkyl, aralkyl, ester, nitrile, isonitrile, heteroaryl, alkoxycarbonyl, acylamino, alkoxycarbonylamino, aryloxycarbonylamino, sulfonylamino, sulfamoyl, carbamoyl, alkylthio, sulfinyl, ureido, phosphoramide, mercapto, sulfo, carboxyl, hydrazino, substituted silyl, polymeric, or any conjugate or combination thereof.

* * * * *